US012732161B2

(12) United States Patent
Kido

(10) Patent No.: US 12,732,161 B2
(45) Date of Patent: Sep. 8, 2026

(54) HIGH FREQUENCY FILTER, HIGH FREQUENCY CIRCUIT, AND COMMUNICATION DEVICE

(71) Applicant: Murata Manufacturing Co., Ltd., Kyoto (JP)

(72) Inventor: Syunsuke Kido, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 320 days.

(21) Appl. No.: 18/635,187

(22) Filed: Apr. 15, 2024

(65) Prior Publication Data

US 2025/0047263 A1 Feb. 6, 2025

(30) Foreign Application Priority Data

Jul. 31, 2023 (JP) ................................ 2023-124057

(51) Int. Cl.
*H03H 9/64* (2006.01)

(52) U.S. Cl.
CPC ................................ *H03H 9/6483* (2013.01)

(58) Field of Classification Search
None
See application file for complete search history.

(56) References Cited

U.S. PATENT DOCUMENTS 7,864,528 B2 * 1/2011 Milak .................. H01P 1/2053 361/698
9,860,006 B1 * 1/2018 Okuda ................ H03H 9/6436
10,382,009 B2 * 8/2019 Nosaka .................... H04B 1/00
10,720,903 B2 * 7/2020 Nosaka .................. H03H 9/205
10,763,825 B2 * 9/2020 Nosaka ................ H03H 9/6489
10,886,892 B2 * 1/2021 Nosaka .................... H03H 9/25
11,012,050 B2 * 5/2021 Nosaka .................... H03H 9/17
11,031,920 B2 * 6/2021 Nosaka ................ H03H 9/6413
11,489,514 B2 * 11/2022 Nosaka ................ H03H 9/6476
11,700,022 B2 * 7/2023 Yang .................... H04B 1/0057 455/552.1
11,757,482 B2 * 9/2023 Nagamori ............... H03F 3/193 455/339
11,843,367 B2 * 12/2023 Nosaka ................ H03H 9/6489
12,375,116 B2 * 7/2025 Nagamori ................. H03F 3/72
2007/0022153 A1 * 1/2007 Milak ..................... H01P 1/208 708/300
2013/0187725 A1 * 7/2013 Ikeuchi ................ H03H 9/0057 333/5
2018/0019832 A1 * 1/2018 Okuda ............... H03H 9/02574
2018/0343000 A1 * 11/2018 Nosaka .................... H03H 9/72
2019/0028085 A1 * 1/2019 Kato ......................... H03F 3/72
2019/0044492 A1 * 2/2019 Takata ................. H04B 1/0057
2019/0267969 A1 * 8/2019 Tsukamoto .......... H03H 9/6403

(Continued)

FOREIGN PATENT DOCUMENTS

WO 2018/135538 A1 7/2018
WO 2018/139320 A1 8/2018

*Primary Examiner* — Hai V Nguyen
(74) *Attorney, Agent, or Firm* — McDonald Hopkins LLC

(57) ABSTRACT

A filter includes a series arm resonator and parallel arm circuits, in which the parallel arm circuit has a parallel arm resonator and a frequency variable circuit connected in series to each other, the frequency variable circuit has a capacitor and a switch connected parallel to each other, the other parallel arm circuit has a capacitor and a switch connected in series to each other.

20 Claims, 31 Drawing Sheets

(56) References Cited

U.S. PATENT DOCUMENTS

| | | | | |
|---|---|---|---|---|
| 2019/0341909 | A1* | 11/2019 | Nosaka | H03H 9/6483 |
| 2019/0348967 | A1* | 11/2019 | Nosaka | H03H 9/6413 |
| 2019/0363698 | A1* | 11/2019 | Nosaka | H03H 9/725 |
| 2019/0393861 | A1* | 12/2019 | Nosaka | H03H 9/72 |
| 2020/0083867 | A1* | 3/2020 | Hur | H04B 1/123 |
| 2020/0144992 | A1* | 5/2020 | Nosaka | H03H 9/6476 |
| 2020/0235720 | A1* | 7/2020 | Nosaka | H03H 9/6406 |
| 2020/0366272 | A1* | 11/2020 | Nosaka | H03H 9/568 |
| 2020/0382149 | A1* | 12/2020 | Nagamori | H04B 1/006 |
| 2023/0370105 | A1* | 11/2023 | Nagamori | H03F 3/245 |

* cited by examiner

90A
FIRST MODE
SW95:OFF
SW96:ON
S2
S1
101
81
85
91
94
96
93
95
72
82
83
86
84
87
64
62
102
63

HIGH FREQUENCY FILTER, HIGH FREQUENCY CIRCUIT, AND COMMUNICATION DEVICE

CROSS REFERENCE TO RELATED APPLICATION

This application claims priority from Japanese Patent Application No. 2023-124057 filed on Jul. 31, 2023. The content of this application is incorporated herein by reference in its entirety.

BACKGROUND ART

The present disclosure relates to a high frequency filter.

Conventionally, a pass band variable high frequency filter corresponding to two adjacent or partially overlapping bands is practically used (for example, International Publication No. 2018/135538 and International Publication No. 2018/139320). The high frequency filter includes a series arm resonance circuit and a parallel arm resonance circuit including a resonator, and a pass band is variable by changing a resonance band width of at least one of the series arm resonance circuit and the parallel arm resonance circuit.

BRIEF SUMMARY

However, the above-described conventional high frequency filter has an impedance that significantly fluctuates due to the change in pass band, resulting in deterioration of an insertion loss in the pass band.

The present disclosure provides a pass band variable high frequency filter in which deterioration of an insertion loss is suppressed, a high frequency circuit, and a communication device.

A high frequency filter according to one aspect of the present disclosure includes: a series arm resonator connected between a first terminal and a second terminal; a first parallel arm circuit connected to a ground and a path for connecting the series arm resonator and the second terminal to each other; and a second parallel arm circuit connected to the path and the ground, in which the first parallel arm circuit has a parallel arm resonator and a frequency variable circuit connected in series to each other between the path and the ground, the frequency variable circuit has a first capacitor and a first switch connected parallel to each other, the second parallel arm circuit has a second capacitor and a second switch connected in series to each other between the path and the ground, and when a capacitance value of the parallel arm resonator is defined as C0, a capacitance value of the first capacitor is defined as C1, and a capacitance value of the second capacitor is defined as C2, the following relational expression is satisfied:

$$3.20\times10^{-1}\le(C1/C0)\le6.25,$$

$$0\le C2/C0,$$

$$F1(C1/C0)\le C2/C0\le F2(C1/C0),$$

$$F1(C1/C0)=1.80\times10^{-1}\times(C1/C0)^2-3.82\times10^{-1}\times(C1/C0)+1.98\times10^{-1},$$

$$F2(C1/C0)=3.77\times10^{-4}\times(C1/C0)^4-6.31\times10^{-3}\times(C1/C0)^3+4.00\times10^{-2}(C1/C0)^2-1.22\times10^{-1}\times(C1/C0)+2.71\times10^{-1}.$$

Further, a high frequency filter according to one aspect of the present disclosure includes: a first series arm circuit connected between a first terminal and a second terminal; a frequency variable circuit connected parallel to the first series arm circuit; and a parallel arm resonator connected to a ground and a path for connecting the first terminal and the second terminal, in which the first series arm circuit has a series arm resonator and a second series arm circuit connected in series to each other between the first terminal and the second terminal, the frequency variable circuit has a first capacitor and a first switch connected in series to each other, the second series arm circuit has a second capacitor and a second switch connected parallel to each other, and when a capacitance value of the series arm resonator is defined as C0, a capacitance value of the first capacitor is defined as C1, and a capacitance value of the second capacitor is defined as C2, the following relational expression is satisfied:

$$5.00\times10^{-2}\le(C1/C0)\le1.44,$$

$$2.62\le C2/C0,$$

$$F1(C1/C0)\le C2/C0\le F2(C1/C0),$$

$$F1(C1/C0)=5.23\times(C1/C0-0.15)^{-1.72},$$

$$F2(C1/C0)=-2.98\times(C1/C0)^3+1.19\times10^1\times(C1/C0)^2-1.68\times(C1/C0)+1.11\times10^1.$$

Further, a high frequency filter according to one aspect of the present disclosure includes: a first series arm circuit connected between a first terminal and a second terminal; a frequency variable circuit; and a parallel arm resonator connected to a ground and a path for connecting the first terminal and the second terminal, in which the first series arm circuit has a series arm resonator and a second series arm circuit connected in series to each other between the first terminal and the second terminal, the frequency variable circuit has a first capacitor and a first switch connected parallel to the series arm resonator and connected in series to each other, the second series arm circuit has a second capacitor and a second switch connected parallel to each other, and when a capacitance value of the series arm resonator is defined as C0, a capacitance value of the first capacitor is defined as C1, and a capacitance value of the second capacitor is defined as C2, the following relational expression is satisfied:

$$5.00\times10^{-2}\le(C1/C0)\le1.83,$$

$$5.23\le C2/C0,$$

$$F1(C1/C0)\le C2/C0\le F2(C1/C0),$$

$$F1(C1/C0)=1.19\times10^1\times(C1/C0-0.25)^{-7.71\times10-1},$$

$$F2(C1/C0)=-1.19\times(C1/C0)^3+5.39\times(C1/C0)^2-9.19\times(C1/C0)+1.10\times10^1.$$

According to the present disclosure, it is possible to provide a pass band variable high frequency filter in which deterioration of an insertion loss is suppressed, a high frequency circuit, and a communication device.

DETAILED DESCRIPTION

Figure 1:
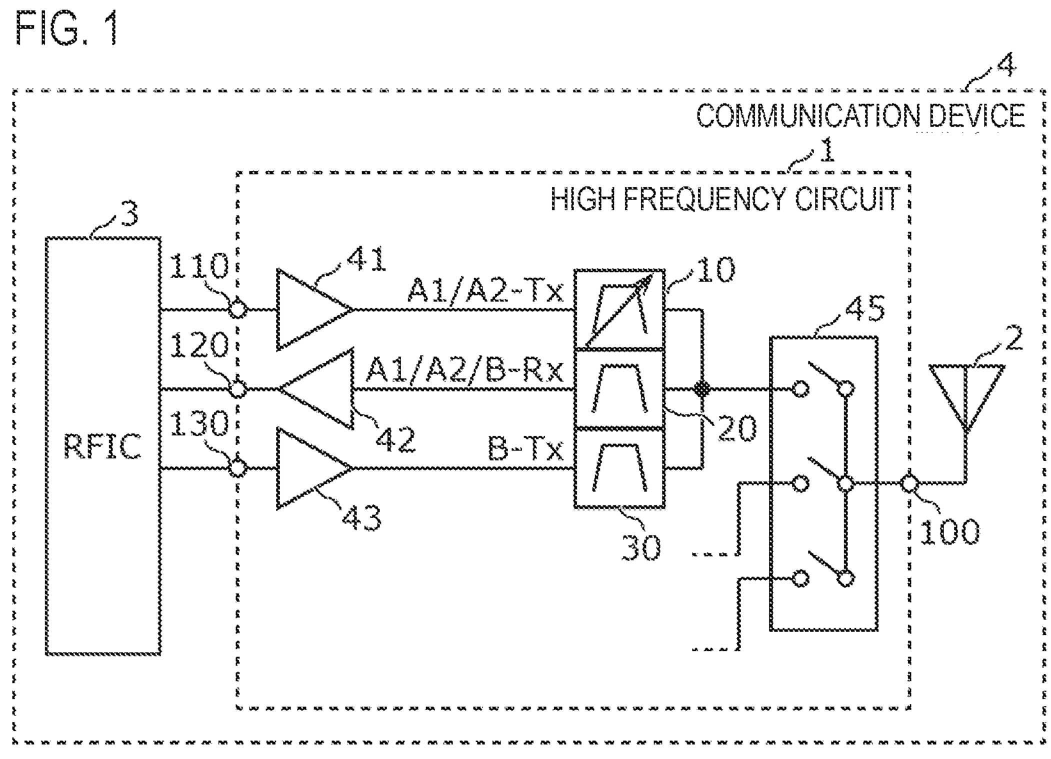
FIG. 1 is a circuit configuration diagram of a high frequency circuit and a communication device according to Embodiment 1.

Hereinafter, embodiments of the present disclosure will be described in detail with reference to the drawings. Note that all of the embodiments described below describe comprehensive or specific examples. Numerical values, shapes, materials, components, the arrangement and connection configuration of the components, and so forth that are described in the following embodiments are merely examples and are not intended to limit the present disclosure. Among the components in the following embodiments, a component that is not described in an independent claim is described as an optional component. Furthermore, the sizes or size ratios of components illustrated in drawings are not necessarily exact.

Each of the drawings is a schematic diagram in which emphasis, omission, or adjustment of the ratio is appropriately carried out to show the present disclosure, and is not necessarily strictly illustrated, and may differ from the actual shape, positional relationship, and ratio. In the drawings, configurations that are substantially the same are denoted by the same reference numerals, and a repeated description thereof is omitted or simplified in some cases.

In the circuit configuration of the present disclosure, the expression "connected" includes not only a case of being directly connected by a connection terminal and/or a wiring conductor, but also a case of being electrically connected through matching elements such as inductors and capacitors, and switch circuits. The expression "connected between A and B" means that both A and B are connected between A and B.

Furthermore, terms, such as "parallel" and "perpendicular", representing a relationship between elements, a term, such as "rectangular", representing the shape of an element, and a numerical range refer to not only their exact meaning but also a substantially equivalent range, for example, the inclusion of an error of about a few percent.

Further, in the following embodiment, a pass band of a filter is defined as a frequency band between two frequencies that is 3 dB larger than the minimum value of an insertion loss in the pass band.

Moreover, unless otherwise specified, a resonant frequency of a resonator or circuit is a resonant frequency for forming an attenuation pole in a pass band or near a pass band of a filter including the resonator or circuit, and is a frequency of a "resonance point" which is a singular point where impedance of the resonator or circuit is minimum (ideally a point where impedance is 0).

Moreover, unless otherwise specified, an anti-resonant frequency of a resonator or circuit is an anti-resonant frequency for forming an attenuation pole in or near a pass band of a filter including the resonator or circuit, and is a frequency of a "resonance point" which is a singular point where impedance of the resonator or circuit is maximum (ideally a point where impedance is infinite).

In the following embodiment, a series arm circuit and a parallel arm circuit are defined as follows. The parallel arm circuit is a circuit disposed between a node and a ground on a path for connecting two input/output terminals. The series arm circuit is a circuit connected between one of two input/output terminals and a node on the path to which the parallel arm circuit is connected, or a circuit connected between a node on the path to which one parallel arm circuit is connected and the other node on the path to which the other parallel arm circuit is connected.

Moreover, in the present disclosure, each of band A1, band A2, and band B means a frequency band defined by standardization organizations (for example, 3GPP (registered trademark), institute of electrical and electronics engineers (IEEE), and the like) in advance for a communication system constructed using radio access technology (RAT). In the present embodiment, as the communication system, for example, a long term evolution (LTE) system, $5^{th}$ generation (5G)-new radio (NR) system, a wireless local area network (WLAN) system, and the like can be used, but the present disclosure is not limited thereto.

Further, an uplink operation band of band A1 (A2 or B) means a frequency range designated for uplink in band A1 (A2 or B). Further, a downlink operation band of band A1 (A2 or B) means a frequency range designated for downlink in band A1 (A2 or B).

Embodiment 1

FIG. 1 is a circuit configuration diagram of a high frequency circuit 1 and a communication device 4 according to Embodiment 1. FIG. 1 is an exemplary circuit configuration, in which the high frequency circuit 1 and the communication device 4 may be implemented using any of a wide variety of circuit mounting and circuit technologies. Therefore, the description of the high frequency circuit 1 and the communication device 4 provided below should not be interpreted in a limited manner.

1.1 Circuit Configuration of Communication Device 4

First, a circuit configuration of the communication device 4 according to the present embodiment will be described with reference to FIG. 1. The communication device 4 is mounted on user equipment (UE), and includes the high frequency circuit 1, an antenna 2, and a radio frequency integrated circuit (RFIC) 3.

The high frequency circuit 1 transmits a high frequency signal between the antenna 2 and the RFIC 3.

The antenna 2 is connected to an antenna terminal 100 of the high frequency circuit 1, transmits the high frequency signal output from the high frequency circuit 1, and receives the high frequency signal from an outside to output the high frequency signal to the high frequency circuit 1.

The RFIC 3 is an example of a signal processing circuit that processes the high frequency signal. Specifically, the RFIC 3 performs signal processing on a high frequency received signal (hereinafter, referred to as a received signal) input through a reception path of the high frequency circuit 1 by down-converting or the like, and outputs the received signal generated through the signal processing to a baseband signal processing circuit (BBIC, not illustrated). In addition, the RFIC 3 performs signal processing on a transmission signal input from the BBIC by up-converting or the like, and outputs a high frequency transmission signal (hereinafter, referred to as a transmission signal) generated through the signal processing to a transmission path of the high frequency circuit 1. In addition, the RFIC 3 has a control unit that controls a switch, an amplifier, and the like of the high frequency circuit 1. A part or all of functions as the control unit of the RFIC 3 may be installed outside the RFIC 3, for example, may be installed on the BBIC or the high frequency circuit 1.

In the communication device 4 according to the present embodiment, the antenna 2 is an optional component. In addition to the antenna 2, the communication device 4 may further include one or more antennas.

1.2 Circuit Configuration of High Frequency Circuit 1

As illustrated in FIG. 1, the high frequency circuit 1 includes filters 10, 20, and 30, a switch circuit 45, a power amplifiers 41 and 43, a low noise amplifier 42, the antenna terminal 100, high frequency input terminals 110 and 130, and a high frequency output terminal 120.

The antenna terminal 100 is connected to the antenna 2 and the switch circuit 45. The high frequency input terminal 110 is a terminal that is connected to the RFIC 3 and the power amplifier 41 to receive a transmission signal in band A1 or A2 from the RFIC 3. The high frequency input terminal 130 is a terminal that is connected to the RFIC 3 and the power amplifier 43 to receive a transmission signal in band B from the RFIC 3. The high frequency output terminal 120 is a terminal that is connected to the RFIC 3 and the low noise amplifier 42 to output the received signal to the RFIC 3.

The filter 10 is an example of a high frequency filter, and varies a first pass band including an uplink operation band of band A1 and an uplink operation band of band A2, and a second pass band including an uplink operation band of band A2. One end of the filter 10 is connected to a first selection terminal of the switch circuit 45, and the other end of the filter 10 is connected to an output end of the power amplifier 41.

The filter 20 is an example of a first filter, and includes a pass band including a downlink operation band of band A1, a downlink operation band of band A2, and a downlink operation band of band B. One end of the filter 20 is connected to the first selection terminal of the switch circuit 45, and the other end of the filter 20 is connected to and input end of the low noise amplifier 42.

The filter 30 has a pass band including an uplink operation band of band B. One end of the filter 30 is connected to the first selection terminal of the switch circuit 45, and the other end of the filter 30 is connected to an output end of the power amplifier 43.

The power amplifier 41 is connected to the high frequency input terminal 110 and can amplify transmission signals of bands A1 and A2 supplied from the RFIC 3 through the high frequency input terminal 110.

The power amplifier 43 is connected to the high frequency input terminal 130 and can amplify a transmission signal of band B supplied from the RFIC 3 through the high frequency input terminal 130.

The low noise amplifier 42 is connected to the high frequency output terminal 120 and can amplify the received signals of bands A1, A2, and B that have passed through the filter 20.

The switch circuit 45 is connected between the antenna terminal 100 and the filters 10, 20, and 30. Specifically, the switch circuit 45 has a common terminal, the first selection terminal, and a second selection terminal. The common terminal is connected to the antenna terminal 100. The first selection terminal is connected to the filters 10, 20, and 30. The second selection terminal is connected to a filter (not illustrated in FIG. 1) other than the filters 10, 20, and 30.

In such a connection configuration, the switch circuit 45 can switch connection and disconnection between the common terminal and the first selection terminal, and can switch connection and disconnection between the common terminal and the second selection terminal, for example, based on a control signal from the RFIC 3. The switch circuit 45 is configured by, for example, a single pole double throw (SPDT) type switch circuit.

According to the connection configuration of the switch circuit 45 and the filters 10, 20, and 30, the filters 10 to 30 are connected to the common first selection terminal, so that the number of terminals of the switch circuit 45 can be reduced. In addition, since the filters 10 and 20 are connected to the common first selection terminal, the filters 10 and 20 function as a duplexer that can simultaneously transmit the transmission signals and the received signals of bands A1 and A2.

Figure 2:
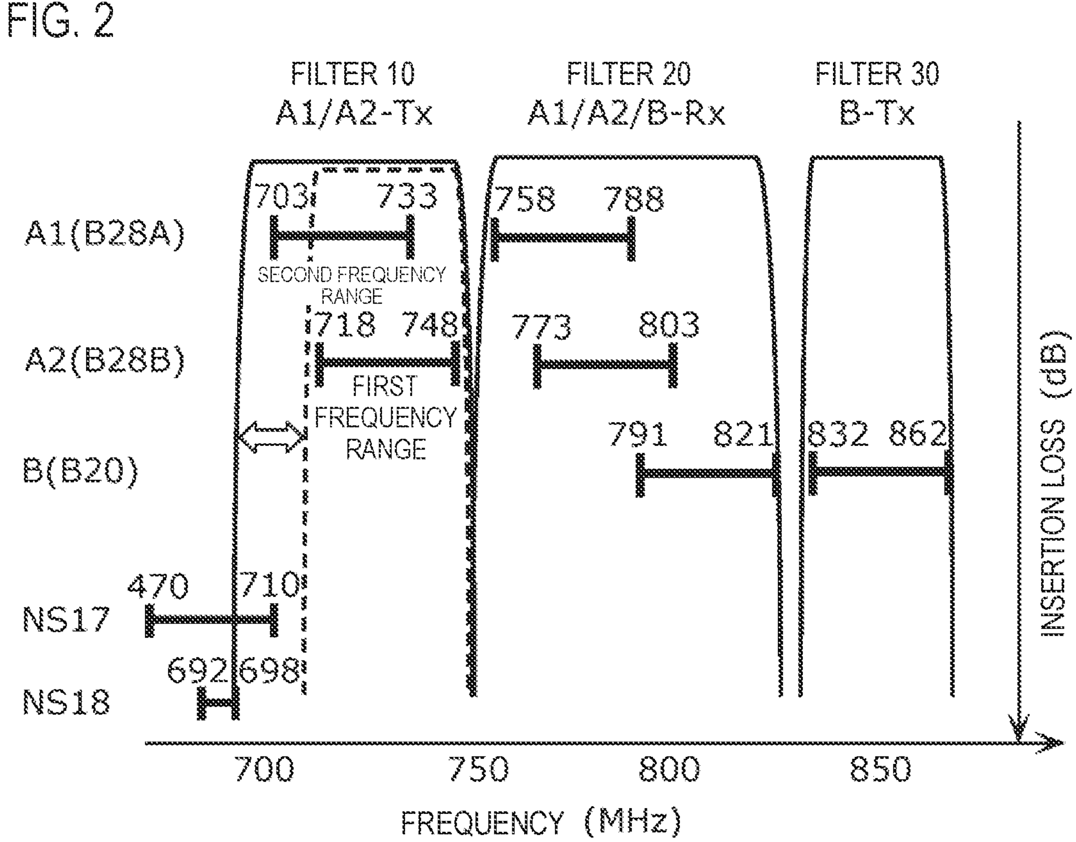
FIG. 2 is a diagram illustrating a relationship between a pass band and a band of each filter according to Embodiment 1.

FIG. 2 is a diagram illustrating a relationship between pass bands and bands of the filters 10, 20, and 30 according to Embodiment 1. The filter 10 varies the first pass band and the second pass band. The first pass band includes a first frequency range and a second frequency range on a low-frequency side of the first frequency range. The second pass band includes the first frequency range and is narrower than the first pass band. In this case, as illustrated in FIG. 2, the first frequency range includes an uplink operation band of band A2, and the second frequency range includes an uplink operation band of band A1. Accordingly, when the filter 10 has the first pass band, a transmission signal of a wideband including bands A1 and A2 can be transmitted, and when the filter 10 has the second pass band, attenuation of bands (NS17 and NS18 of DTV) on a low-frequency side of the second pass band can be secured.

A pass band of the filter 20 is located on a high-frequency side of the pass band of the filter 10. In addition, a pass band of the filter 30 is located on a high-frequency side of the pass band of the filter 20.

In the present embodiment, the first frequency range includes, for example, either an uplink operation band of band 28B for 4G-LTE or an uplink operation band of band n28B for 5G-NR. In addition, the second frequency range includes, for example, either an uplink operation band of band 28A for 4G-LTE or an uplink operation band of band n28A for 5G-NR. That is, in the present embodiment, band A2 is either band 28B for 4G-LTE or band n28B for 5G-NR, and band A1 is either band 28A for 4G-LTE or band n28A for 5G-NR.

The high frequency circuit 1 according to the present embodiment may have the filter 10 and the switch circuit 45, and other circuit components are optional components of the high frequency circuit 1.

1.3 Circuit Configuration and Switching Operation of Filter 10

Figure 3:
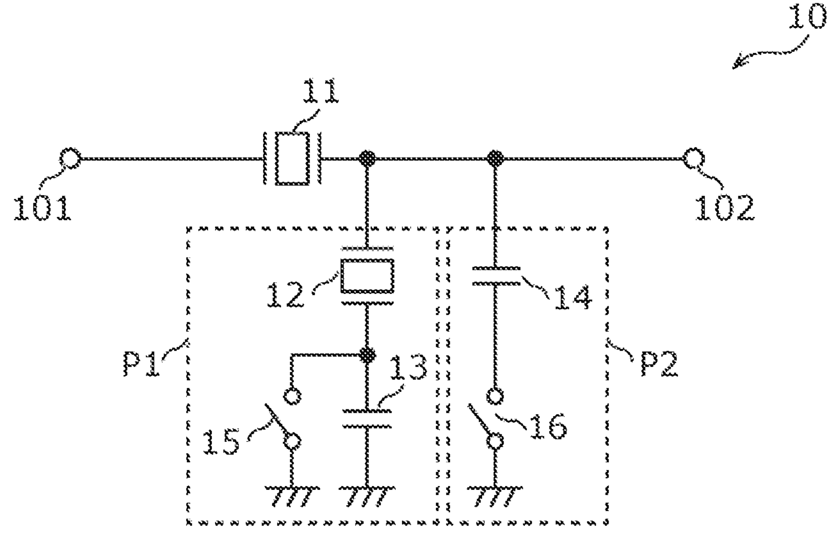
FIG. 3 is a circuit configuration diagram of the high frequency filter according to Embodiment 1.

Next, a circuit configuration of the filter 10 will be described. FIG. 3 is a circuit configuration diagram of the filter 10 according to Embodiment 1. As illustrated in FIG. 3, the filter 10 includes a series arm resonator 11, parallel arm circuits P1 and P2, and terminals 101 and 102.

The terminal 101 is an example of a first terminal, and is an external connection terminal for inputting or outputting the transmission signal. The terminal 102 is an example of a second terminal, and is an external connection terminal for outputting or inputting the transmission signal.

The series arm resonator 11 is connected between the terminal 101 and the terminal 102, and is, for example, an acoustic wave resonator or an LC resonance circuit including an inductor and a capacitor.

The parallel arm circuit P1 is an example of a first parallel arm circuit, and is connected to a series arm path for connecting the series arm resonator 11 and the terminal 102 and to a ground. The parallel arm circuit P1 includes a parallel arm resonator 12, a capacitor 13, and a switch 15. The capacitor 13 is an example of a first capacitor, the switch 15 is an example of a first switch, and the capacitor 13 and the switch 15 are connected parallel to each other. The capacitor 13 and the switch 15 are an example of a frequency variable circuit, and vary a resonant frequency and an anti-resonant frequency of the parallel arm circuit P1. The parallel arm circuit P1 has a parallel arm resonator 12 and a frequency variable circuit connected in series to each other between the series arm path and the ground.

The parallel arm resonator 12 is a resonator using a surface acoustic wave or a bulk acoustic wave. Accordingly, a size of the parallel arm resonator 12 can be reduced, so that a size and cost of the filter 10 can be reduced. In addition, the resonator using the surface acoustic wave or the bulk acoustic wave generally exhibits high Q characteristics, so that loss can be reduced.

In the filter 10 according to the present embodiment, the parallel arm resonator P1 is connected to the series arm path and the frequency variable circuit is connected to the ground, but the parallel arm resonator P1 may be connected to the ground and the frequency variable circuit may be connected to the series arm path.

The parallel arm circuit P2 is an example of a second parallel arm circuit, and is connected to the series arm path and the ground. The parallel arm circuit P2 includes a capacitor 14 and a switch 16. The capacitor 14 is an example of a second capacitor, the switch 16 is an example of a second switch, and the capacitor 14 and the switch 16 are connected in series to each other.

In the filter 10 according to the present embodiment, the capacitor 14 is connected to the series arm path and the switch 16 is connected to the ground, but the capacitor 14 may be connected to the ground and the switch 16 may be connected to the series arm path.

Figure 4A:
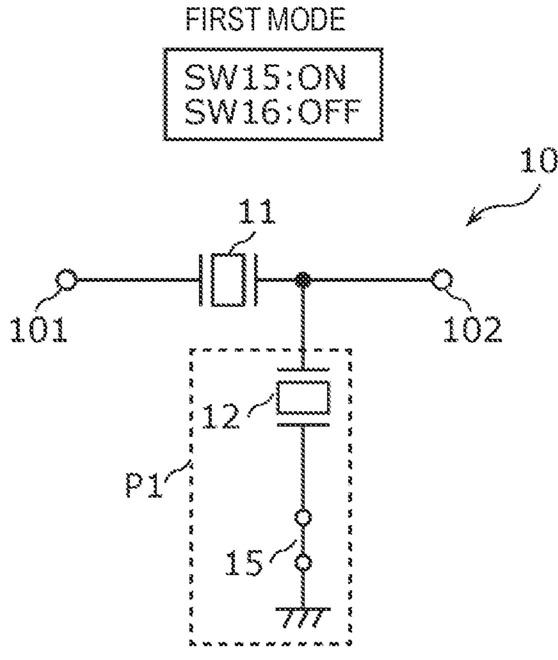
FIG. 4A is a circuit state diagram of the high frequency filter in a first mode according to Embodiment 1.
Figure 4B:
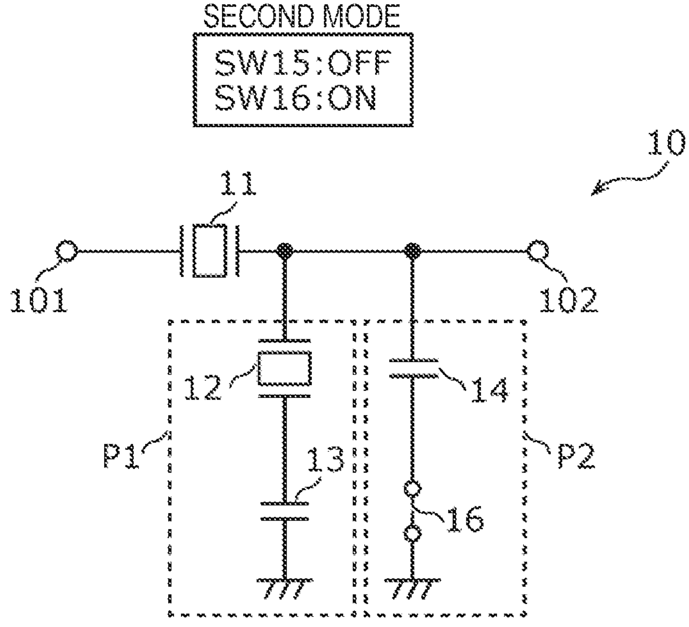
FIG. 4B is a circuit state diagram of the high frequency filter in a second mode according to Embodiment 1.

Next, a switching operation of the filter 10 will be described. FIG. 4A is a circuit state diagram of the filter 10 in a first mode according to Embodiment 1. In addition, FIG. 4B is a circuit state diagram of the filter 10 in a second mode according to Embodiment 1.

The filter 10 is configured to be switchable between a first mode in which the switch 15 is in a conductive state (ON) and the switch 16 is in a non-conductive state (OFF) and a second mode in which the switch 15 is in the non-conductive state (OFF) and the switch 16 is in the conductive state (ON).

As illustrated in FIG. 4A, in the first mode, the filter 10 is in a state in which the parallel arm circuit P1 including only the parallel arm resonator 12 is connected. In addition, as illustrated in FIG. 4B, in the second mode, the filter 10 is in a state in which only the parallel arm circuit P1 to which the parallel arm resonator 12 and the capacitor 13 are connected in series is connected to the parallel arm circuit P2 to which the capacitor 14 is connected.

According to the above switching operation, in the second mode, a resonant frequency of the parallel arm circuit P1 is shifted to a high-frequency side, and a resonance band width (a difference between the anti-resonant frequency and the resonant frequency) of the parallel arm circuit P1 is narrowed as compared with the first mode. Thus, the filter 10 has a first pass band including the first frequency range (band A2) and the second frequency range (band A1) in the first mode, whereas the filter 10 has a second pass band that is narrower than the first pass band and includes the first frequency range (band A2) in the second mode.

Furthermore, in the first mode and the second mode, the switches 15 and 16 are exclusively operated as described above, so that a difference in impedance within the second pass band of the parallel arm circuit in the first mode and the second mode can be reduced. Therefore, it is possible to suppress deterioration in the insertion loss within the second pass band due to impedance matching when the first mode and the second mode are switched. Hereinafter, it will be described that in the filter 10 according to the present embodiment, the difference in impedance within the second pass band of the parallel arm circuit between the modes can be reduced.

Figure 5A:
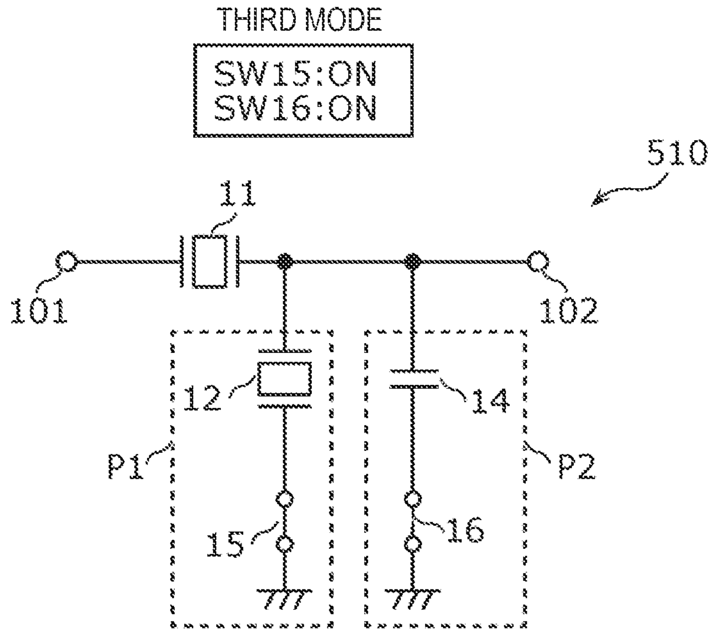
FIG. 5A is a circuit state diagram of a high frequency filter in a third mode according to Comparative Example 1.
Figure 5B:
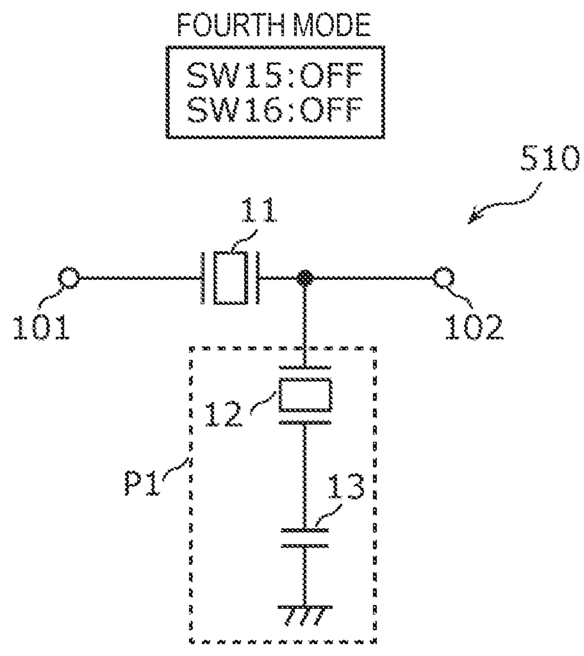
FIG. 5B is a circuit state diagram of the high frequency filter in a fourth mode according to Comparative Example 1.

FIG. 5A is a circuit state diagram of a filter 510 in a third mode according to Comparative Example 1. In addition, FIG. 5B is a circuit state diagram of the filter 510 in a fourth mode according to Comparative Example 1. The filter 510 according to Comparative Example 1 has the same configuration as the filter 10 according to the embodiment, but the switching operations of the switches 15 and 16 are different, and physical quantities (capacitance value, inductance value, and the like) of each circuit configuration are different.

The filter 510 according to Comparative Example 1 is configured to be switchable between a third mode in which the switch 15 is in the conductive state (ON) and the switch 16 is in the non-conductive state (OFF) and a fourth mode in which the switch 15 is in the non-conductive state (OFF) and the switch 16 is in the conductive state (ON).

As illustrated in FIG. 5A, in the third mode, the filter 510 is in a state in which the parallel arm circuit P1 including only the parallel arm resonator 12 is connected to the parallel arm circuit P2 including only the capacitor 14. In addition, in the fourth mode, the filter 510 is in a state in which only the parallel arm circuit P1 to which the parallel arm resonator 12 and the capacitor 13 are connected in series is connected.

In this case, comparison is made between a magnitude of combined impedance of the parallel arm circuit in each mode of the filter 10 according to the present embodiment and a magnitude of combined impedance of the parallel arm circuit in each mode of the filter 510 according to Comparative Example 1. A capacitance of the parallel arm resonator 12 is defined as C0, a capacitance of the capacitor 13 is defined as C1, and a capacitance of the capacitor 14 is defined as C2.

A combined capacitance CP1 of the parallel arm circuit in the first mode of the filter 10 according to the present embodiment is C0 (CP1=C0), with reference to FIG. 4A. In addition, a combined capacitance CP2 of the parallel arm circuit in the second mode of the filter 10 according to the present embodiment is a parallel combined capacitance of a series combined capacitance C01 (<C0) of C0 and C1 and C2 (CP2=C01+C2), with reference to FIG. 4B.

On the other hand, a combined capacitance CP3 of the parallel arm circuit in the third mode of the filter 510 according to Comparative Example 1 is a parallel combined capacitance of C0 and C2 (CP3=C0+C2), with reference to FIG. 5A. Further, a combined capacitance CP4 of the parallel arm circuit in the fourth mode of the filter 510 according to Comparative Example 1 is a series combined capacitance C01 (<C0) of C0 and C1 (CP4=C01), with reference to FIG. 5B.

From the above, a magnitude relationship of the combined capacitance of the parallel arm circuit is CP4<CP1 (CP2)<CP3. A magnitude relationship between CP1 and CP2 is determined by values of C0, C1, and C2. Thus, when the combined impedance in the first mode of the filter 10 according to the present embodiment is defined as Imp1, the combined impedance in the second mode of the filter 10 according to the present embodiment is defined as Imp2, the combined impedance in the third mode of the filter 510 according to Comparative Example 1 is defined as Imp3, and the combined impedance in the fourth mode of the filter 510 according to Comparative Example 1 is defined as Imp4, the magnitude relationship of the combined impedance of the parallel arm circuit is Imp3<Imp1 (Imp2)<Imp4.

That is, fluctuation of the impedance (=|Imp1−Imp2|) in the second pass band between the first mode and the second mode of the filter 10 according to the present embodiment is smaller than fluctuation of the impedance in the second pass band (=|Imp3−Imp4|) between the third mode and the fourth mode of the filter 510 according to Comparative Example 1.

According to the filter 10 according to the present embodiment, the fluctuation of the impedance in the second pass band between the first mode and the second mode can be suppressed, so that the insertion loss in the second pass band and the deterioration in a voltage standing wave ratio (VSWR) when the mode is changed can be suppressed.

Further, according to the filter 10 according to the present embodiment, the transmission signal of band A2 can pass with low loss in the second mode, and the transmission signal of a plurality of bands of band A1 and band A2 can pass with low loss in the first mode, so that the band of the filter 10 having a variable pass band can be widened.

1.4 Calculation Method of Capacitance Value C0 of Resonator

Figure 6:
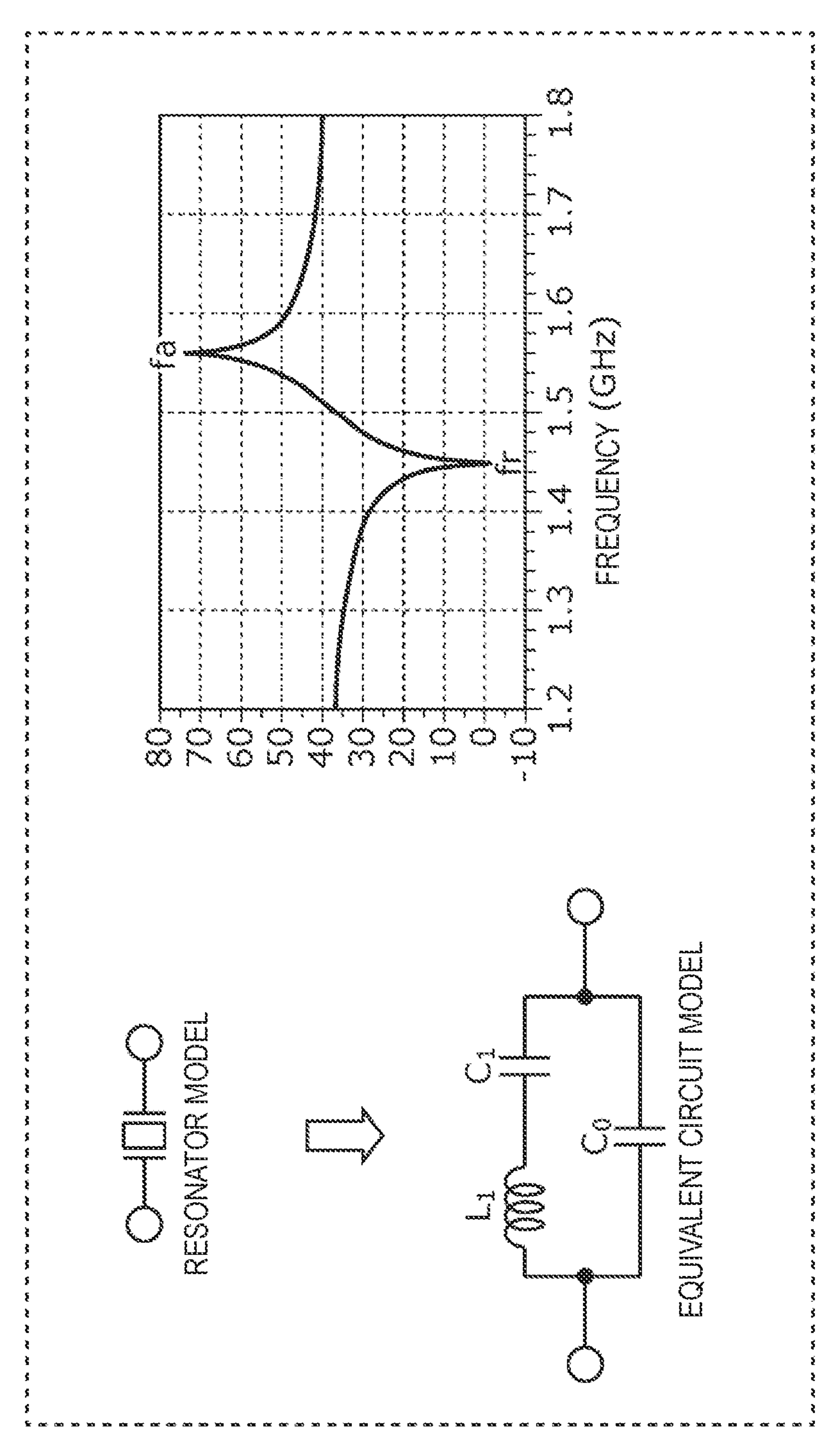
FIG. 6 is a diagram showing an equivalent circuit model of one resonator and resonance characteristics thereof.

Here, a method of calculating the capacitance C0 of the parallel arm resonator 12 will be described. FIG. 6 is a diagram showing an equivalent circuit model of one resonator and resonance characteristics thereof. As illustrated in FIG. 6, the resonator can be represented by a series circuit of a capacitor $C_1$ (capacitance value $C_1$) and an inductor $L_1$ (inductance value $L_1$) and a parallel circuit of the capacitor $C_0$ (capacitance value $C_0$). In this case, the capacitor $C_0$ is an electrostatic capacity of the resonator and corresponds to the capacitance value C0 of the parallel arm resonator 12.

For example, when the resonator includes a plurality of resonators, the capacitance $C_0$ of the plurality of resonators is defined as a combined capacitance of a resonance circuit obtained by combining the plurality of resonators.

In the equivalent circuit, a resonant frequency fr of the resonator is defined by the series circuit of the capacitor $C_1$ and the inductor $L_1$, and is a frequency at which the impedance of the equivalent circuit is 0, so that by solving Equation 1, it is expressed by Equation 2.

$$Z = 0 = j\omega L_1 + \frac{1}{j\omega C_1} \quad \text{(Equation 1)}$$

$$f_r = \frac{1}{2\pi\sqrt{L_1 C_1}} \quad \text{(Equation 2)}$$

Moreover, an anti-resonant frequency fa of the resonator is a frequency at which an admittance Y of the equivalent circuit is 0, so that by solving Equation 3, it is expressed by Equation 4.

$$Y = \frac{1}{Z} = 0 = \frac{1}{\frac{1}{j\omega C_0}} + \frac{1}{j\omega L_1 + \frac{1}{j\omega C_1}} \quad \text{(Equation 3)}$$

$$f_a = \frac{\sqrt{1 + \frac{C_1}{C_0}}}{2\pi\sqrt{L_1 C_1}} = f_r\sqrt{1 + \frac{C_1}{C_0}} \quad \text{(Equation 4)}$$

From Equations 2 and 4, the capacitors $C_0$ and $C_1$ can be expressed by Equation 5.

$$\frac{fa^2}{fr^2} = 1 + \frac{C_1}{C_0} \quad \text{(Equation 5)}$$

$$C_0 + C_1 = C_0\frac{fa^2}{fr^2}$$

On the other hand, as can be understood from the above equivalent circuit, since the impedance of the inductor $L_1$ can be ignored at a frequency that is sufficiently lower than the resonant frequency fr, the combined capacitance C of the equivalent circuit is expressed by Equation 6.

$$C(f \ll fr) = C_0 + C_1 \quad \text{(Equation 6)}$$

Therefore, the capacitance $C_0$ is expressed by Equation 7 using the combined capacitance C at a low frequency, the resonant frequency fr, and the anti-resonant frequency fa.

$$C_0 = \frac{fr^2}{fa^2}C(f \ll fr) \quad \text{(Equation 7)}$$

Next, a method for measuring the combined capacitance C, the resonant frequency fr, and the anti-resonant frequency fa will be described.

First, a measurement RF probe is applied to an input/output terminal of the resonator to measure reflection characteristics (S11) of the resonator using a network analyzer. Thus, input impedance of the resonator is expressed by Equation 8.

$$Zin = Z0\frac{1 + S11}{1 - S11} \quad \text{(Equation 8)}$$

A resonant frequency fr is calculated as a frequency at which input impedance Zin in Equation 8 is minimum, and an anti-resonant frequency fa is calculated as a frequency at which the input impedance Zin in Equation 8 is maximum. When the input impedance Zin has a plurality of minimal values or a plurality of maximal values, poles in or near the pass band of the filter are defined as a minimal value and a maximal value of the input impedance Zin.

Moreover, the combined capacitance C of the resonator can be acquired using an impedance analyzer. In addition, conversion can be performed by Equation 9 using the input impedance Zin at a low frequency region where the inductance value $L_1$ can be sufficiently ignored, for example, at a frequency that is ⅕ or less of the resonant frequency fr.

$$C(f \ll fr) = \mathrm{Im}\left(\frac{1}{Zin}\right)\frac{1}{2\pi f} \quad \text{(Equation 9)}$$

From the above description, the resonant frequency fr and the anti-resonant frequency fa are calculated by Equation 8, and the combined capacitance C is calculated by Equation 9 or the impedance analyzer, thereby calculating the capacitance $C_0$ of the resonator by Equation 7. The capacitance $C_0$ of the resonator is defined as a capacitance C0 of the parallel arm resonator 12.

The capacitance C1 of the capacitor 13 and the capacitance C2 of the capacitor 14 constituting the filter 10 according to the present embodiment can be measured using an impedance analyzer.

1.5 Circuit Configuration and Switching Operation of Filter 10A According to Example 1

Figure 7A:
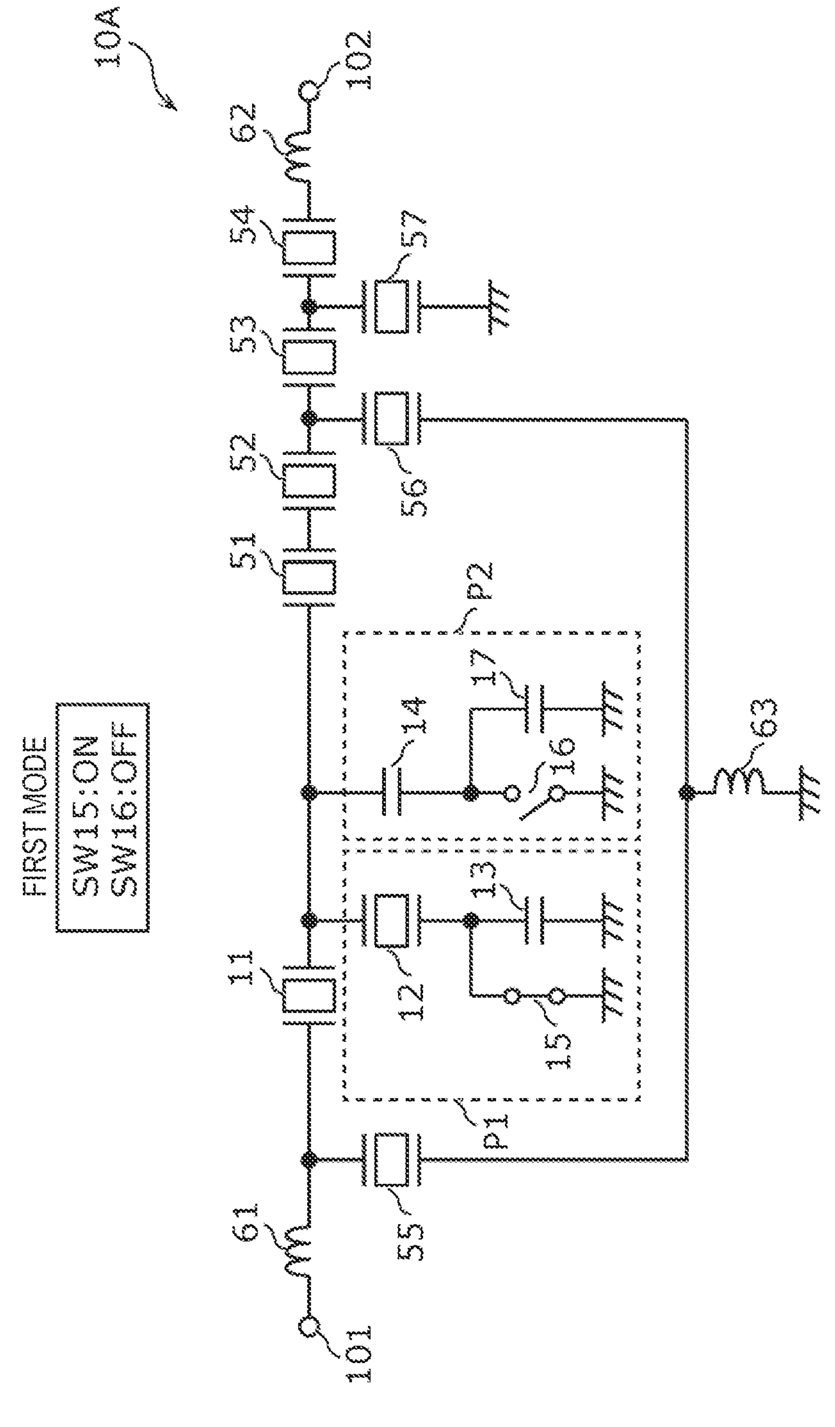
FIG. 7A is a circuit state diagram of a high frequency filter in a first mode according to Example 1.
Figure 7B:
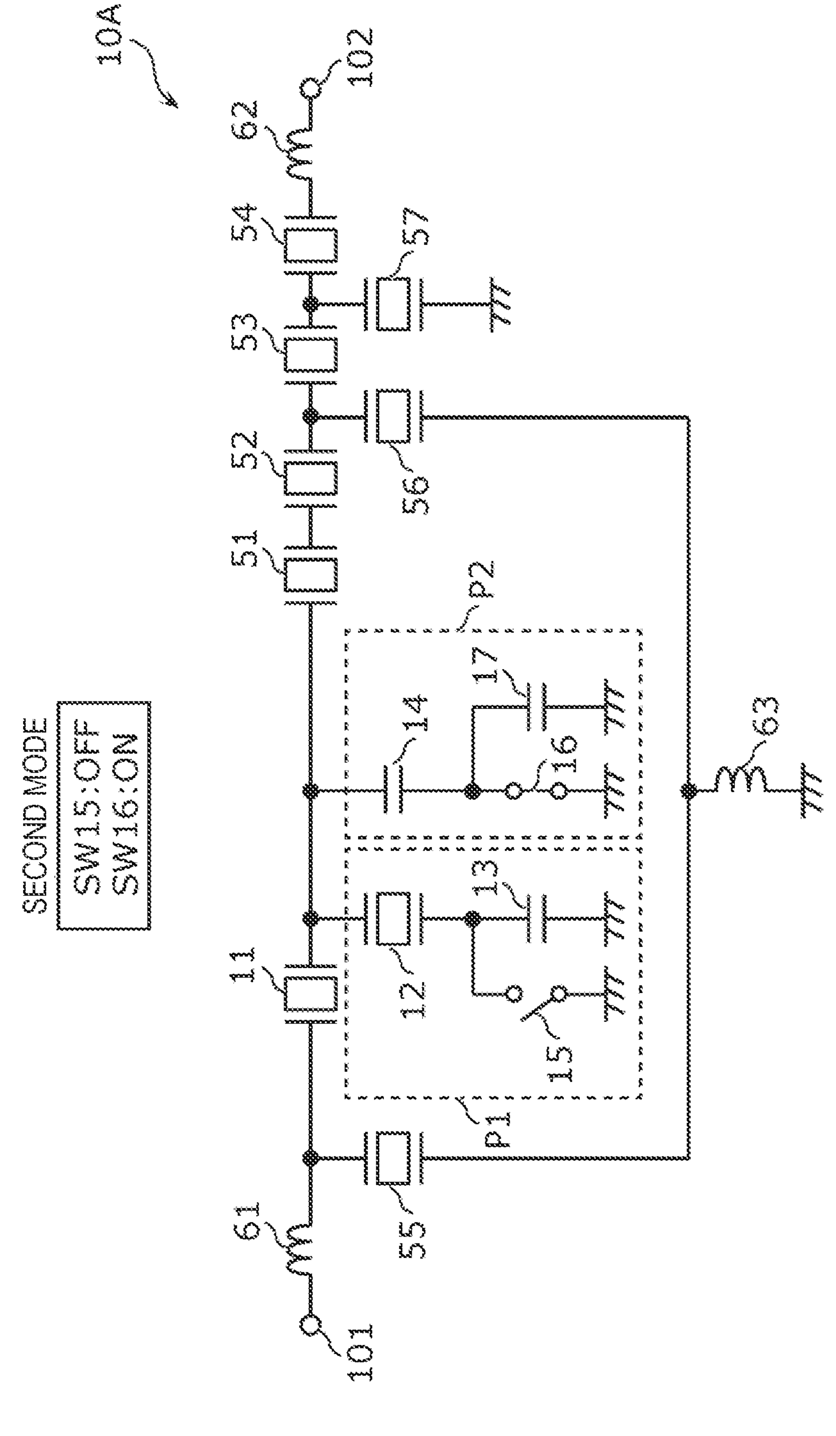
FIG. 7B is a circuit state diagram of the high frequency filter in a second mode according to Example 1.

Next, a circuit configuration of a filter 10A according to Example 1 will be described. FIG. 7A is a circuit state diagram of the filter 10A in a first mode according to Example 1. In addition, FIG. 7B is a circuit state diagram of the filter 10A in a second mode according to Example 1. As illustrated in FIGS. 7A and 7B, the filter 10A includes series arm resonators 51, 52, 53, and 54, parallel arm resonators 55, 56, and 57, inductors 61, 62, and 63, and a capacitor 17, in addition to circuit components of the filter 10 according to Embodiment 1. As compared with the filter 10 according to Embodiment 1, to the filter 10A according to Example 1, the series arm resonators 51 to 54, the parallel arm resonators 55 to 57, and the inductors 61 to 63 are added, so that the attenuation near the pass band is optimized. Hereinafter, in the filter 10A according to Example 1, the description of the same configuration as that of the filter 10 according to Embodiment 1 is omitted, and the description will focus on the different configurations.

The capacitor 17 is an example of a third capacitor, is connected parallel to the switch 16, and constitutes the parallel arm circuit P2 together with the capacitor 14 and the switch 16. By adding the capacitor 17, a peak voltage applied to the switch 16 when the switch 16 is in the non-conductive state can be reduced. Therefore, a withstand voltage performance of the switch 16 can be alleviated.

A third capacitor for alleviating the withstand voltage performance of the switch 15 may be connected parallel to the switch 15.

The series arm resonators 51 to 54 are connected in series to a series arm path for connecting the series arm resonator 11 and the terminal 102. The parallel arm resonator 55 is connected between a path for connecting the terminal 101 and the series arm resonator 11 and a ground. The parallel arm resonator 56 is connected between a path for connecting the series arm resonators 52 and 53 and a ground. The parallel arm resonator 57 is connected between a path for connecting the series arm resonators 53 and 54 and a ground. The inductor 61 is connected between the terminal 101 and the series arm resonator 11. The inductor 62 is connected between the terminal 102 and the series arm resonator 54. The inductor 63 is connected between the parallel arm resonators 55 and 56 and a ground. Table 1 shows an example of a capacitance value and a resistance value of the component of the filter 10A according to Example 1.

TABLE 1

| | Filter 10A |
|---|---|
| Parallel arm resonator 12 C0 (pF) | 6.9 |
| Capacitor 13 C1 (pF) | 5.2 |
| Capacitor 14 C2 (pF) | 0.7 |
| Capacitor 17 C3 (pF) | 0.4 |
| Switches 15&16 Off capacity (pF) | 0.3 |
| Switches 15&16 On resistance (Ω) | 1.0 |

The filter 10A is configured to be switchable between a first mode (see FIG. 7A) in which the switch 15 is in the conductive state (ON) and the switch 16 is in the non-conductive state (OFF) and a second mode (see FIG. 7B) in which the switch 15 is in the non-conductive state (OFF) and the switch 16 is in the conductive state (ON).

Figure 8:
FIG. 8 is a graph showing bandpass characteristics of the high frequency filter according to Example 1.
Figure 8:
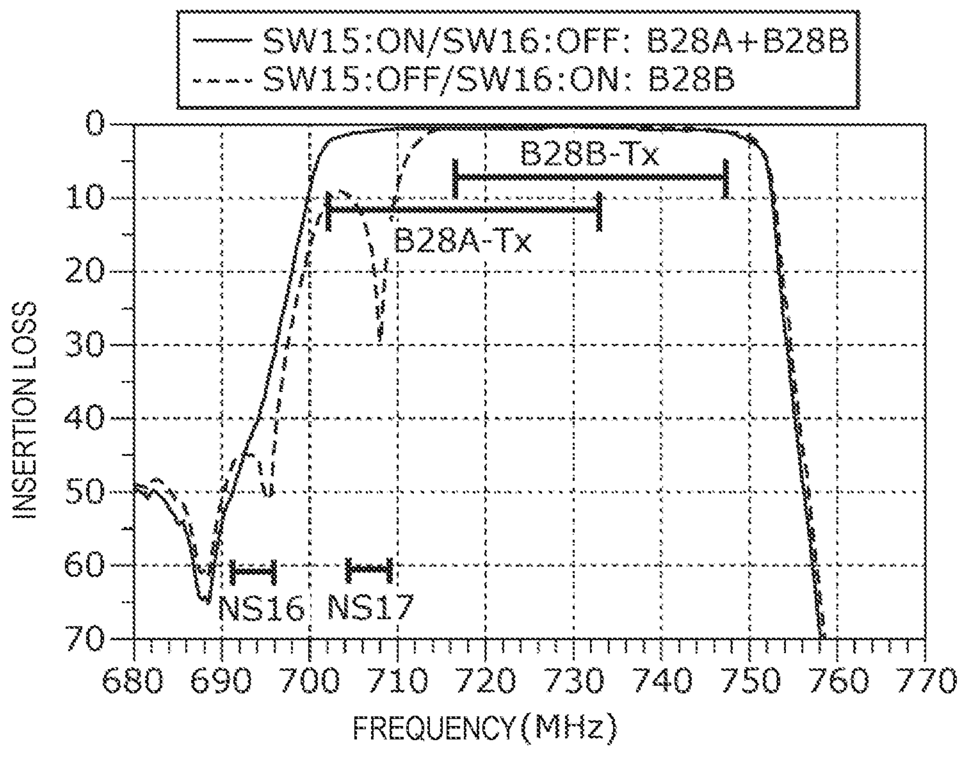
Figure 9A:
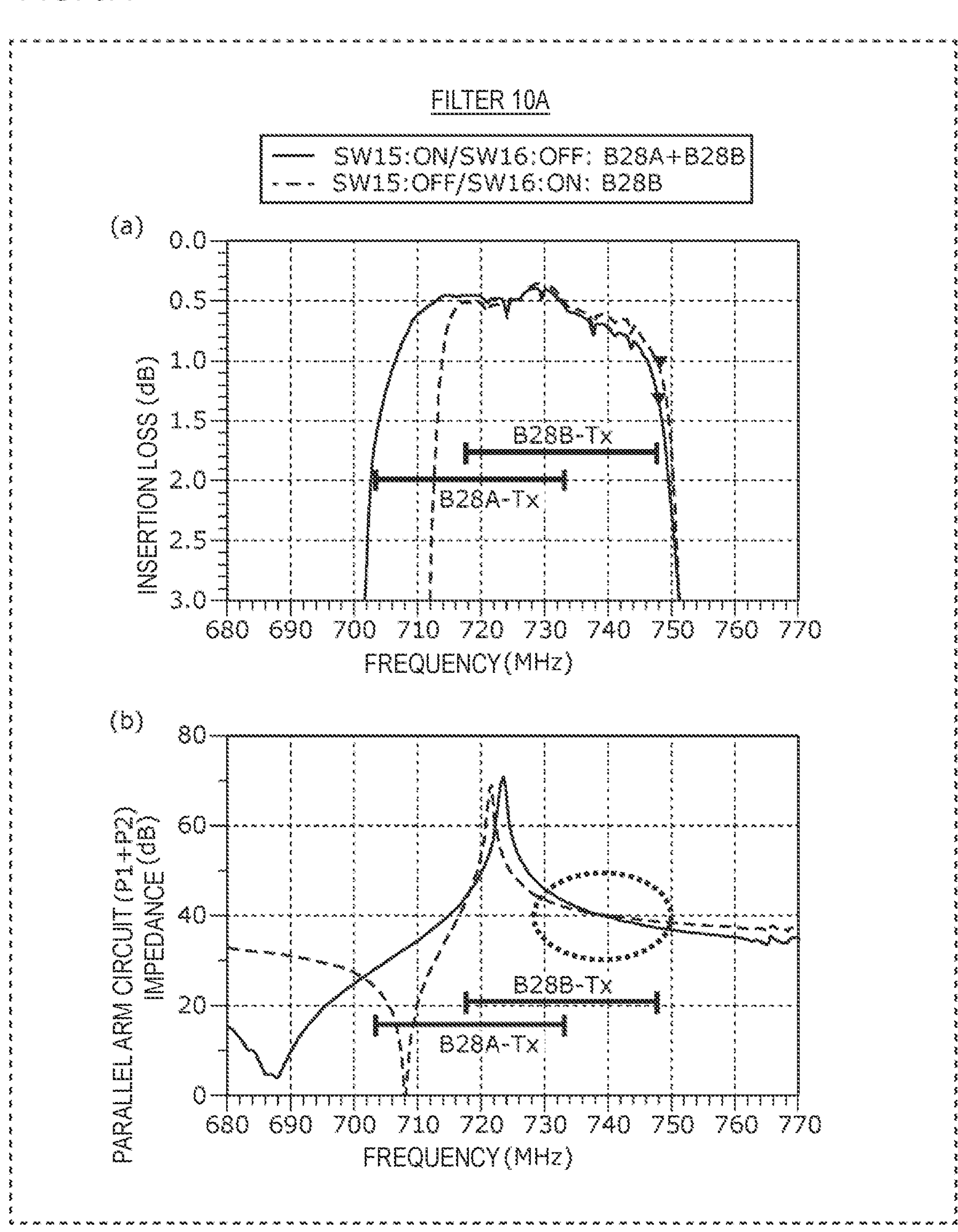
FIG. 9A is a graph showing bandpass characteristics and impedance characteristics of the high frequency filter according to Example 1.
Figure 9B:
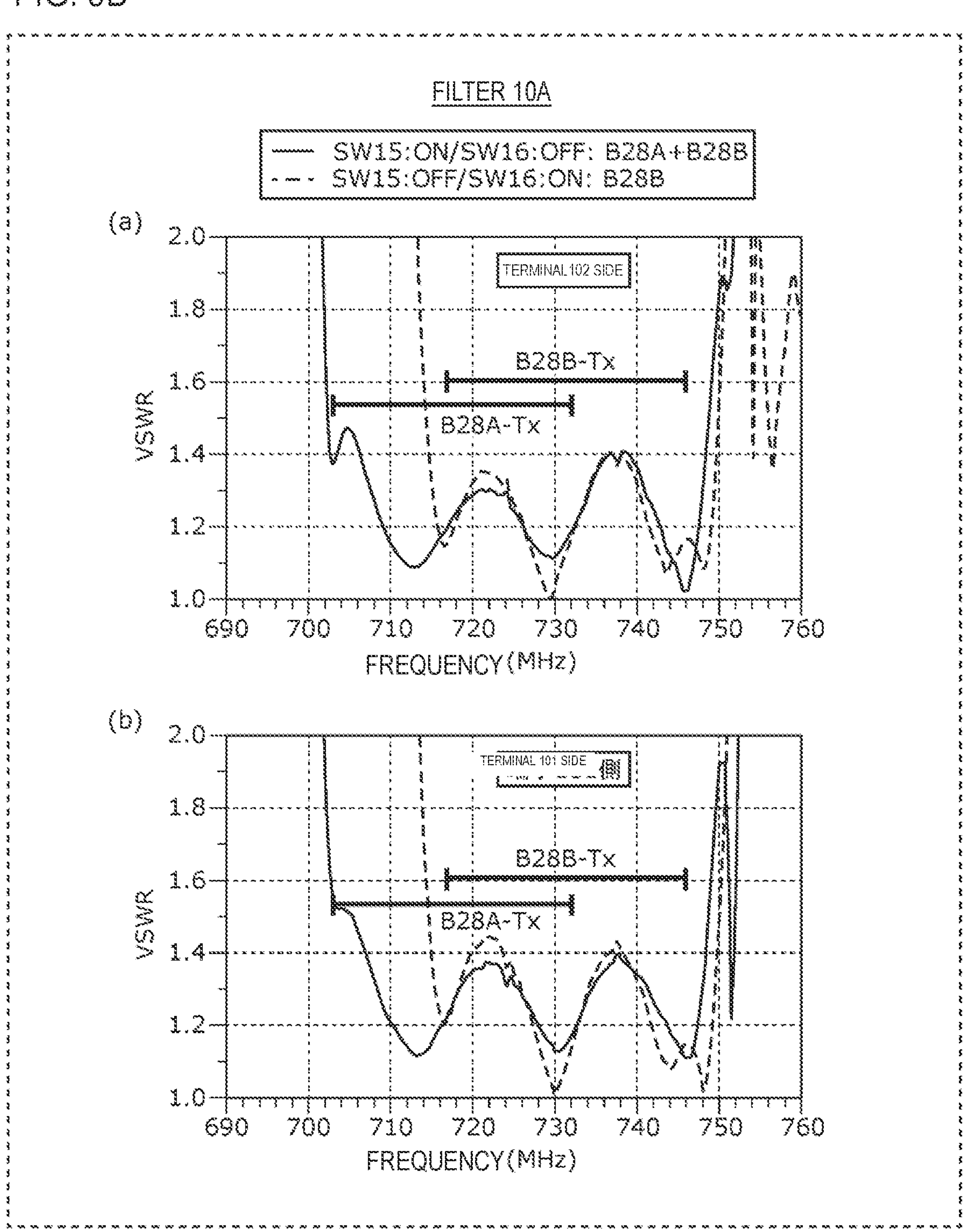
FIG. 9B is a graph showing a voltage standing wave ratio of the high frequency filter according to Example 1.

FIG. 8 is a graph showing bandpass characteristics of the filter 10A according to Example 1. In addition, FIG. 9A is a graph showing the bandpass characteristics and the impedance characteristics of the filter 10A according to Example 1. In addition, FIG. 9B is a graph showing a VSWR of the filter 10A according to Example 1.

As illustrated in FIG. 7A, in the first mode, the filter 10A is in a state in which the parallel arm circuit P1 including only the parallel arm resonator 12 is connected to the parallel arm circuit P2 to which the capacitors 14 and 17 are connected in series. In addition, as illustrated in FIG. 7B, in the second mode, the filter 10A is in a state in which only the parallel arm circuit P1 to which the parallel arm resonator 12 and the capacitor 13 are connected in series is connected to the parallel arm circuit P2 to which the capacitor 14 is connected.

According to the above switching operation, as illustrated in (b) of FIG. 9A, in the second mode, a resonant frequency of the parallel arm circuit P1 is shifted to a high-frequency side, and a resonance band width (a difference between the anti-resonant frequency and the resonant frequency) of the parallel arm circuit P1 is narrowed as compared with the first mode. Thus, as illustrated in FIG. 8 and (a) of FIG. 9A, the filter 10A has a first pass band including the first frequency range (band A2 (B28B-Tx)) and the second frequency range (band A1 (B28A-Tx)) in the first mode, whereas the filter 10A has a second pass band that is narrower than the first pass band and includes the first frequency range (band A2 (B28B-Tx)) in the second mode.

Furthermore, in the first mode and the second mode, the switches 15 and 16 are exclusively operated as described above, so that a difference in impedance within the second pass band of the parallel arm circuit in the first mode and the second mode can be reduced (a black broken line portion of (b) of FIG. 9A). Accordingly, deterioration in reflection characteristics of the filter 10A can be suppressed by mode switching. As illustrated in FIG. 9B, a VSWR in the second pass band on a terminal 102 side ((a) of FIG. 9B) and a terminal 101 side ((b) of FIG. 9B) has an excellent value (1.5 or less) in both the first mode and the second mode. Accordingly, as illustrated in (a) of FIG. 9A, deterioration in the insertion loss within a high-frequency side region of the second pass band can be suppressed.

As described above, according to the filter 10A according to the present example, the fluctuation of the impedance in the second pass band between the first mode and the second mode can be suppressed, so that the deterioration in the insertion loss in the second pass band when the mode is changed can be suppressed. Further, the transmission signal of band A2 can pass with low loss in the second mode, and the transmission signal of a plurality of bands of band A1 and band A2 can pass with low loss in the first mode, so that the band of the filter 10A having a variable pass band can be widened.

Figure 10:
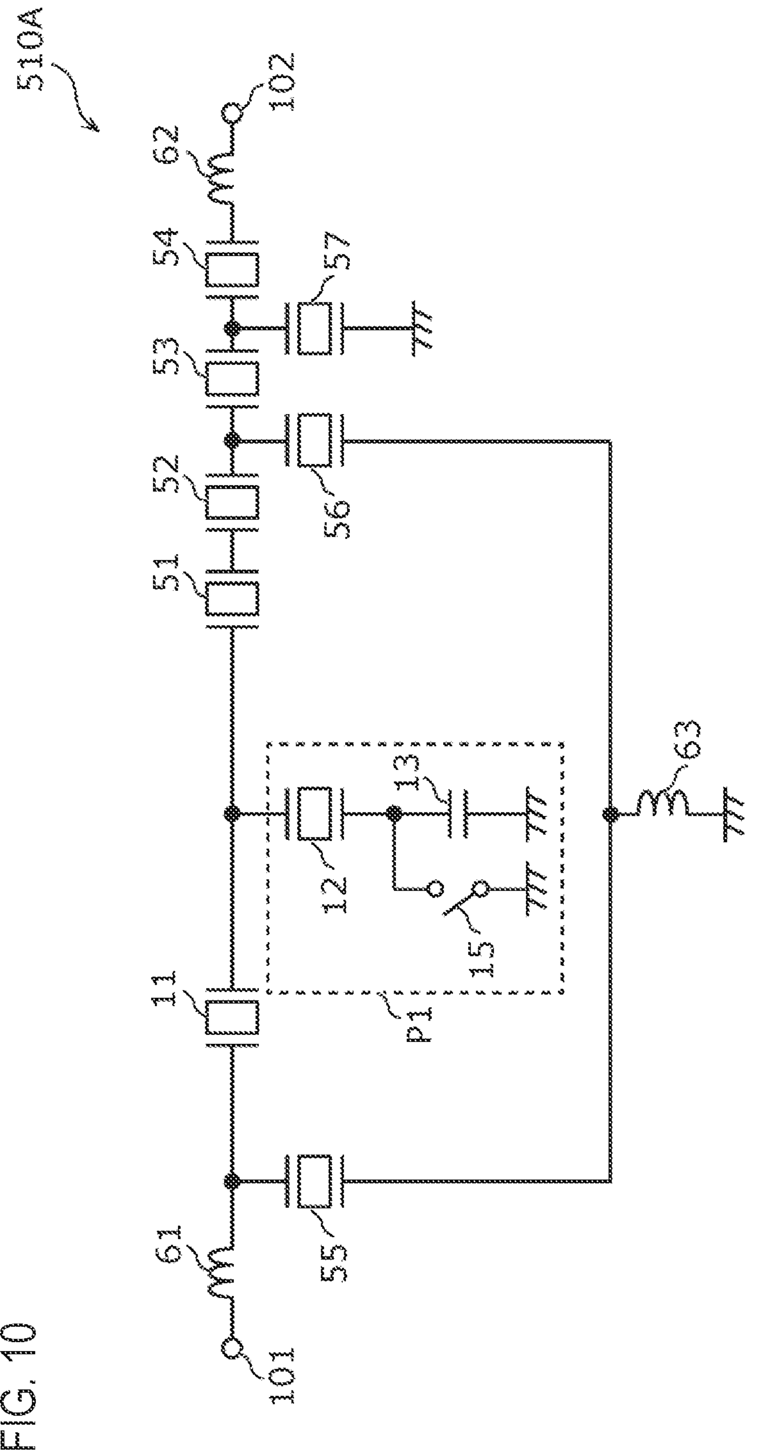
FIG. 10 is a circuit configuration diagram of a high frequency filter according to Comparative Example 2.
Figure 11A:
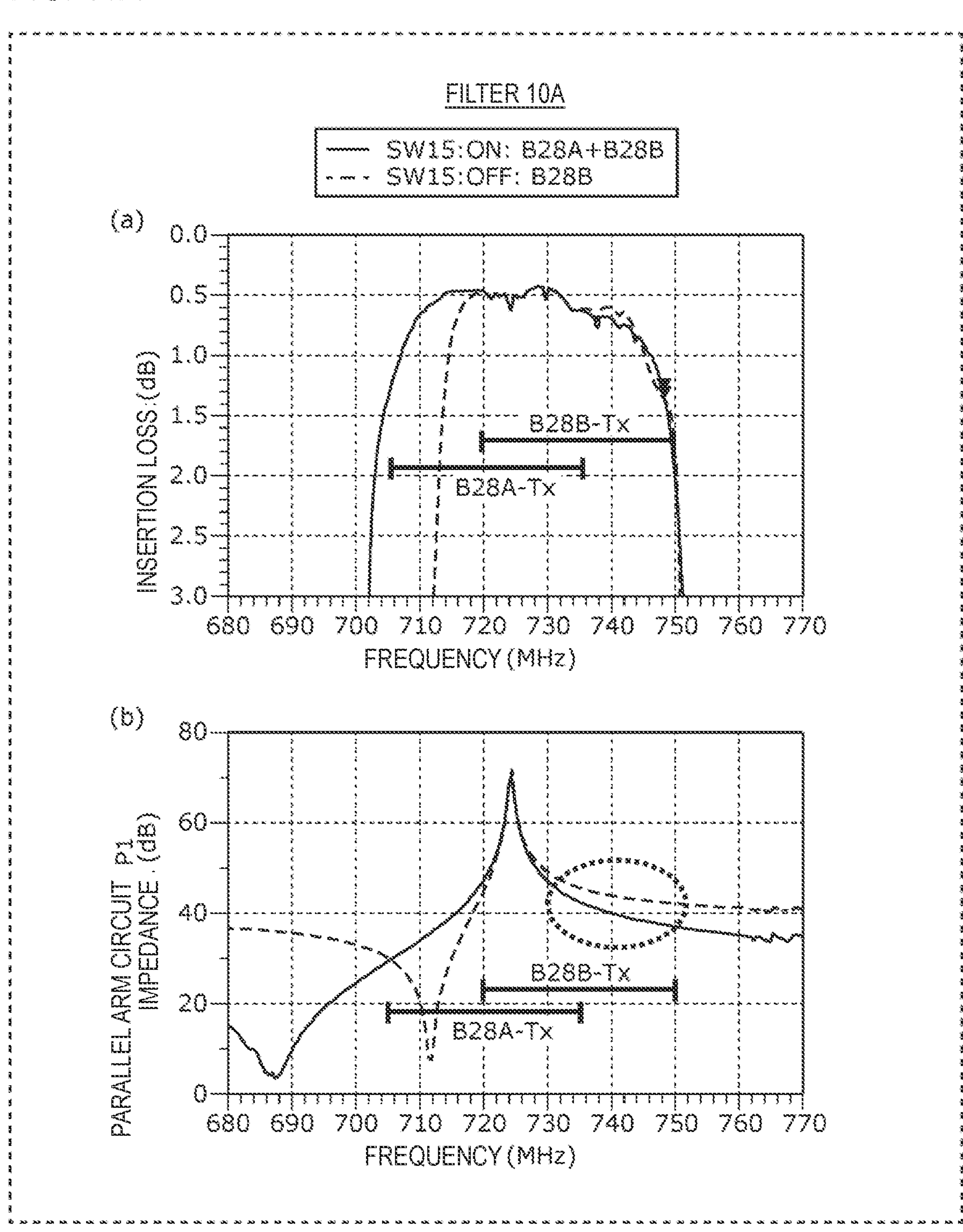
FIG. 11A is a graph showing bandpass characteristics and impedance characteristics of the high frequency filter according to Comparative Example 2.
Figure 11B:
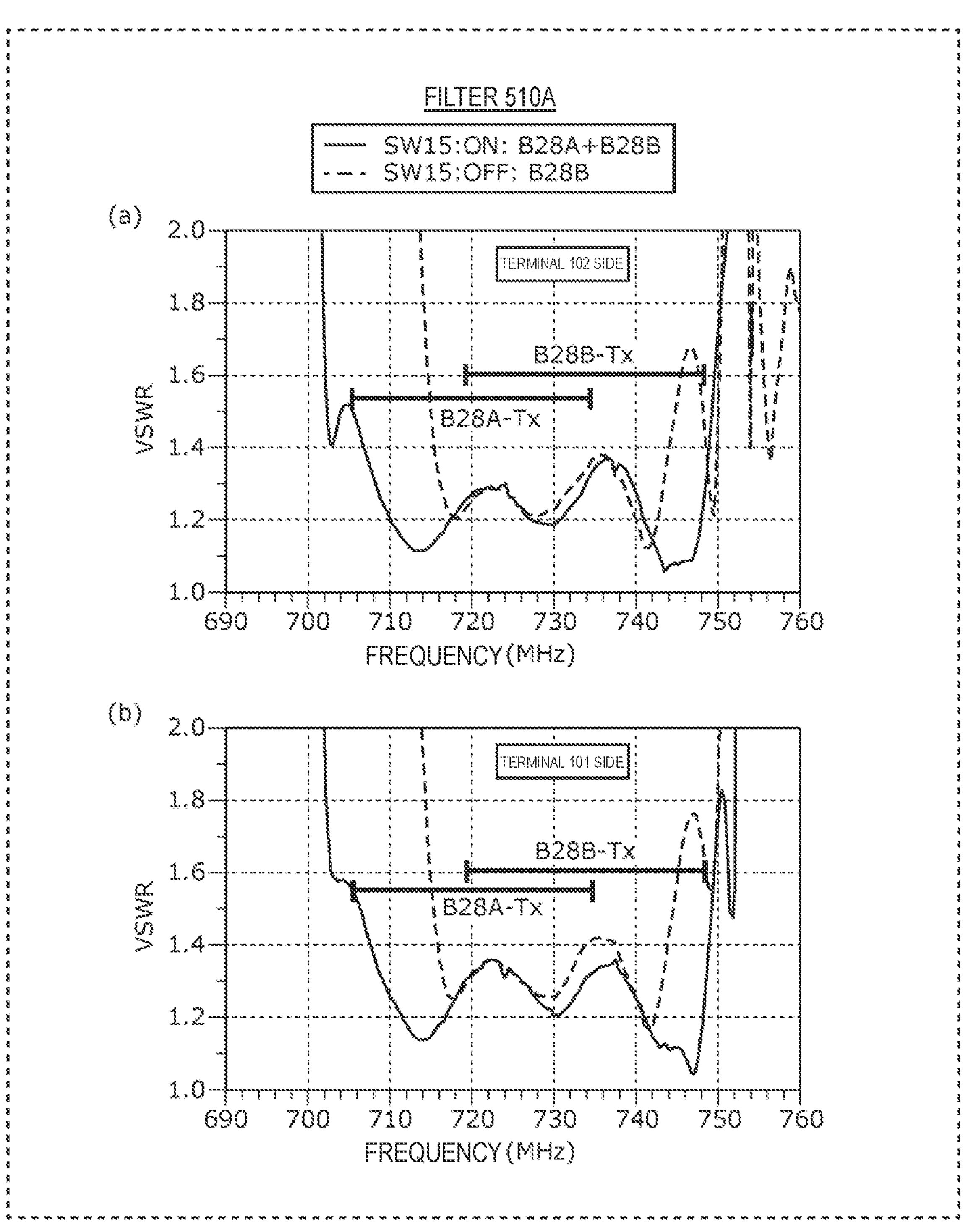
FIG. 11B is a graph showing a voltage standing wave ratio of the high frequency filter according to Comparative Example 2.

Next, a circuit configuration of the filter 510A according to Comparative Example 2 and characteristics thereof will be described. FIG. 10 is a circuit configuration diagram of the filter 510A according to Comparative Example 2. In addition, FIG. 11A is a graph showing bandpass characteristics and impedance characteristics of the filter 510A according to Comparative Example 2. In addition, FIG. 11B is a graph showing a VSWR of the filter 510A according to Comparative Example 2.

The filter 510A according to Comparative Example 2 is different from the filter 10A according to Example 1 in a configuration that does not include the parallel arm circuit P2. In the first mode, the filter 510A is in a state in which the switch 15 is in the conductive state and the parallel arm circuit P1 including only the parallel arm resonator 12 is connected. In addition, in the second mode, the filter 510A is in a state in which only the switch 15 is in the non-conductive state and the parallel arm circuit P1 to which the parallel arm resonator 12 and the capacitor 13 are connected in series is connected.

According to the above switching operation, as illustrated in (b) of FIG. 11A, in the second mode, a resonant frequency of the parallel arm circuit P1 is shifted to a high-frequency side, and a resonance band width (a difference between the anti-resonant frequency and the resonant frequency) of the parallel arm circuit P1 is narrowed as compared with the first mode. Thus, as illustrated in (a) of FIG. 11A, the filter 510A has a first pass band including the first frequency range (band A2 (B28B-Tx)) and the second frequency range (band A1 (B28A-Tx)) in the first mode, whereas the filter 510A has a second pass band that is narrower than the first pass band and includes the first frequency range (band A2 (B28B-Tx)) in the second mode.

However, in the first mode and the second mode, when the switch 15 is operated as described above, a difference in impedance within the second pass band of the parallel arm circuit in the first mode and the second mode is large (a black broken line portion of (b) of FIG. 11A). Accordingly, deterioration in reflection characteristics of the filter 510A can be suppressed by mode switching. As illustrated in FIG. 11B, a VSWR in the second pass band on a terminal 102 side ((a) of FIG. 11B) and a terminal 101 side ((b) of FIG. 11B) is deteriorated (1.6 or more) on the high-frequency side of the second pass band in the second mode. Accordingly, as illustrated in (a) of FIG. 11A, the insertion loss in a high-frequency side region of the second pass band can be deteriorated.

As compared with the filter 510A according to Comparative Example 2, according to the filter 10A according to the present example, the switch 15 of the parallel arm circuit P1 and the switch 16 of the parallel arm circuit P2 are exclusively operated as described above, so that the fluctuation in impedance within the second pass band between the first mode and the second mode can be suppressed. Accordingly, deterioration in the insertion loss within the second pass band when the mode is changed can be suppressed.

1.6 Capacitance Value Range of Filters 10 and 10A

Next, an optimum capacitance value range of the parallel arm resonator 12 and the capacitors 13 and 14 constituting the filter 10 according to Embodiment 1 and the filter 10A according to Example 1 will be described.

Figure 12:
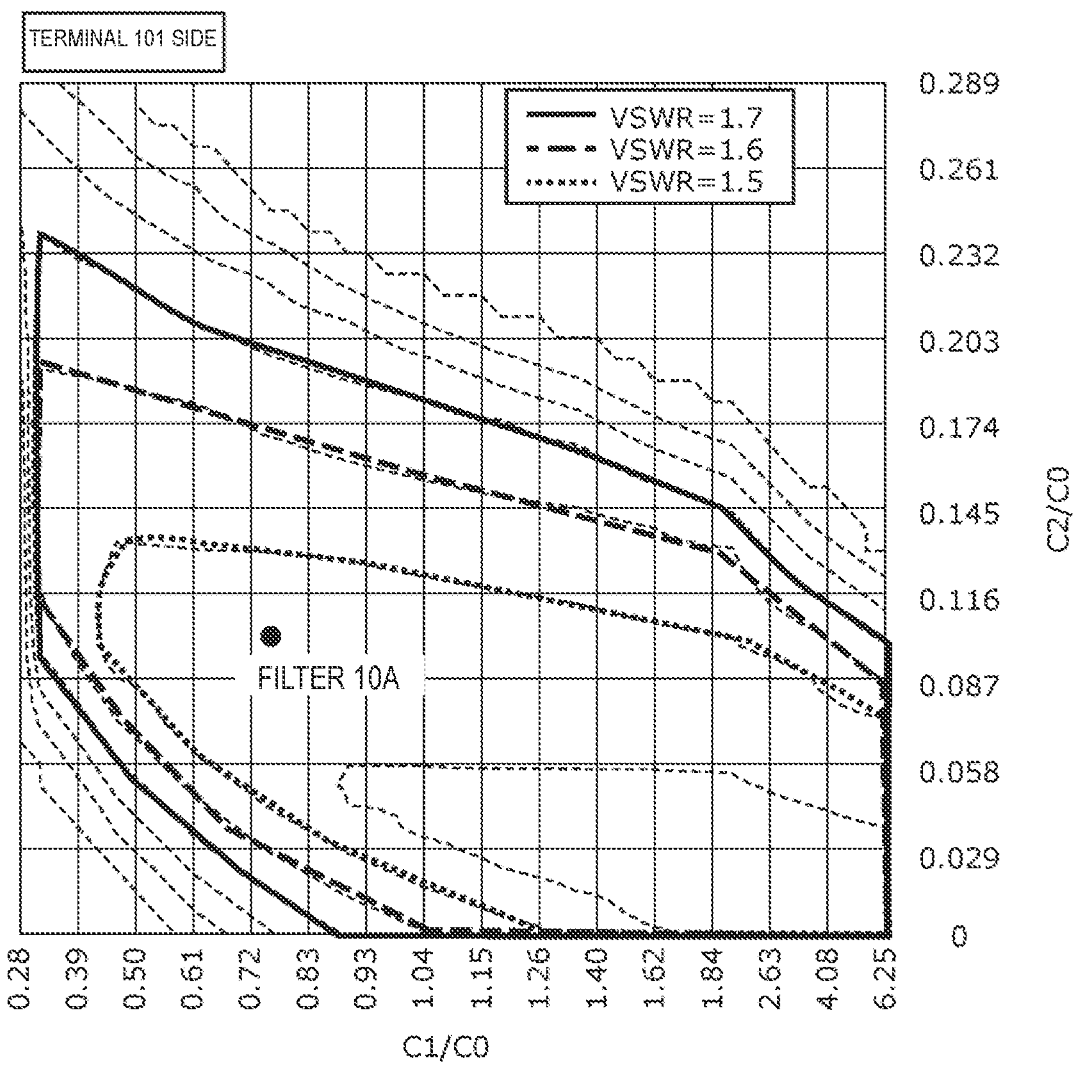
FIG. 12 is a capacitance correlation diagram of a first capacitor and a second capacitor of the high frequency filter according to Example 1.

FIG. 12 is a capacitance correlation diagram of the capacitors 13 and 14 of the filter 10 according to Embodiment 1 and the filter 10A according to Example 1.

The impedance of the parallel arm circuit is determined by relative values of the capacitances C1 and C2 added to the capacitance C0 of the parallel arm resonator 12. In FIG. 12, a capacitance value of the parallel arm resonator 12 is defined as C0, a capacitance value of the capacitor 13 is defined as C1, a capacitance value of the capacitor 14 is defined as C2, an X-axis is defined as a normalized capacitance C1/C0 of the capacitor 13, and a Y-axis is defined as a normalized capacitance C2/C0 of the capacitor 14, to calculate a VSWR on the terminal 101 side. From FIG. 12, it can be understood that an excellent VSWR can be obtained by limiting the normalized capacitance C1/C0 of the capacitor 13 and the normalized capacitance C2/C0 of the capacitor 14 to a specific range.

First, when the VSWR is set to 1.7 or less, a matching loss in the pass band can be 0.3 dB or less. From FIG. 12, the following Equation 10 is satisfied, so that the VSWR can be set to 1.7 or less.

$$3.20\times10^{-1}\le(C1/C0)\le6.25,\text{ and}\qquad\text{(Equation 10)}$$

$$0\le C2/C0,\text{ and}$$

$$F1(C1/C0)\le C2/C0\le F2(C1/C0),$$

$$F1(C1/C0)=1.80\times10^{-1}\times(C1/C0)^2-3.82\times10^{-1}\times(C1/C0)+1.98\times10^{-1},$$

$$F2(C1/C0)=3.77\times10^{-4}\times(C1/C0)^4-6.31\times10^{-3}\times(C1/C0)^3+4.00\times10^{-2}\times(C1/C0)^2-1.22\times10^{-1}\times(C1/C0)+2.71\times10^{-1}$$

VSWR can be set to 1.6 or less. Accordingly, the matching loss in the pass band can be 0.24 dB or less. From FIG. 12, the following Equation 11 is satisfied, so that the VSWR can be set to 1.6 or less.

$$3.20\times10^{-1}\le(C1/C0)\le6.25,\text{ and}\qquad\text{(Equation 11)}$$

$$0\le C2/C0,\text{ and}$$

$$F1(C1/C0)\le C2/C0\le F2(C1/C0),$$

$$F1(C1/C0)=1.73\times10^{-1}\times(C1/C0)^2-3.86\times10^{-1}\times(C1/C0)+2.18\times10^{-1},$$

$$F2(C1/C0)=6.30\times10^{-4}\times(C1/C0)^4-9.12\times10^{-3}\times(C1/C0)^3+4.66\times10^{-2}\times(C1/C0)^2-1.12\times10^{-1}\times(C1/C0)+2.29\times10^{-1}$$

Moreover, the VSWR can be set to 1.5 or less. Accordingly, the matching loss in the pass band can be 0.18 dB or less. From FIG. 12, the following Equation 12 is satisfied, so that the VSWR can be set to 1.5 or less.

$$4.30\times10^{-1}\le(C1/C0)\le6.25,\text{ and}\qquad\text{(Equation 12)}$$

$$0\le C2/C0,\text{ and}$$

$$F1(C1/C0)\le C2/C0\le F2(C1/C0),$$

$$F1(C1/C0)=1.14\times10^{-1}\times(C1/C0)^2-3.12\times10^{-1}\times(C1/C0)+2.15\times10^{-1},$$

$$F2(C1/C0)=-3.94\times10^{-4}\times(C1/C0)^3-6.13\times10^{-3}\times(C1/C0)^2-3.56\times10^{-2}\times(C1/C0)^2+1.51\times10^{-1}$$

1.7 Effect, and the Like

As described above, the filter 10 according to Embodiment 1 and the filter 10A according to Example 1 include the series arm resonator 11 connected between the terminal 101 and the terminal 102, the parallel arm circuit P1 connected to the ground and the path for connecting the series arm resonator 11 and the terminal 102, and the parallel arm circuit P2 connected to the path and the ground, in which the parallel arm circuit P1 has the parallel arm resonator 12 and the frequency variable circuit connected in series to each other between the path and the ground, the frequency variable circuit has the capacitor 13 and the switch 15 connected parallel to each other, the parallel arm circuit P2 has the capacitor 14 and the switch 16 connected in series to each other between the path and the ground, and when a capacitance value of the parallel arm resonator 12 is defined as C0, a capacitance value of the capacitor 13 is defined as C1, and a capacitance value of the capacitor 14 is defined as C2, a relational expression of Equation 10 is satisfied.

Accordingly, the switches 15 and 16 are exclusively operated, so that the pass band can be changed. Further, the difference in impedance of the parallel arm circuit before and after the change in the pass band can be reduced, and the capacitance C0 of the parallel arm resonator 12, the capacitance C1 of the capacitor 13, and the capacitance C2 of the capacitor 14 are set to have a relationship of Equation 10, so that the VSWR of the filters 10 and 10A can be set to 1.7 or less. Therefore, it is possible to provide pass band variable filters 10 and 10A in which the deterioration in the insertion loss before and after the change in the pass band is suppressed.

Further, the filters 10 and 10A are switchable between the first mode in which the switch 15 is in the conductive state and the switch 16 is in the non-conductive state and the second mode in which the switch 15 is in the non-conductive state and the switch 16 is in the conductive state.

Accordingly, the switches 15 and 16 are exclusively operated as described above, so that a difference in impedance of the parallel arm circuit in the first mode and the second mode can be reduced. Therefore, it is possible to suppress deterioration in the insertion loss within the pass band due to impedance matching when the first mode and the second mode are switched.

Further, for example, the filters 10 and 10A have the first pass band including the first frequency range (band A2) and the second frequency range (band A1) on the low-frequency side of the first frequency range in the first mode, and have the second pass band that is narrower than the first pass band and includes the first frequency range in the second mode.

Accordingly, when the filters 10 and 10A have the first pass band, a transmission signal of a wideband including bands A1 and A2 can be transmitted, and when the filters 10 and 10A have the second pass band, attenuation of bands on the low-frequency side of the second pass band can be secured.

Further, for example, in the filters 10 and 10A, the relational expression of Equation 11 is satisfied.

Accordingly, the capacitance C0 of the parallel arm resonator 12, the capacitance C1 of the capacitor 13, and the capacitance C2 of the capacitor 14 are set to have a relationship of Equation 11, so that the VSWR of the filters 10 and 10A can be set to 1.6 or less. Therefore, it is possible to provide pass band variable filters 10 and 10A in which the deterioration in the insertion loss before and after the change in the pass band is further suppressed.

Further, for example, in the filters 10 and 10A, the relational expression of Equation 12 is satisfied.

Accordingly, the capacitance C0 of the parallel arm resonator 12, the capacitance C1 of the capacitor 13, and the capacitance C2 of the capacitor 14 are set to have a relationship of Equation 12, so that the VSWR of the filters 10 and 10A can be set to 1.5 or less. Therefore, it is possible to provide pass band variable filters 10 and 10A in which the deterioration in the insertion loss before and after the change in the pass band is further suppressed.

Further, for example, in the filters 10 and 10A, the parallel arm resonator 12 is a resonator using a surface acoustic wave or a bulk acoustic wave.

Accordingly, the size of the parallel arm resonator 12 can be reduced, so that the size and cost of the filters 10 and 10A can be reduced. In addition, the resonator using the surface acoustic wave or the bulk acoustic wave generally exhibits high Q characteristics, so that loss can be reduced.

Further, for example, in the filters 10 and 10A, the first frequency range includes either an uplink operation band of band 28B for 4G-LTE or an uplink operation band of band n28B for 5G-NR, and the second frequency range includes either an uplink operation band of band 28A for 4G-LTE or an uplink operation band of band n28A for 5G-NR.

Moreover, for example, the filters 10 and 10A further include a capacitor 17 connected parallel to at least one of the switches 15 and 16.

Accordingly, the withstand voltage performance of the switches 15 and 16 can be alleviated.

Further, the high frequency circuit 1 has the filter 10, the filter 20, and the switch circuit 45 having the common terminal, the first selection terminal, and the second selection terminal, and configured to switch connection and disconnection between the common terminal and the first selection terminal, and configured to switch connection and disconnection between the common terminal and the second selection terminal, in which the filters 10 and 20 are connected to the first selection terminal.

Accordingly, the filters 10 and 20 are connected to the common first selection terminal, so that the number of terminals of switch circuit 45 can be reduced and the size of the high frequency circuit 1 can be reduced. In addition, the filters 10 and 20 function as a duplexer that can simultaneously transmit the transmission signals and the received signals of bands A1 and A2.

Further, the communication device 4 includes the RFIC 3 that processes the high frequency signal, and the high frequency circuit 1 that transmits the high frequency signal between the RFIC 3 and the antenna 2.

Accordingly, the communication device 4 can implement the effect of the high frequency circuit 1.

Embodiment 2

In Embodiment 1, the filters 10 and 10A having a variable resonance band width of the parallel arm circuit have been described, but in the present embodiment, filters 70 and 70A having a variable resonance band width of the series arm circuit will be described.

2.1 Circuit Configuration of High Frequency Circuit

A high frequency circuit according to the present embodiment includes filters 70, 20, and 30, a switch circuit 45, a power amplifiers 41 and 43, a low noise amplifier 42, the antenna terminal 100, high frequency input terminals 110 and 130, and a high frequency output terminal 120. The high frequency circuit according to the present embodiment differs from the high frequency circuit 1 according to Embodiment 1 only in that the filter 10 is replaced with the filter 70.

Figure 13:
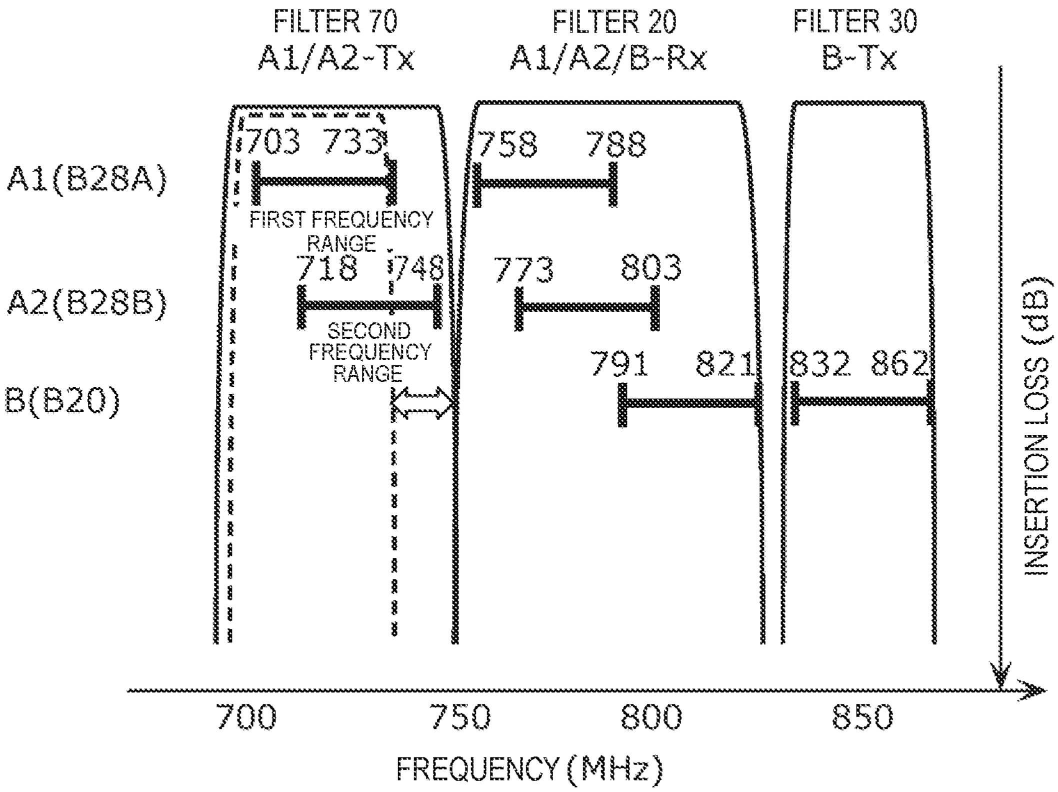
FIG. 13 is a diagram illustrating a relationship between a pass band and a band of each filter according to Embodiment 2.

FIG. 13 is a diagram illustrating a relationship between pass bands and bands of the filters 70, 20, and 30 according to Embodiment 2. The filter 70 varies the first pass band and the second pass band. The first pass band includes a first frequency range and a second frequency range on a high-frequency side of the first frequency range. The second pass band includes the first frequency range and is narrower than the first pass band. In this case, as illustrated in FIG. 13, the first frequency range includes an uplink operation band of band A1, and the second frequency range includes an uplink operation band of band A2. Accordingly, when the filter 70 has the first pass band, a transmission signal of a wideband including bands A1 and A2 can be transmitted, and when the filter 70 has the second pass band, attenuation of bands on the high-frequency side of the second pass band can be secured.

A pass band of the filter 70 is located on a high-frequency side of the pass band of the filter 20. In addition, a pass band of the filter 30 is located on a high-frequency side of the pass band of the filter 20.

The high frequency circuit according to the present embodiment may have the filter 70 and the switch circuit 45, and other circuit components are optional components of the high frequency circuit.

The first frequency range includes, for example, either an uplink operation band of band 28A for 4G-LTE or an uplink operation band of band n28A for 5G-NR. In addition, the second frequency range includes, for example, either an uplink operation band of band 28B for 4G-LTE or an uplink operation band of band n28B for 5G-NR. That is, in the present embodiment, band A2 is either band 28B for 4G-LTE or band n28B for 5G-NR, and band A1 is either band 28A for 4G-LTE or band n28A for 5G-NR.

2.2 Circuit Configuration and Switching Operation of Filter 70

Figure 14:
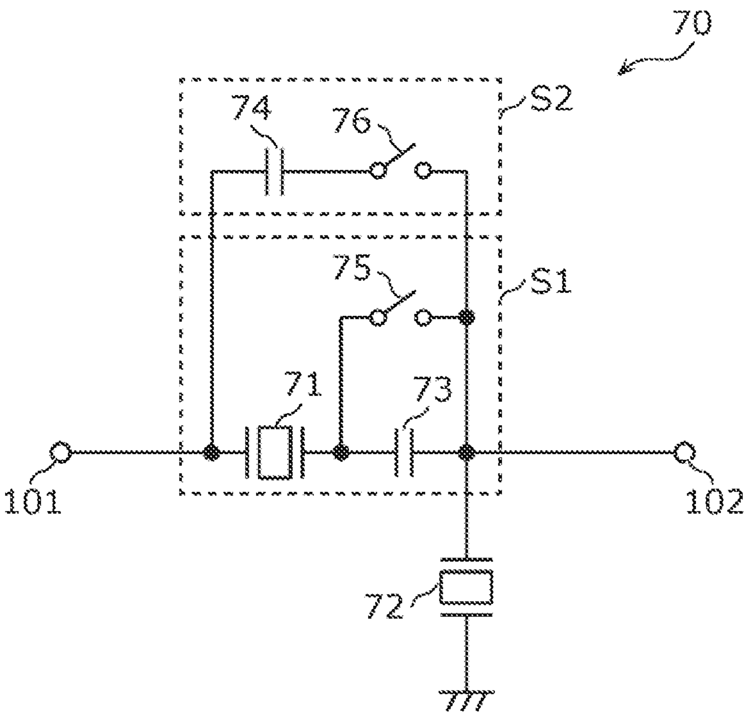
FIG. 14 is a circuit configuration diagram of the high frequency filter according to Embodiment 2.

Next, a circuit configuration of the filter 70 will be described. FIG. 14 is a circuit configuration diagram of the filter 70 according to Embodiment 2. As illustrated in FIG. 14, the filter 70 includes a series arm circuit S1, a frequency variable circuit S2, a parallel arm resonator 72, and terminals 101 and 102.

The terminal 101 is an example of a first terminal, and is an external connection terminal for inputting or outputting the transmission signal. The terminal 102 is an example of a second terminal, and is an external connection terminal for outputting or inputting the transmission signal.

The parallel arm resonator 72 is connected to a ground and a path for connecting the terminals 101 and 102, and is, for example, an acoustic wave resonator or an LC resonance circuit including an inductor and a capacitor.

The series arm circuit S1 is an example of a first series arm circuit, is connected between the terminal 101 and the terminal 102, and has a series arm resonator 71 and a second series arm circuit connected in series to each other.

The series arm resonator 71 is a resonator using a surface acoustic wave or a bulk acoustic wave. Accordingly, a size of the series arm resonator 71 can be reduced, so that a size and cost of the filter 70 can be reduced. In addition, the resonator using the surface acoustic wave or the bulk acoustic wave generally exhibits high Q characteristics, so that the cost can be reduced.

The second series arm circuit includes a capacitor 73 and a switch 75. The capacitor 73 is an example of a second capacitor, the switch 75 is an example of a second switch, and the capacitor 73 and the switch 75 are connected parallel to each other.

The filter 70 according to the present embodiment has the series arm resonator 71 connected to the terminal 101, and the second series arm circuit connected to the terminal 102, but the series arm resonator 71 may be connected to the terminal 102, and the second series arm circuit may be connected to the terminal 101.

The frequency variable circuit S2 includes a capacitor 74 and a switch 76, and is connected parallel to the series arm circuit S1. The capacitor 74 is an example of a first capacitor, the switch 76 is an example of a first switch, and the capacitor 74 and the switch 76 are connected in series to each other.

The filter 70 according to the present embodiment has the capacitor 74 connected to the terminal 101, and the switch 76 connected to the terminal 102, but the capacitor 74 may be connected to the terminal 102, and the switch 76 may be connected to the terminal 101.

Moreover, a third capacitor for alleviating the withstand voltage performance of the switch may be connected parallel to at least one of the switches 75 and 76.

Figure 15A:
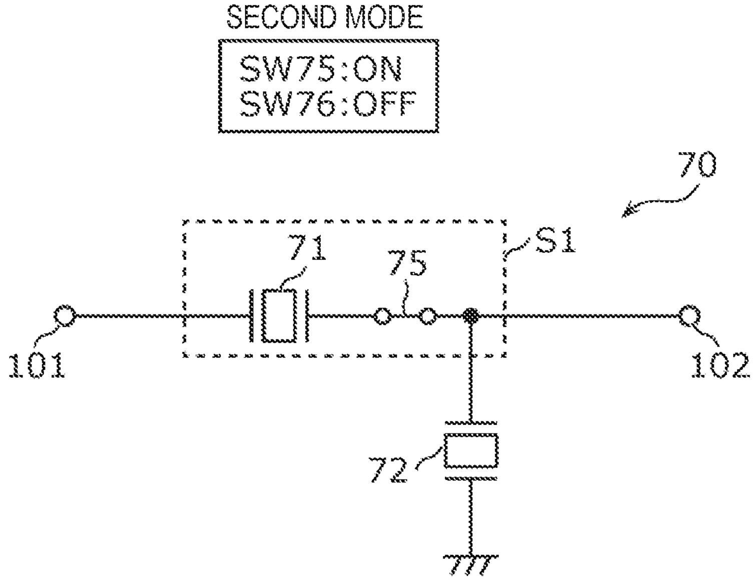
FIG. 15A is a circuit state diagram of the high frequency filter in a second mode according to Embodiment 2.
Figure 15B:
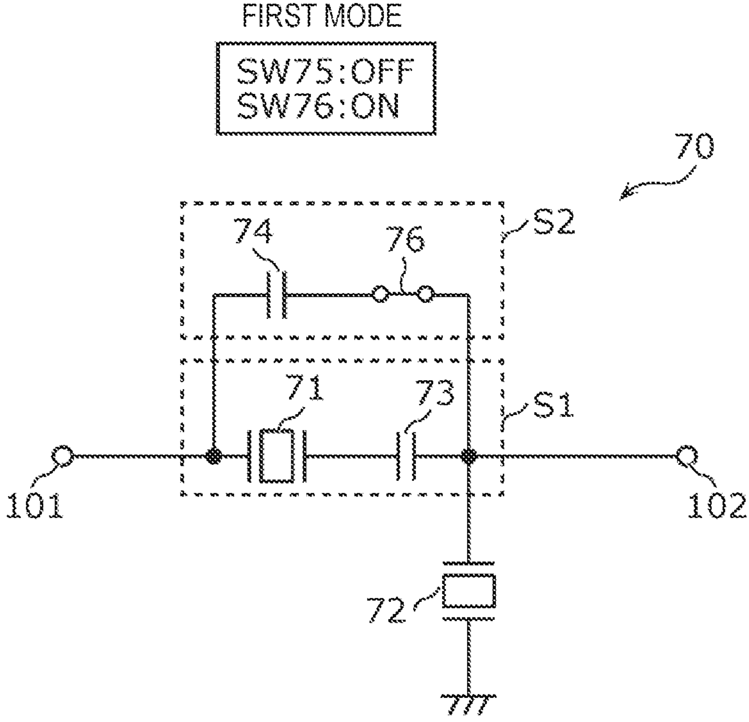
FIG. 15B is a circuit state diagram of the high frequency filter in a first mode according to Embodiment 2.

Next, a switching operation of the filter 70 will be described. FIG. 15A is a circuit state diagram of the filter 70 in a second mode according to Embodiment 2. In addition, FIG. 15B is a circuit state diagram of the filter 70 in a first mode according to Embodiment 2.

The filter 70 is configured to be switchable between a second mode in which the switch 75 is in a conductive state (ON) and the switch 76 is in a non-conductive state (OFF) and a first mode in which the switch 75 is in the non-conductive state (OFF) and the switch 76 is in the conductive state (ON).

As illustrated in FIG. 15A, in the second mode, the filter 70 is in a state in which the series arm circuit S1 including only the series arm resonator 71 is connected. In addition, as illustrated in FIG. 15B, in the first mode, the filter 70 is in a state in which the series arm circuit S1 to which the series arm resonator 71 and the capacitor 73 are connected in series is connected to the frequency variable circuit S2 to which only the capacitor 74 is connected.

According to the above switching operation, in the first mode, an anti-resonant frequency of the series arm circuit S1 is shifted to a low-frequency side, and a resonance band width of the series arm circuit S1 is narrowed as compared with the second mode. Thus, the filter 70 has a first pass band including the first frequency range (band A1) and the second frequency range (band A2) in the second mode, whereas the filter 70 has a second pass band that is narrower than the first pass band and includes the second frequency range (band A1) in the first mode.

Furthermore, in the first mode and the second mode, the switches 75 and 76 are exclusively operated as described above, so that a difference in impedance within the second pass band of the series arm circuit in the first mode and the second mode can be reduced. Therefore, it is possible to suppress deterioration in the insertion loss within the second pass band when the first mode and the second mode are switched. Hereinafter, it will be described that in the filter 70 according to the present embodiment, the difference in impedance within the second pass band of the series arm circuit between the modes can be reduced.

Figure 16A:
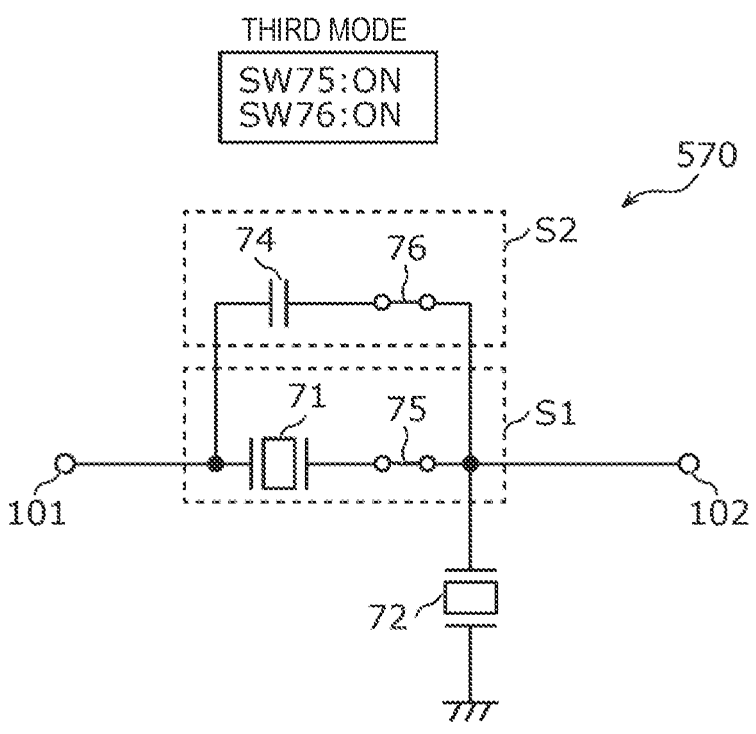
FIG. 16A is a circuit state diagram of a high frequency filter in a third mode according to Comparative Example 3.
Figure 16B:
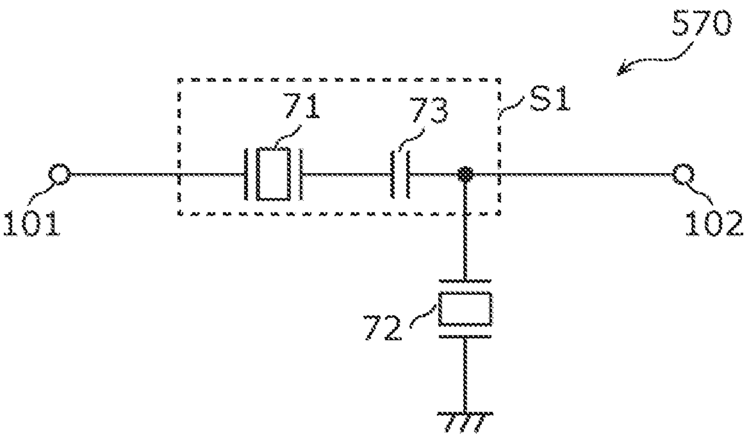
FIG. 16B is a circuit state diagram of the high frequency filter in a fourth mode according to Comparative Example 3.

FIG. 16A is a circuit state diagram of a filter 570 in a third mode according to Comparative Example 3. In addition, FIG. 16B is a circuit state diagram of the filter 570 in a fourth mode according to Comparative Example 3. The filter 570 according to Comparative Example 3 has the same configuration as the filter 70 according to Embodiment 2, but physical quantities (capacitance value, inductance value, and the like) of each circuit configuration are different, and the switching operations of the switches 75 and 76 are different.

The filter 570 according to Comparative Example 3 is configured to be switchable between a third mode in which the switch 75 is in the conductive state (ON) and the switch 76 is in the conductive state (ON) and a fourth mode in which the switch 75 is in the non-conductive state (OFF) and the switch 76 is in the non-conductive state (OFF).

As illustrated in FIG. 16A, in the third mode, the filter 570 is in a state in which the series arm circuit S1 including only the series arm resonator 71 is connected to the frequency variable circuit S2 including only the capacitor 74. In addition, as illustrated in FIG. 16B, in the fourth mode, the filter 570 is in a state in which only the series arm circuit S1 to which the series arm resonator 71 and the capacitor 73 are connected in series is connected.

In this case, comparison is made between a magnitude of combined impedance of the series arm circuit in each mode of the filter 70 according to the present embodiment and a magnitude of combined impedance of the series arm circuit in each mode of the filter 570 according to Comparative Example 3. In this case, a capacitance of the series arm resonator 71 is defined as C0, a capacitance of the capacitor 74 is defined as C1, and a capacitance of the capacitor 73 is defined as C2.

A combined capacitance CP2 of the series arm circuit in the second mode of the filter 70 according to the present embodiment is C0 (CP2=C0) with reference to FIG. 15A. In addition, a combined capacitance CP1 of the series arm circuit in the first mode of the filter 70 according to the present embodiment is a parallel combined capacitance of a series combined capacitance C02 (<C0) of C0 and C2 and C1 (CP1=C02+C1), with reference to FIG. 15B.

On the other hand, a combined capacitance CP3 of the series arm circuit in the third mode of the filter 570 according to Comparative Example 3 is a parallel combined capacitance of C0 and C1 (CP3=C0+C1), with reference to FIG. 16A. Further, a combined capacitance CP4 of the series arm circuit in the fourth mode of the filter 570 according to Comparative Example 3 is a series combined capacitance C02 (<C0) of C0 and C2 (CP4=C02), with reference to FIG. 16B.

From the above, a magnitude relationship of the combined capacitance of the series arm circuit is CP4<CP1 (CP2)<CP3. A magnitude relationship between CP1 and CP2 is determined by values of C0, C1, and C2. Thus, when the combined impedance in the first mode of the filter 70 according to the present embodiment is defined as Imp1, the combined impedance in the second mode of the filter 70 according to the present embodiment is defined as Imp2, the combined impedance in the third mode of the filter 570 according to Comparative Example 3 is defined as Imp3, and the combined impedance in the fourth mode of the filter 570 according to Comparative Example 3 is defined as Imp4, the magnitude relationship of the combined impedance of the series arm circuit is Imp3<Imp1 (Imp2)<Imp4.

That is, fluctuation of the impedance (=|Imp1−Imp2|) in the second pass band between the first mode and the second mode of the filter 70 according to the present embodiment is smaller than fluctuation of the impedance in the second pass band (=|Imp3−Imp4|) between the third mode and the fourth mode of the filter 570 according to Comparative Example 3.

According to the filter 70 according to the present embodiment, the fluctuation of the impedance in the second pass band between the first mode and the second mode can be suppressed, so that the insertion loss in the second pass band and the deterioration in a voltage standing wave ratio (VSWR) can be suppressed.

Further, according to the filter 70 according to the present embodiment, the transmission signal of band A1 can pass with low loss in the first mode, and the transmission signal of a plurality of bands of band A1 and band A2 can pass with low loss in the second mode, so that the band of the filter 70 having a variable pass band can be widened.

The capacitance C1 of the capacitor 74 and the capacitance C2 of the capacitor 73 constituting the filter 70 according to the present embodiment can be measured using an impedance analyzer.

2.3 Circuit Configuration and Switching Operation of Filter 70A according to Example 2

Figure 17A:
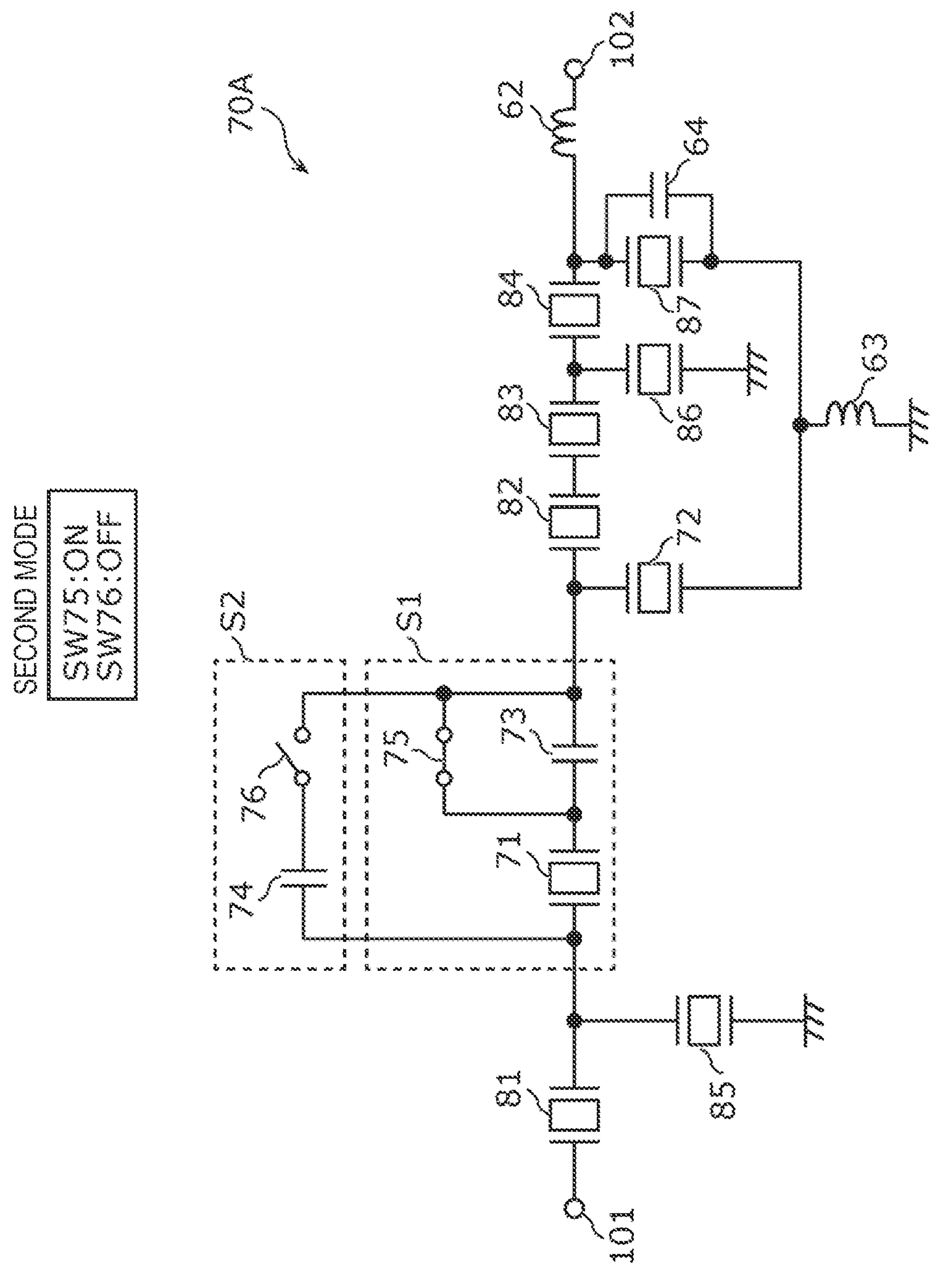
FIG. 17A is a circuit state diagram of a high frequency filter in a second mode according to Example 2.
Figure 17B:
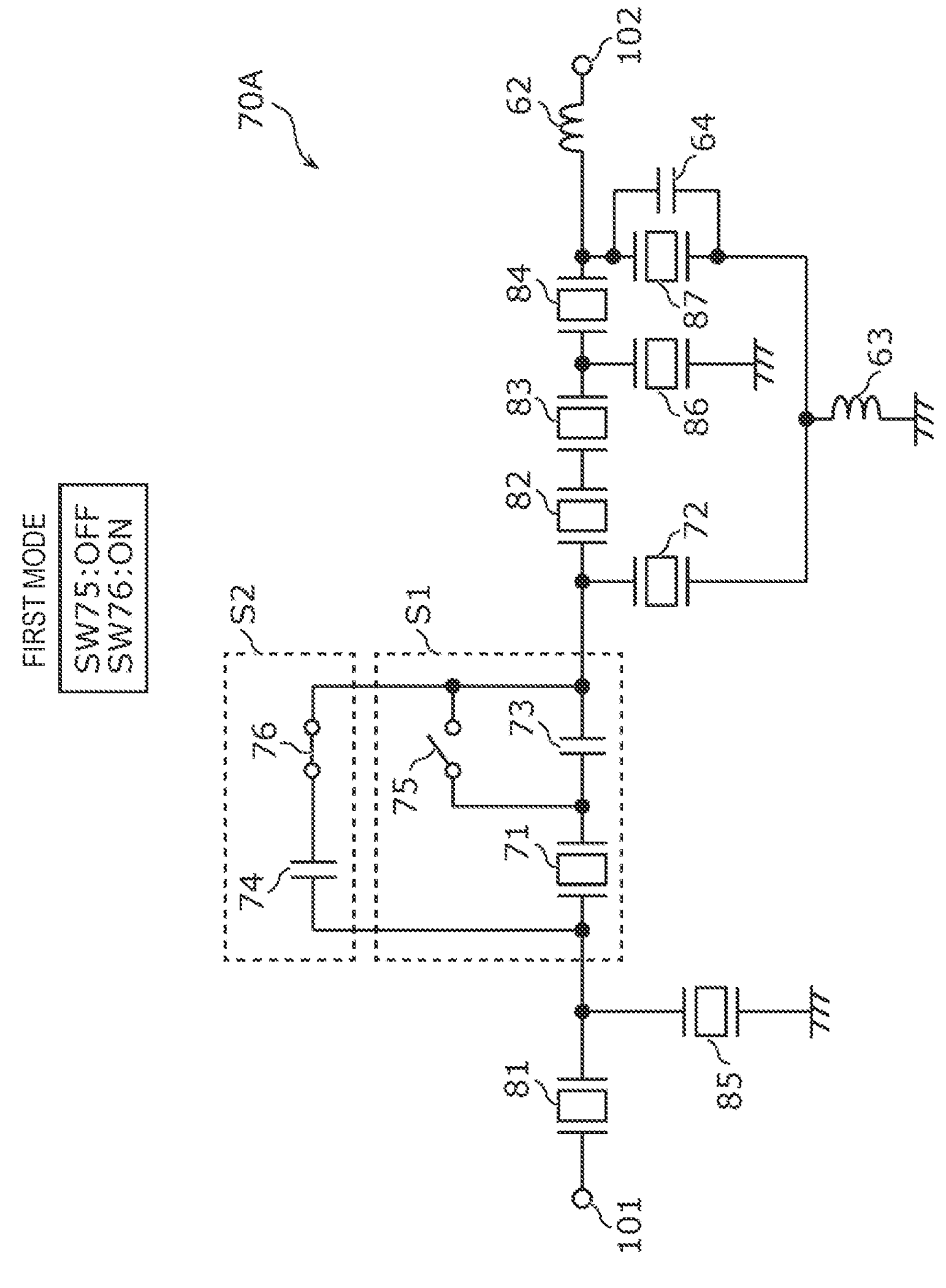
FIG. 17B is a circuit state diagram of the high frequency filter in a first mode according to Example 2.

Next, a circuit configuration of a filter 70A according to Example 2 will be described. FIG. 17A is a circuit state diagram of the filter 70A in a second mode according to Example 2. In addition, FIG. 17B is a circuit state diagram of the filter 70A in a first mode according to Example 2. As illustrated in FIGS. 17A and 17B, the filter 70A includes series arm resonators 81, 82, 83, and 84, parallel arm resonators 85, 86, and 87, inductors 62 and 63, and a capacitor 64, in addition to circuit components of the filter 70 according to Embodiment 2. As compared with the filter 70 according to Embodiment 2, to the filter 70A according to Example 2, the series arm resonators 81 to 84, the parallel arm resonators 85 to 87, the inductors 62 and 63, and the capacitor 64 are added, so that the attenuation near the pass band is optimized. Hereinafter, in the filter 70A according to Example 2, the description of the same configuration as that of the filter 70 according to Embodiment 2 is omitted, and the description will focus on the different configurations.

The series arm resonator 81 is connected between the terminal 101 and the series arm resonator 71. The series arm resonators 82 to 84 are connected in series to a series arm path for connecting the series arm resonator 71 and the terminal 102. The parallel arm resonator 85 is connected between a path for connecting the terminal 101 and the series arm resonator 71 and a ground. The parallel arm resonator 86 is connected between a path for connecting the series arm resonators 83 and 84 and a ground. The parallel arm resonator 87 is connected between a path for connecting the series arm resonator 84 and the terminal 102 and a ground. The inductor 62 is connected between the terminal 102 and the series arm resonator 84. The inductor 63 is connected between the parallel arm resonators 72 and 87 and a ground. The capacitor 64 is connected parallel to the parallel arm resonator 87. Table 2 shows an example of a capacitance value and a resistance value of the component of the filter 70A according to Example 2.

TABLE 2

| | Filter 70A |
|---|---|
| Series arm resonator 71 C0 (pF) | 1.91 |
| Capacitor 74 C1 (pF) | 1.5 |
| Capacitor 73 C2 (pF) | 15 |
| Switches 75&76 Off capacity (pF) | 0.3 |
| Switches 75&76 On resistance (Ω) | 1.0 |

The filter 70A is configured to be switchable between a second mode (see FIG. 17A) in which the switch 75 is in the conductive state (ON) and the switch 76 is in the non-conductive state (OFF) and a first mode (see FIG. 17B) in which the switch 75 is in the non-conductive state (OFF) and the switch 76 is in the conductive state (ON).

Figure 18:
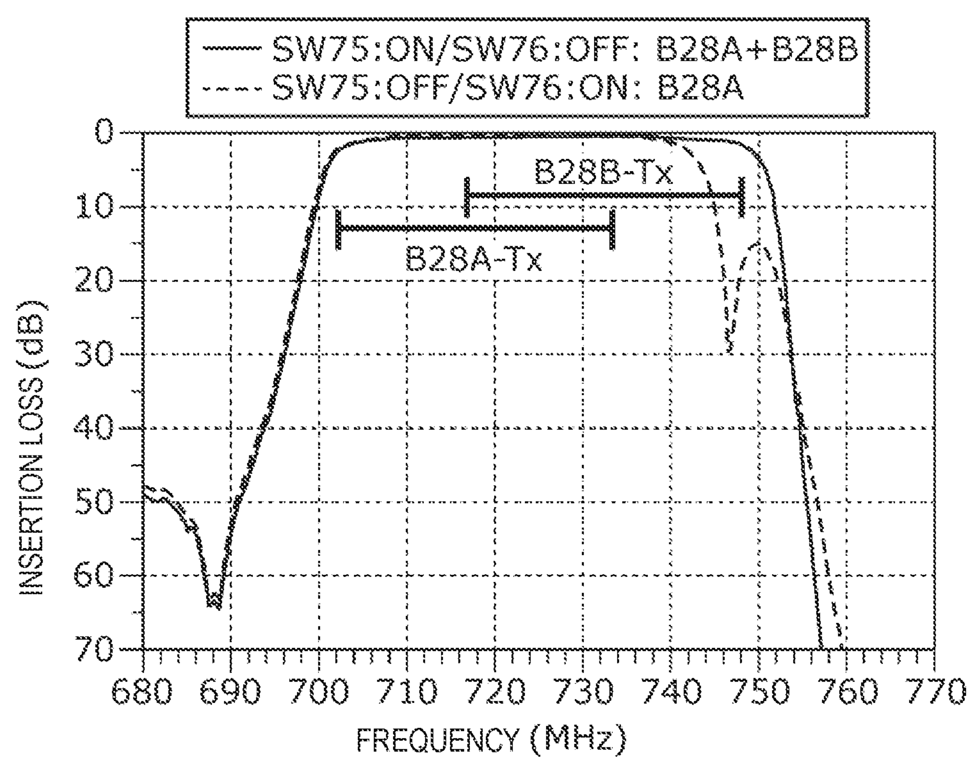
FIG. 18 is a graph showing bandpass characteristics of the high frequency filter according to Example 2.
Figure 19A:
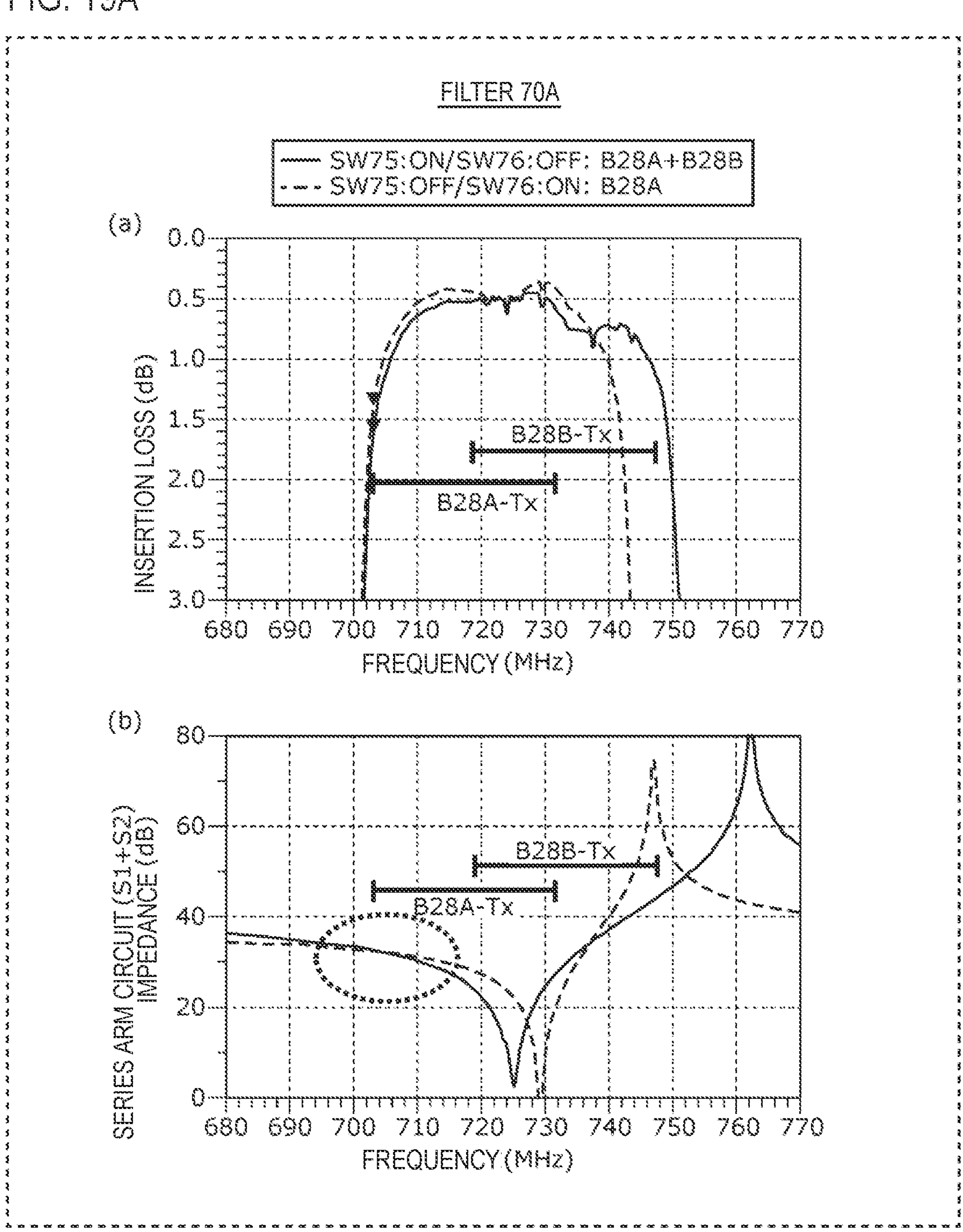
FIG. 19A is a graph showing bandpass characteristics and impedance characteristics of the high frequency filter according to Example 2.
Figure 19B:
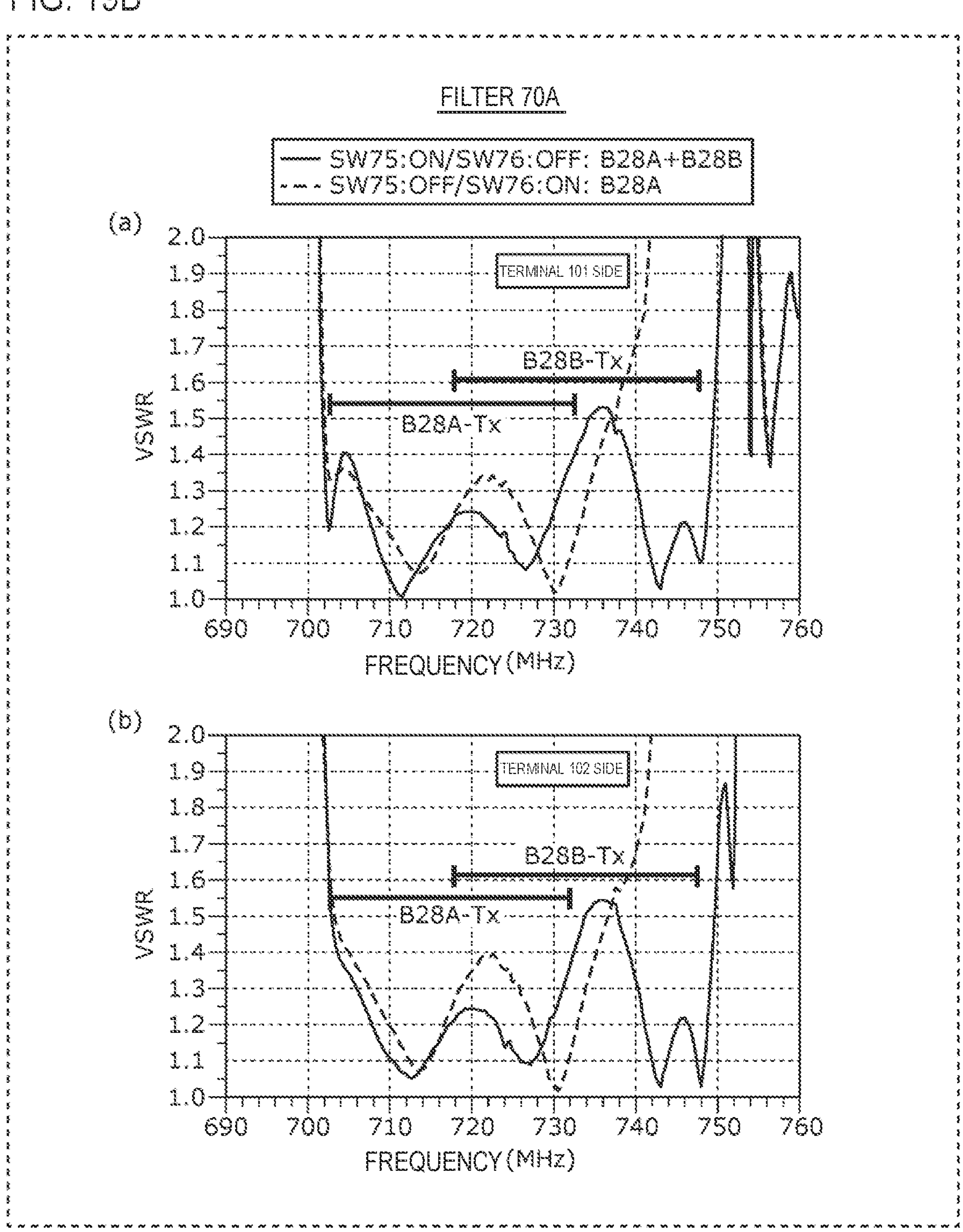
FIG. 19B is a graph showing a voltage standing wave ratio of the high frequency filter according to Example 2.

FIG. 18 is a graph showing bandpass characteristics of the filter 70A according to Example 2. In addition, FIG. 19A is a graph showing the bandpass characteristics and the impedance characteristics of the filter 70A according to Example 2. In addition, FIG. 19B is a graph showing a VSWR of the filter 70A according to Example 2.

As illustrated in FIG. 17A, in the second mode, the filter 70A is in a state in which only the series arm circuit S1 including only the series arm resonator 71 is connected. In addition, as illustrated in FIG. 17B, in the first mode, the filter 70A is in a state in which the series arm circuit S1 to which the series arm resonator 71 and the capacitor 73 are connected in series is connected to the frequency variable circuit S2 to which only the capacitor 74 is connected.

According to the above switching operation, as illustrated in (b) of FIG. 19A, in the first mode, an anti-resonant frequency of the series arm circuit S1 is shifted to a low-frequency side, and a resonance band width of the series arm circuit S1 is narrowed as compared with the second mode. Thus, as illustrated in FIG. 18 and (a) of FIG. 19A, the filter 70A has a first pass band including the first frequency range (band A1 (B28A-Tx)) and the second frequency range (band A2 (B28B-Tx)) in the second mode, whereas the filter 70A has a second pass band that is narrower than the first pass band and includes the first frequency range (band A1 (B28A-Tx)) in the first mode.

Furthermore, in the first mode and the second mode, the switches 75 and 76 are exclusively operated as described above, so that a difference in impedance within the second pass band of the series arm circuit in the first mode and the second mode can be reduced (a black broken line portion of (b) of FIG. 19A). Accordingly, deterioration in reflection characteristics of the filter 70A can be suppressed by mode switching. As illustrated in FIG. 19B, a VSWR in the second pass band on a terminal 101 side ((a) of FIG. 19B) and a terminal 102 side ((b) of FIG. 19B) has an excellent value (1.6 or less) in both the first mode and the second mode. Accordingly, as illustrated in (a) of FIG. 19A, deterioration in the insertion loss within a low-frequency side region of the second pass band can be suppressed.

As described above, according to the filter 70A according to the present example, the fluctuation of the impedance in the second pass band between the first mode and the second mode can be suppressed, so that the deterioration in the insertion loss in the second pass band when the mode is changed can be suppressed. Further, the transmission signal of band A1 can pass with low loss in the first mode, and the transmission signal of a plurality of bands of band A1 and band A2 can pass with low loss in the second mode, so that the band of the filter 70A having a variable pass band can be widened.

2.4 Capacitance Value Range of Filters 70 and 70A

Next, an optimum capacitance value range of the series arm resonator 71 and the capacitors 73 and 74 constituting the filter 70 according to Embodiment 2 and the filter 70A according to Example 2 will be described.

Figure 20:
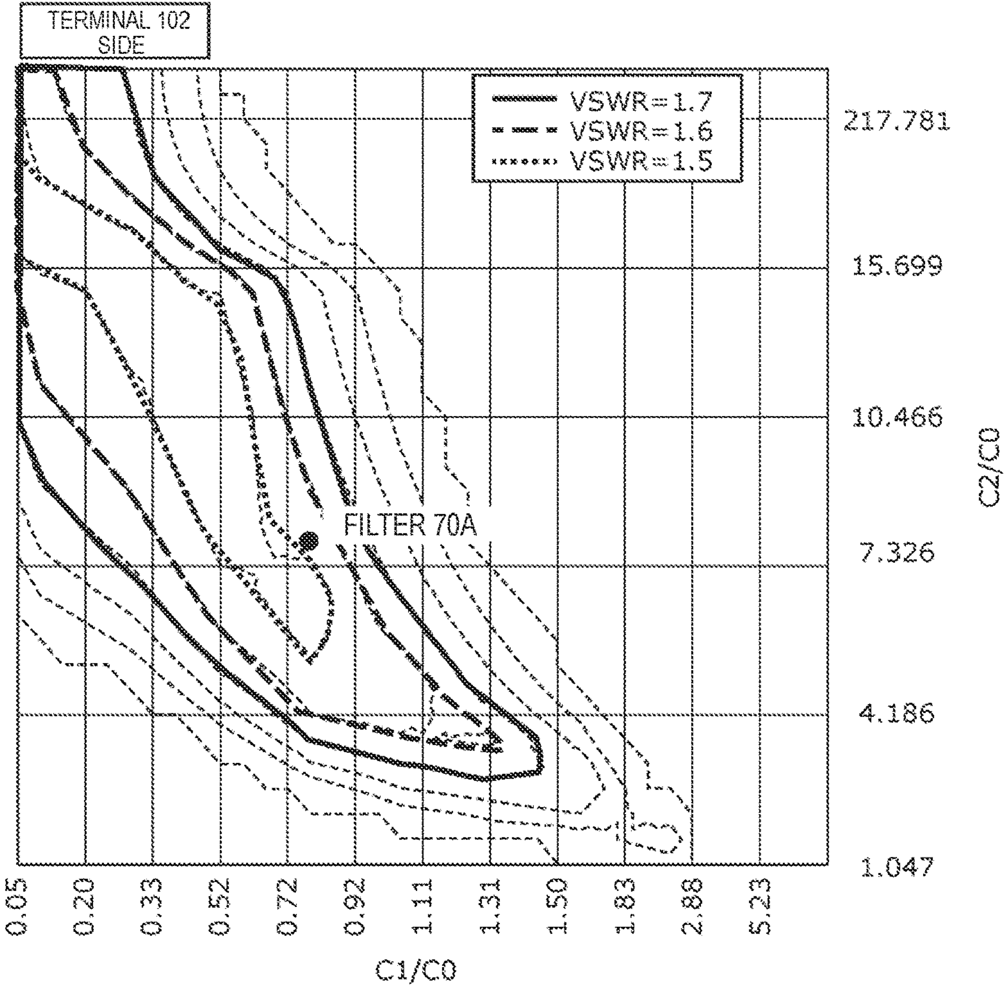
FIG. 20 is a capacitance correlation diagram of a first capacitor and a second capacitor of the high frequency filter according to Embodiment 2.

FIG. 20 is a capacitance correlation diagram of the capacitors 73 and 74 of the filter 70 according to Embodiment 2 and the filter 70A according to Example 2.

The impedance of the series arm circuit is determined by relative values of the capacitances C1 and C2 added to the capacitance C0 of the series arm resonator 71. In FIG. 20, a capacitance value of the series arm resonator 71 is defined as C0, a capacitance value of the capacitor 74 is defined as C1, a capacitance value of the capacitor 73 is defined as C2, an X-axis is defined as a normalized capacitance C1/C0 of the capacitor 74, and a Y-axis is defined as a normalized capacitance C2/C0 of the capacitor 73, to calculate a VSWR on the terminal 102 side. From FIG. 20, it can be understood that an excellent VSWR can be obtained by limiting the normalized capacitance C1/C0 of the capacitor 74 and the normalized capacitance C2/C0 of the capacitor 73 to a specific range.

First, when the VSWR is set to 1.7 or less, a matching loss in the pass band can be 0.3 dB or less. From FIG. 20, the following Equation 13 is satisfied, so that the VSWR can be set to 1.7 or less.

$$5.00\times10^{-2}\le(C1/C0)\le1.44,\ \text{and}\ 2.62\le C2/C0,\ \text{and}\ F1(C1/C0)\le C2/C0\le F2(C1/C0),$$
$$F1(C1/C0)=5.23\times(C1/C0-0.15)^{-1.72},$$
$$F2(C1/C0)=-2.98\times(C1/C0)^3+1.19\times10^1\times(C1/C0)^2-1.68\times10^1\times(C1/C0)+1.11\times10^1 \quad \text{(Equation 13)}$$

VSWR can be set to 1.6 or less. Accordingly, the matching loss in the pass band can be 0.24 dB or less. From FIG. 20, the following Equation 14 is satisfied, so that the VSWR can be set to 1.6 or less.

$$5.00\times10^{-2}\le(C1/C0)\le1.31,\ \text{and}\ 3.66\le C2/C0,\ \text{and}\ F1(C1/C0)\le C2/C0\le F2(C1/C0),$$
$$F1(C1/C0)=5.88\times(C1/C0)^{-1.68},$$
$$F2(C1/C0)=-3.43\times(C1/C0)^3+1.52\times10^1\times(C1/C0)^2-2.16\times10^1\times(C1/C0)+1.36\times10^1 \quad \text{(Equation 14)}$$

Moreover, the VSWR can be set to 1.5 or less. Accordingly, the matching loss in the pass band can be 0.18 dB or less. From FIG. 20, the following Equation 15 is satisfied, so that the VSWR can be set to 1.5 or less.

$$5.00\times10^{-2}\le(C1/C0)\le8.50\times10^{-1},\ \text{and}\ 5.23\le C2/C0,\ \text{and}\ F1(C1/C0)\le C2/C0\le F2(C1/C0), \quad \text{(Equation 15)}$$

-continued $$F1(C1/C0)=-4.66\times(C1/C0)^3+8.86\times10^1\times(C1/C0)^2-6.26\times10^1\times(C1/C0)+2.27\times10^1,$$
$$F2(C1/C0)=4.68\times(C1/C0)^{-1.47}$$

Figure 21:
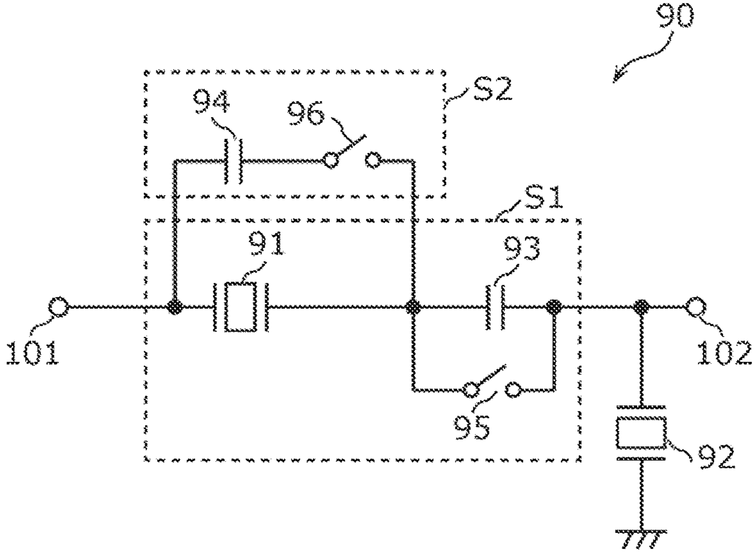
FIG. 21 is a circuit configuration diagram of a high frequency filter according to a modification example of Embodiment 2.

2.5 Circuit Configuration and Switching Operation of Filter 90 according to Modification Example Next, a circuit configuration of a filter 90 according to a modification example of Embodiment 2 will be described. FIG. 21 is a circuit configuration diagram of the filter 90 according to the modification example of Embodiment 2. As illustrated in FIG. 21, the filter 90 includes a series arm circuit S1, a frequency variable circuit S2, a parallel arm resonator 92, and terminals 101 and 102. The filter 90 according to the present modification example is different in a configuration of the series arm circuit S1, as compared with the filter 70 according to Embodiment 2. Hereinafter, in the filter 90 according to the present modification example, the description of the same configuration as that of the filter 70 according to Embodiment 2 is omitted, and the description will focus on the different configurations.

The parallel arm resonator 92 is connected to a ground and a path for connecting the terminals 101 and 102, and is, for example, an acoustic wave resonator or an LC resonance circuit including an inductor and a capacitor.

The series arm circuit S1 is an example of a first series arm circuit, is connected between the terminal 101 and the terminal 102, and has a series arm resonator 91 and a second series arm circuit connected in series to each other.

The series arm resonator 91 is a resonator using a surface acoustic wave or a bulk acoustic wave. Accordingly, a size of the series arm resonator 91 can be reduced, so that a size and cost of the filter 90 can be reduced. In addition, the resonator using the surface acoustic wave or the bulk acoustic wave generally exhibits high Q characteristics, so that the cost can be reduced.

The second series arm circuit includes a capacitor 93 and a switch 95. The capacitor 93 is an example of a second capacitor, the switch 95 is an example of a second switch, and the capacitor 93 and the switch 95 are connected parallel to each other.

The filter 90 according to the present modification example has the series arm resonator 91 connected to the terminal 101, and the second series arm circuit connected to the terminal 102, but the series arm resonator 91 may be connected to the terminal 102, and the second series arm circuit may be connected to the terminal 101.

The frequency variable circuit S2 includes a capacitor 94 and a switch 96, and is connected parallel to the series arm resonator 91. The capacitor 94 is an example of a first capacitor, the switch 96 is an example of a first switch, and the capacitor 94 and the switch 96 are connected in series to each other.

The filter 90 according to the present modification example has the capacitor 94 connected to the terminal 101, and the switch 96 connected to the capacitor 93, but the capacitor 94 may be connected to the capacitor 93, and the switch 96 may be connected to the terminal 101.

Moreover, a third capacitor for alleviating the withstand voltage performance of the switch may be connected parallel to at least one of the switches 95 and 96.

Figure 22A:
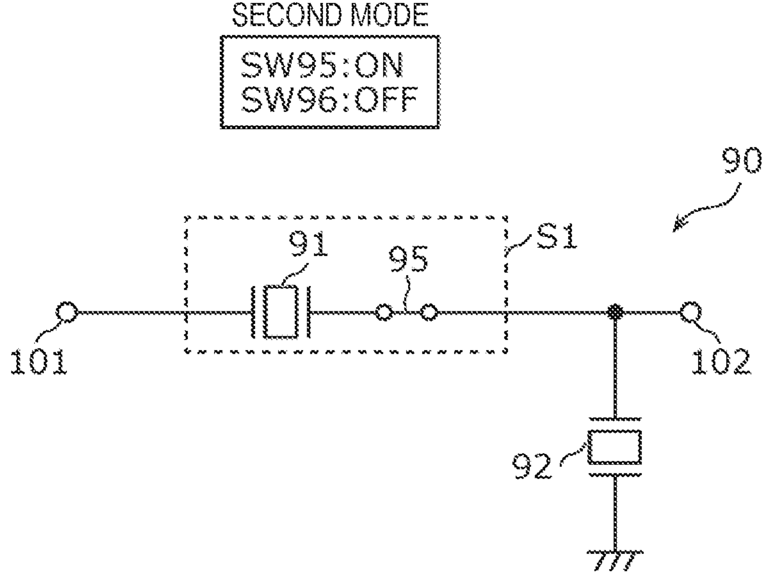
FIG. 22A is a circuit state diagram of the high frequency filter in a second mode according to the modification example of Embodiment 2.
Figure 22B:
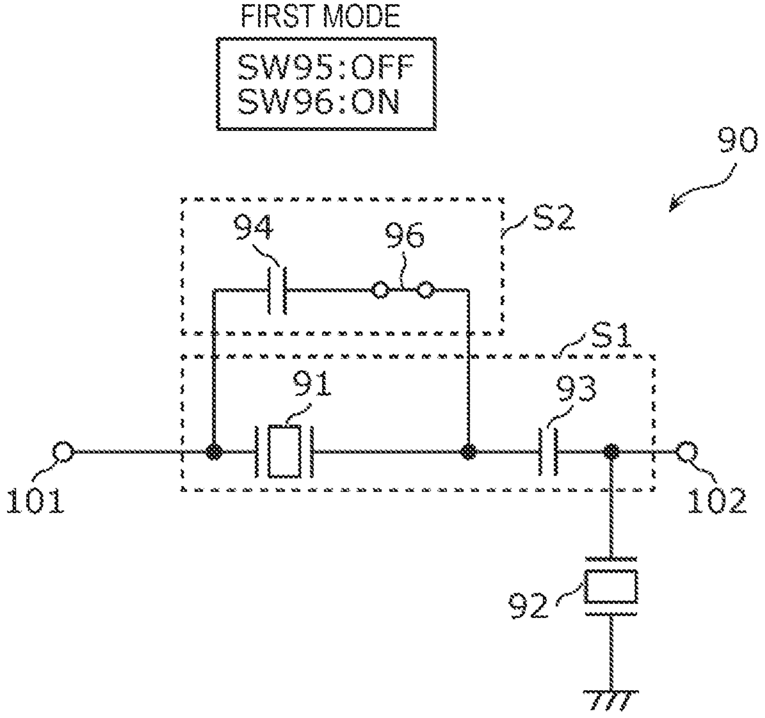
FIG. 22B is a circuit state diagram of the high frequency filter in a first mode according to the modification example of Embodiment 2.

Next, a switching operation of the filter 90 will be described. FIG. 22A is a circuit state diagram of the filter 90 in a second mode according to the modification example of Embodiment 2. In addition, FIG. 22B is a circuit state diagram of the filter 90 in a first mode according to the modification example of Embodiment 2.

The filter 90 is configured to be switchable between a second mode in which the switch 95 is in a conductive state (ON) and the switch 96 is in a non-conductive state (OFF) and a first mode in which the switch 95 is in the non-conductive state (OFF) and the switch 96 is in the conductive state (ON).

As illustrated in FIG. 22A, in the second mode, the filter 90 is in a state in which the series arm circuit S1 including only the series arm resonator 91 is connected. In addition, as illustrated in FIG. 22B, in the first mode, the filter 90 is in a state in which the series arm circuit S1 to which the series arm resonator 91 and the capacitor 93 are connected in series is connected to the frequency variable circuit S2 to which only the capacitor 94 is connected.

According to the above switching operation, in the first mode, an anti-resonant frequency of the series arm circuit S1 is shifted to a low-frequency side, and a resonance band width of the series arm circuit S1 is narrowed as compared with the second mode. Thus, the filter 90 has a first pass band including the first frequency range (band A1) and the second frequency range (band A2) in the second mode, whereas the filter 90 has a second pass band that is narrower than the first pass band and includes the second frequency range (band A1) in the first mode.

Furthermore, in the first mode and the second mode, the switches 95 and 96 are exclusively operated as described above, so that a difference in impedance within the second pass band of the series arm circuit in the first mode and the second mode can be reduced. Therefore, it is possible to suppress deterioration in the insertion loss within the second pass band when the first mode and the second mode are switched. Hereinafter, it will be described that in the filter 90 according to the present modification example, the difference in impedance within the second pass band of the series arm circuit between the modes can be reduced.

Figure 23A:
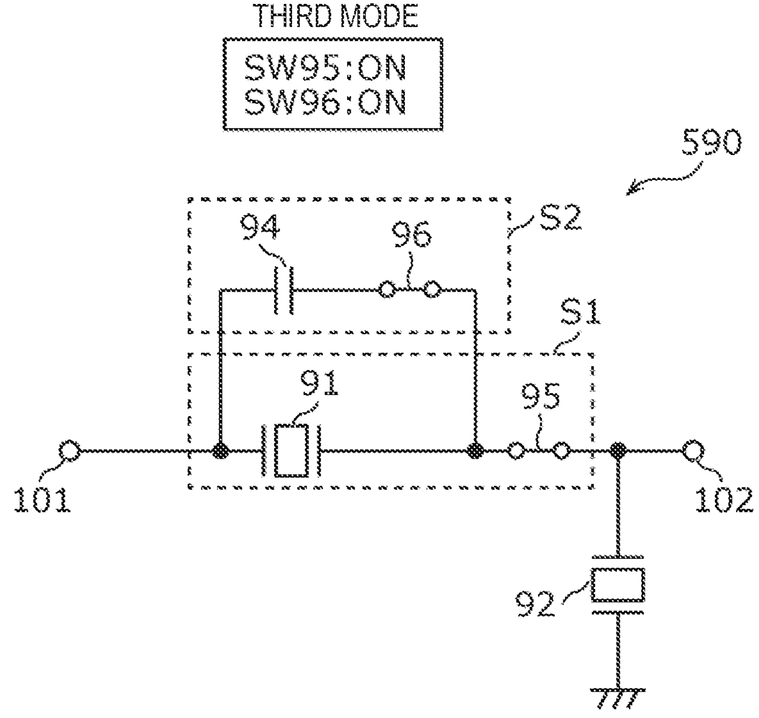
FIG. 23A is a circuit state diagram of a high frequency filter in a third mode according to Comparative Example 4.
Figure 23B:
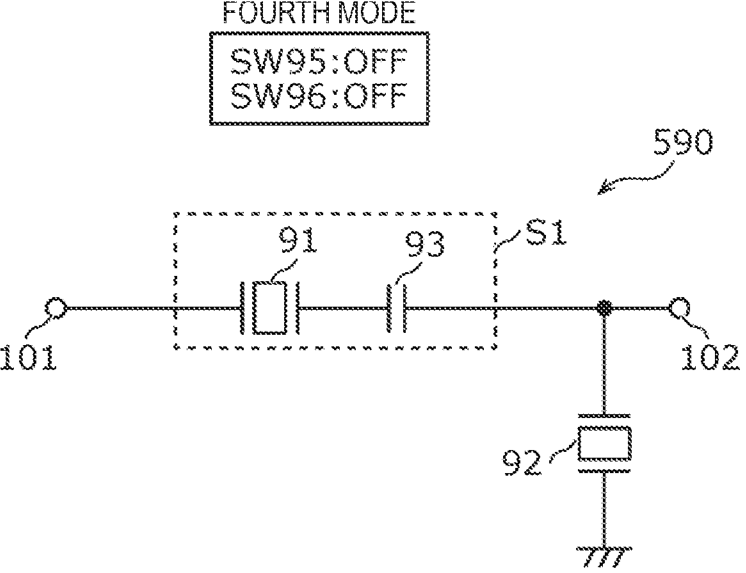
FIG. 23B is a circuit state diagram of the high frequency filter in a fourth mode according to Comparative Example 4.

FIG. 23A is a circuit state diagram of a filter 590 in a third mode according to Comparative Example 4. In addition, FIG. 23B is a circuit state diagram of the filter 590 in a fourth mode according to Comparative Example 4. The filter 590 according to Comparative Example 4 has the same configuration as the filter 90 according to the modification example, but physical quantities (capacitance value, inductance value, and the like) of each circuit configuration are different, and the switching operations of the switches 95 and 96 are different.

The filter 590 according to Comparative Example 4 is configured to be switchable between a third mode in which the switch 95 is in the conductive state (ON) and the switch 96 is in the conductive state (ON) and a fourth mode in which the switch 95 is in the non-conductive state (OFF) and the switch 96 is in the non-conductive state (OFF).

As illustrated in FIG. 23A, in the third mode, the filter 590 is in a state in which the series arm circuit S1 including only the series arm resonator 91 is connected to the frequency variable circuit S2 including only the capacitor 94. In addition, in the fourth mode, the filter 590 is in a state in which only the series arm circuit S1 to which the series arm resonator 91 and the capacitor 93 are connected in series is connected.

In this case, comparison is made between a magnitude of combined impedance of the series arm circuit in each mode of the filter 90 according to the present modification example and a magnitude of combined impedance of the series arm circuit in each mode of the filter 590 according to Comparative Example 4. In this case, a capacitance of the series arm resonator 91 is defined as C0, a capacitance of the capacitor 94 is defined as C1, and a capacitance of the capacitor 93 is defined as C2.

A combined capacitance CP2 of the series arm circuit in the second mode of the filter 90 according to the present modification example is C0 (CP2=C0) with reference to FIG. 22A. In addition, a combined capacitance CP1 of the series arm circuit in the first mode of the filter 90 according to the present modification example is a parallel combined capacitance of a series combined capacitance of a parallel combined capacitance (C0+C1) of C0 and C1 and C2 (described as CP1=C(0+1)2), with reference to FIG. 22B.

On the other hand, a combined capacitance CP3 of the series arm circuit in the third mode of the filter 590 according to Comparative Example 4 is a parallel combined capacitance of C0 and C1 (CP3=C0+C1), with reference to FIG. 23A. Further, a combined capacitance CP4 of the series arm circuit in the fourth mode of the filter 590 according to Comparative Example 4 is a series combined capacitance C02 (<C0) of C0 and C2 (CP4=C02), with reference to FIG. 23B.

From the above, a magnitude relationship of the combined capacitance of the series arm circuit is CP4<CP1 (CP2)<CP3. A magnitude relationship between CP1 and CP2 is determined by values of C0, C1, and C2. Thus, when the combined impedance in the first mode of the filter 90 according to the present modification example is defined as Imp1, the combined impedance in the second mode of the filter 90 according to the present modification example is defined as Imp2, the combined impedance in the third mode of the filter 590 according to Comparative Example 4 is defined as Imp3, and the combined impedance in the fourth mode of the filter 590 according to Comparative Example 4 is defined as Imp4, the magnitude relationship of the combined impedance of the series arm circuit is Imp3<Imp1 (Imp2)<Imp4.

That is, fluctuation of the impedance (=|Imp1−Imp2|) in the second pass band between the first mode and the second mode of the filter 90 according to the present modification example is smaller than fluctuation of the impedance in the second pass band (=|Imp3−Imp4|) between the third mode and the fourth mode of the filter 590 according to Comparative Example 4.

According to the filter 90 according to the present modification example, the fluctuation of the impedance in the second pass band between the first mode and the second mode can be suppressed, so that the insertion loss in the second pass band and the deterioration in a voltage standing wave ratio (VSWR) when the mode is changed can be suppressed.

Further, according to the filter 90 according to the present modification example, the transmission signal of band A1 can pass with low loss in the first mode, and the transmission signal of a plurality of bands of band A1 and band A2 can pass with low loss in the second mode, so that the band of the filter 90 having a variable pass band can be widened.

The capacitance C1 of the capacitor 94 and the capacitance C2 of the capacitor 93 constituting the filter 90 according to the present modification example can be measured using an impedance analyzer.

2.6 Circuit Configuration and Switching Operation of Filter 90A according to Example 3

Figure 24A:
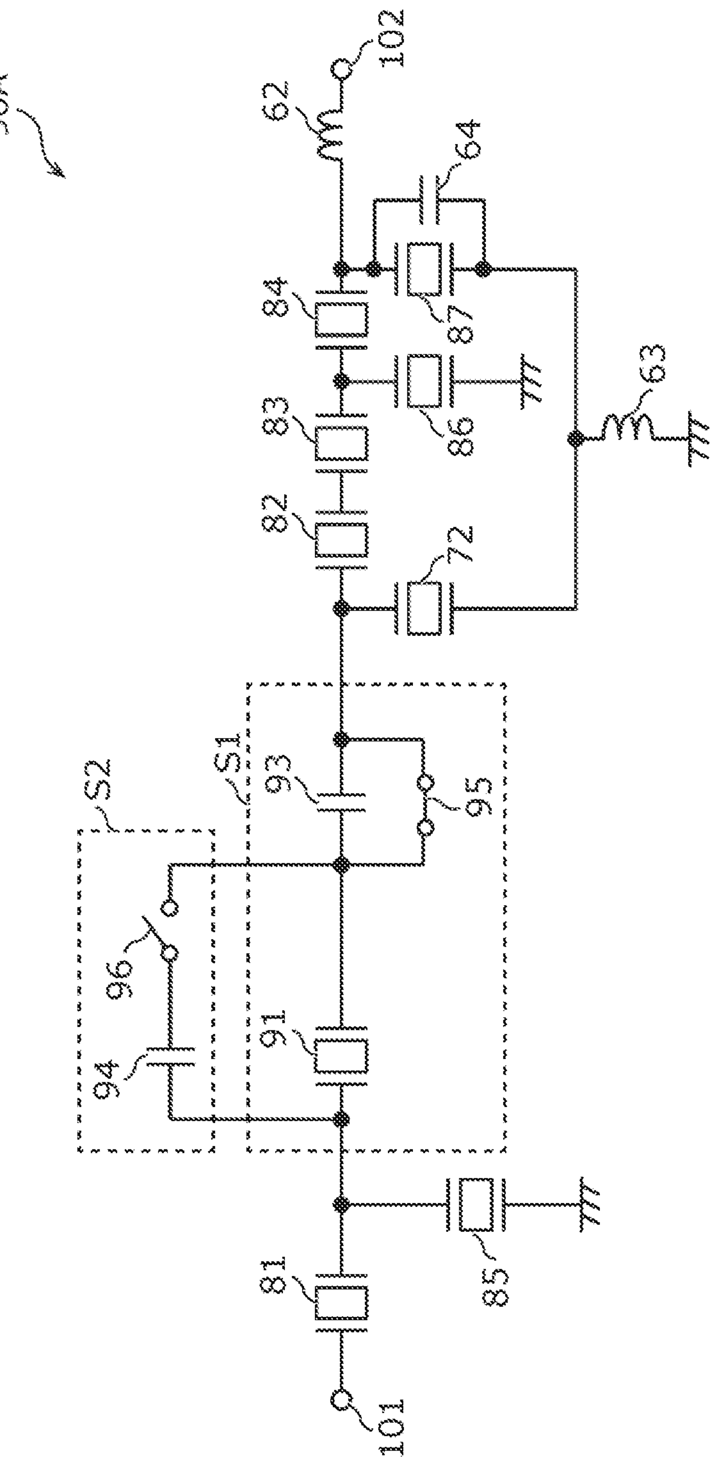
FIG. 24A is a circuit state diagram of a high frequency filter in a second mode according to Example 3.
Figure 24B:
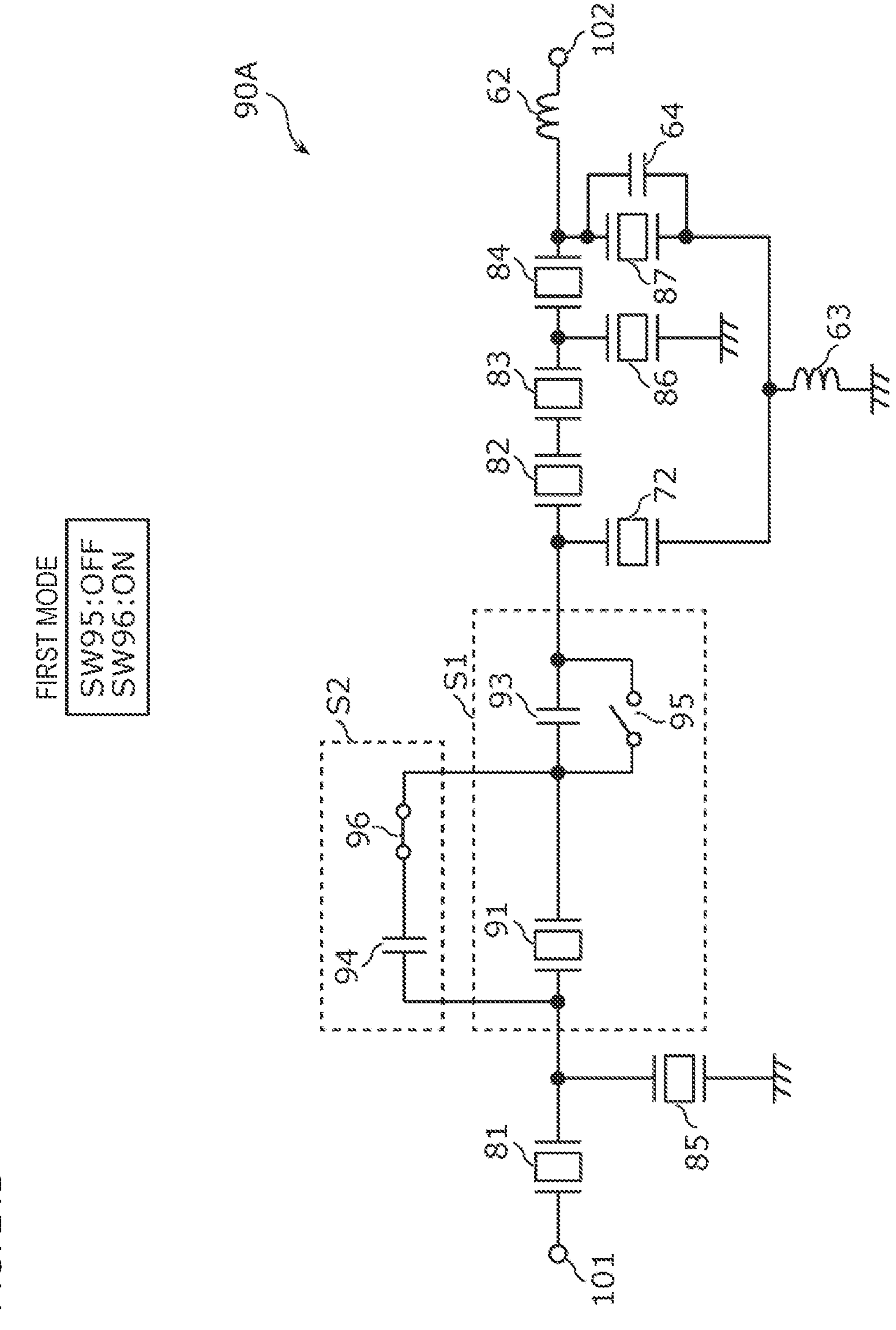
FIG. 24B is a circuit state diagram of the high frequency filter in a first mode according to Example 3.

Next, a circuit configuration of a filter 90A according to Example 3 will be described. FIG. 24A is a circuit state diagram of the filter 90A in a second mode according to Example 3. In addition, FIG. 24B is a circuit state diagram of the filter 90A in a first mode according to Example 3. As illustrated in FIGS. 24A and 24B, the filter 90A includes series arm resonators 81, 82, 83, and 84, parallel arm resonators 85, 86, and 87, inductors 62 and 63, and a capacitor 64, in addition to circuit components of the filter 90 according to the modification example of Embodiment 2. As compared with the filter 90 according to the modification example of Embodiment 2, to the filter 90A according to Example 3, the series arm resonators 81 to 84, the parallel arm resonators 85 to 87, the inductors 62 and 63, and the capacitor 64 are added, so that the attenuation near the pass band is optimized. The series arm resonators 81 to 84, the parallel arm resonators 85 to 87, the inductors 62 and 63, and the capacitor 64 have the same connection configuration as the series arm resonators 81 to 84, the parallel arm resonators 85 to 87, the inductors 62 and 63, and the capacitor 64 of the filter 70A according to Example 2. Table 3 shows an example of a capacitance value and a resistance value of the component of the filter 90A according to Example 3.

TABLE 3

| | Filter 90A |
|---|---|
| Series arm resonator 91 C0 (pF) | 1.91 |
| Capacitor 94 C1 (pF) | 1.5 |
| Capacitor 93 C2 (pF) | 18 |
| Switches 95&96 Off capacity (pF) | 0.3 |
| Switches 95&96 On resistance (Ω) | 1.0 |

The filter 90A is configured to be switchable between a second mode (see FIG. 24A) in which the switch 95 is in the conductive state (ON) and the switch 96 is in the non-conductive state (OFF) and a first mode (see FIG. 24B) in which the switch 95 is in the non-conductive state (OFF) and the switch 96 is in the conductive state (ON).

Figure 25:
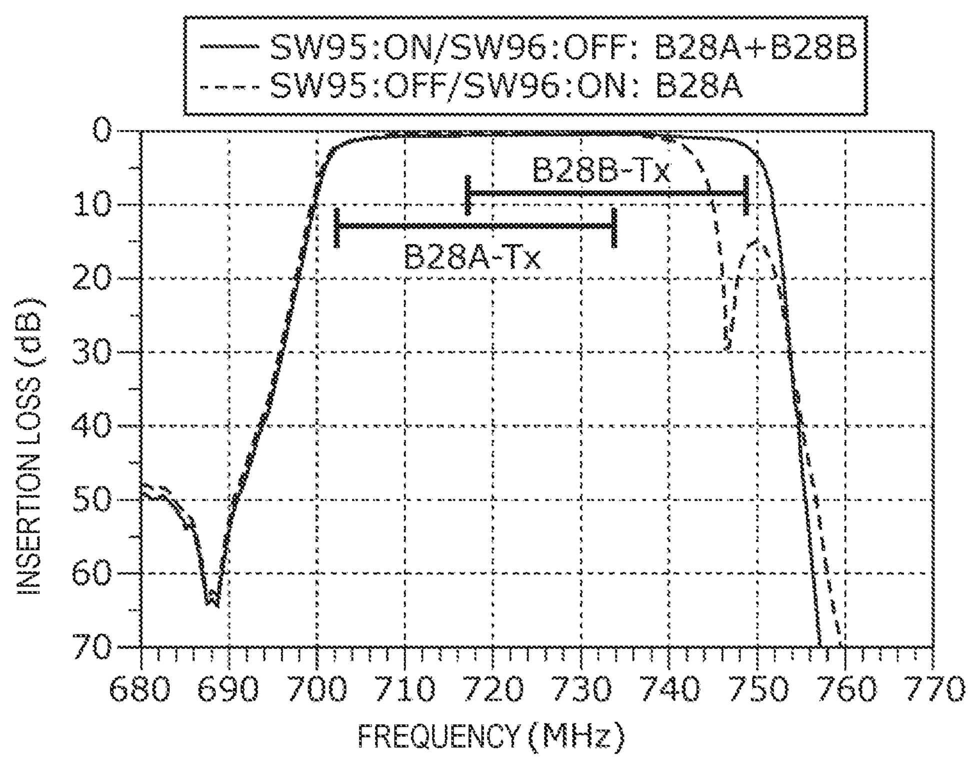
FIG. 25 is a graph showing bandpass characteristics of the high frequency filter according to Example 3.
Figure 26A:
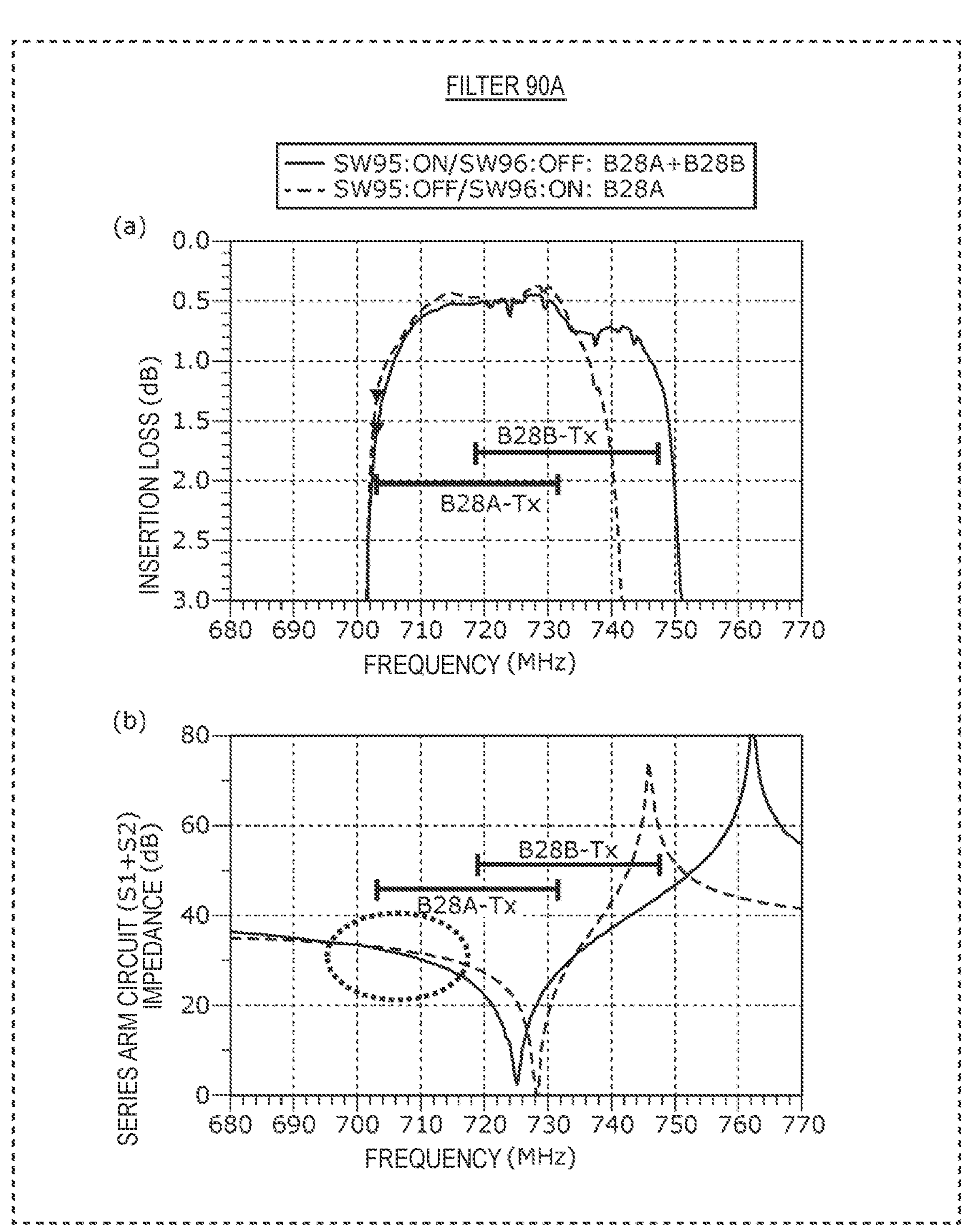
FIG. 26A is a graph showing bandpass characteristics and impedance characteristics of the high frequency filter according to Example 3.
Figure 26B:
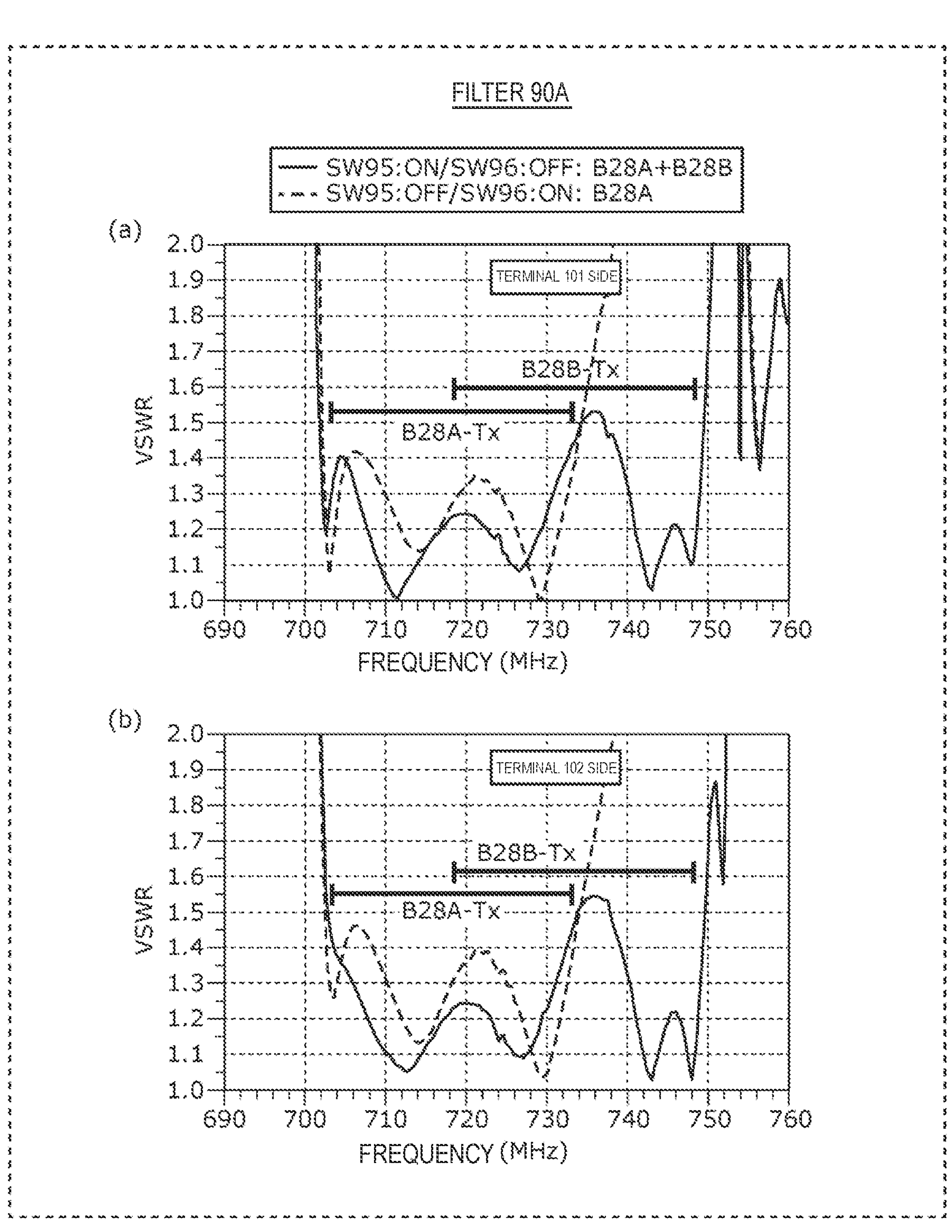
FIG. 26B is a graph showing a voltage standing wave ratio of the high frequency filter according to Example 3.

FIG. 25 is a graph showing bandpass characteristics of the filter 90A according to Example 3. In addition, FIG. 26A is a graph showing the bandpass characteristics and the impedance characteristics of the filter 90A according to Example 3. In addition, FIG. 26B is a graph showing a VSWR of the filter 90A according to Example 3.

As illustrated in FIG. 24A, in the second mode, the filter 90A is in a state in which only the series arm circuit S1 including only the series arm resonator 91 is connected. In addition, as illustrated in FIG. 24B, in the first mode, the filter 90A is in a state in which the series arm circuit S1 to which the series arm resonator 91 and the capacitor 93 are connected in series is connected to the frequency variable circuit S2 to which only the capacitor 94 is connected.

According to the above switching operation, as illustrated in (b) of FIG. 26A, in the first mode, an anti-resonant frequency of the series arm circuit S1 is shifted to a low-frequency side, and a resonance band width of the series arm circuit S1 is narrowed as compared with the second mode. Thus, as illustrated in FIG. 25 and (a) of FIG. 26A, the filter 90A has a first pass band including the first frequency range (band A1 (B28A-Tx)) and the second frequency range (band A2 (B28B-Tx)) in the second mode, whereas the filter 90A has a second pass band that is narrower than the first pass band and includes the first frequency range (band A1 (B28A-Tx)) in the first mode.

Furthermore, in the first mode and the second mode, the switches 95 and 96 are exclusively operated as described above, so that a difference in impedance within the second pass band of the series arm circuit in the first mode and the second mode can be reduced (a black broken line portion of (b) of FIG. 26A). Accordingly, deterioration in reflection characteristics of the filter 90A can be suppressed by mode switching. As illustrated in FIG. 26B, a VSWR in the second pass band on a terminal 101 side ((a) of FIG. 26B) and a terminal 102 side ((b) of FIG. 26B) has an excellent value (1.6 or less) in both the first mode and the second mode. Accordingly, as illustrated in (a) of FIG. 26A, deterioration in the insertion loss within a low-frequency side region of the second pass band can be suppressed.

As described above, according to the filter 90A according to the present example, the fluctuation of the impedance in the second pass band between the first mode and the second mode can be suppressed, so that the deterioration in the insertion loss in the second pass band when the mode is changed can be suppressed. Further, the transmission signal of band A1 can pass with low loss in the first mode, and the transmission signal of a plurality of bands of band A1 and band A2 can pass with low loss in the second mode, so that the band of the filter 90A having a variable pass band can be widened.

2.7 Capacitance Value Range of Filters 90 and 90A

Next, an optimum capacitance value range of the series arm resonator 91 and the capacitors 93 and 94 constituting the filter 90 according to the modification example of Embodiment 2 and the filter 90A according to Example 3 will be described.

Figure 27:
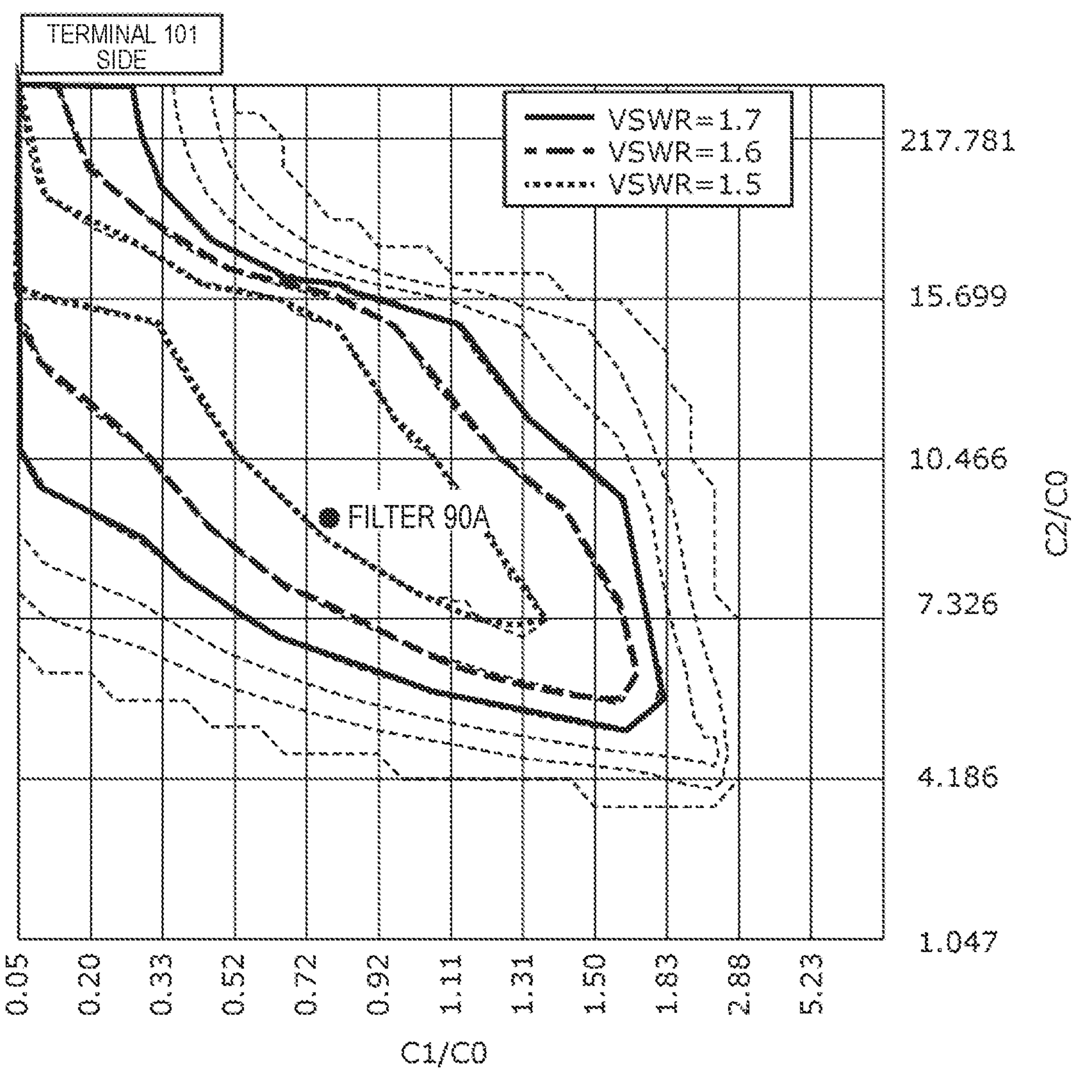
FIG. 27 is a capacitance correlation diagram of a first capacitor and a second capacitor of the high frequency filter according to the modification example of Embodiment 2.

FIG. 27 is a capacitance correlation diagram of the capacitors 93 and 94 of the filter 90 according to the modification example of Embodiment 2 and the filter 90A according to Example 3.

The impedance of the series arm circuit is determined by relative values of the capacitances C1 and C2 added to the capacitance C0 of the series arm resonator 91. In FIG. 27, a capacitance value of the series arm resonator 91 is defined as C0, a capacitance value of the capacitor 94 is defined as C1, a capacitance value of the capacitor 93 is defined as C2, an X-axis is defined as a normalized capacitance C1/C0 of the capacitor 94, and a Y-axis is defined as a normalized capacitance C2/C0 of the capacitor 93, to calculate a VSWR on the terminal 101 side. From FIG. 27, it can be understood that an excellent VSWR can be obtained by limiting the normalized capacitance C1/C0 of the capacitor 94 and the normalized capacitance C2/C0 of the capacitor 93 to a specific range.

First, when the VSWR is set to 1.7 or less, a matching loss in the pass band can be 0.3 dB or less. From FIG. 27, the following Equation 16 is satisfied, so that the VSWR can be set to 1.7 or less.

$$5.00\times10^{-2}\le(C1/C0)\le1.83,\text{ and }5.23\le C2/C0,\quad\text{(Equation 16)}$$

$$\text{and }F1(C1/C0)\le C2/C0\le F2(C1/C0),$$

$$F1(C1/C0)=1.19\times10^{1}\times(C1/CO-0.25)^{-7.71\times10^{-1}},$$

$$F2(C1/C0)=-1.19\times(C1/C0)^{3}+5.39\times10^{1}\times(C1/C0)^{2}-9.19\times(C1/C0)+1.10\times10^{1}$$

VSWR can be set to 1.6 or less. Accordingly, the matching loss in the pass band can be 0.24 dB or less. From FIG. 27, the following Equation 17 is satisfied, so that the VSWR can be set to 1.6 or less.

$$5.00\times10^{-2} \le (C1/C0) \le 1.70, \text{ and } 5.76 \le C2/C0, \quad \text{(Equation 17)}$$

$$\text{and } F1(C1/C0) \le C2/C0 \le F2(C1/C0),$$

$$F1(C1/C0) = 1.32\times(C1/C0)^{-1.30},$$

$$F2(C1/C0) = -2.98\times(C1/C0)^{3} + 1.09\times10^{1}\times(C1/C0)^{2} - 1.51\times(C1/C0) + 1.40\times10^{1}$$

Moreover, the VSWR can be set to 1.5 or less. Accordingly, the matching loss in the pass band can be 0.18 dB or less. From FIG. 27, the following Equation 18 is satisfied, so that the VSWR can be set to 1.5 or less.

$$5.00\times10^{-2} \le (C1/C0) \le 1.37, \text{ and } 7.32 \le C2/C0, \quad \text{(Equation 18)}$$

$$\text{and } F1(C1/C0) \le C2/C0 \le F2(C1/C0),$$

$$F1(C1/C0) = 1.08\times10^{1}\times(C1/C0)^{-9.93\times10-1},$$

$$F2(C1/C0) = -8.37\times(C1/C0)^{3} + 2.66\times10^{1}\times(C1/C0)^{2} - 3.05\times10^{1}\times(C1/C0) + 2.04\times10^{1}$$

2.8 Effect, and the Like

As described above, the filter 70 according to Embodiment 2 and the filter 70A according to Example 2 includes the series arm circuit S1 connected between the terminal 101 and the terminal 102, the frequency variable circuit S2 connected parallel to the series arm circuit S1, and a parallel arm resonator 72 connected to a ground and a path for connecting the terminal 101 and the terminal 102, in which the series arm circuit S1 has the series arm resonator 71 and the second series arm circuit connected in series to each other between the terminal 101 and the terminal 102, the frequency variable circuit S2 has the capacitor 74 and the switch 76 connected in series to each other, the second series arm circuit has the capacitor 73 and the switch 75 connected parallel to each other, and when a capacitance value of the series arm resonator 71 is defined as C0, a capacitance value of the capacitor 74 is defined as C1, and a capacitance value of the capacitor 73 is defined as C2, a relational expression of Equation 13 is satisfied.

Accordingly, the switches 75 and 76 are exclusively operated, so that the pass band can be changed. Further, the difference in impedance of the series arm circuit before and after the change in the pass band can be reduced, and the capacitance C0 of the series arm resonator 71, the capacitance C1 of the capacitor 74, and the capacitance C2 of the capacitor 73 are set to have a relationship of Equation 13, so that the VSWR of the filters 70 and 70A can be set to 1.7 or less. Therefore, it is possible to provide pass band variable filters 70 and 70A in which the deterioration in the insertion loss before and after the change in the pass band is suppressed.

Further, the filters 70 and 70A are switchable between the second mode in which the switch 75 is in the conductive state and the switch 76 is in the non-conductive state and the first mode in which the switch 75 is in the non-conductive state and the switch 76 is in the conductive state.

Accordingly, the switches 75 and 76 are exclusively operated as described above, so that a difference in impedance of the series arm circuit in the first mode and the second mode can be reduced. Therefore, it is possible to suppress deterioration in the insertion loss within the pass band due to impedance matching when the first mode and the second mode are switched.

Further, for example, the filters 70 and 70A have the first pass band including the first frequency range (band A1) and the second frequency range (band A2) on the high-frequency side of the first frequency range in the second mode, and have the second pass band that is narrower than the first pass band and includes the first frequency range in the first mode.

Accordingly, when the filters 70 and 70A have the first pass band, a transmission signal of a wideband including bands A1 and A2 can be transmitted, and when the filters 70 and 70A have the second pass band, attenuation of bands on the high-frequency side of the second pass band can be secured.

Further, for example, in the filters 70 and 70A, the relational expression of Equation 14 is satisfied.

Accordingly, the capacitance C0 of the series arm resonator 71, the capacitance C1 of the capacitor 74, and the capacitance C2 of the capacitor 73 are set to have a relationship of Equation 14, so that the VSWR of the filters 70 and 70A can be set to 1.6 or less. Therefore, it is possible to provide pass band variable filters 70 and 70A in which the deterioration in the insertion loss before and after the change in the pass band is further suppressed.

Further, for example, in the filters 70 and 70A, the relational expression of Equation 15 is satisfied.

Accordingly, the capacitance C0 of the series arm resonator 71, the capacitance C1 of the capacitor 74, and the capacitance C2 of the capacitor 73 are set to have a relationship of Equation 15, so that the VSWR of the filters 70 and 70A can be set to 1.5 or less. Therefore, it is possible to provide pass band variable filters 70 and 70A in which the deterioration in the insertion loss before and after the change in the pass band is further suppressed.

Further, for example, in the filters 70 and 70A, the series arm resonator 71 is a resonator using a surface acoustic wave or a bulk acoustic wave.

Accordingly, the size of the series arm resonator 71 can be reduced, so that the size and cost of the filters 70 and 70A can be reduced. In addition, the resonator using the surface acoustic wave or the bulk acoustic wave generally exhibits high Q characteristics, so that loss can be reduced.

As described above, the filter 90 according to the modification example of Embodiment 2 and the filter 90A according to Example 3 includes the series arm circuit S1 connected between the terminal 101 and the terminal 102, the frequency variable circuit S2, and a parallel arm resonator 92 connected to a ground and a path for connecting the terminal 101 and the terminal 102, in which the series arm circuit S1 has the series arm resonator 91 and the second series arm circuit connected in series to each other between the terminal 101 and the terminal 102, the frequency variable circuit S2 has the capacitor 94 and the switch 96 connected parallel to the series arm resonator 91 and connected in series to each other, the second series arm circuit has the capacitor 93 and the switch 95 connected parallel to each other, and when a capacitance value of the series arm resonator 91 is defined as C0, a capacitance value of the capacitor 94 is defined as C1, and a capacitance value of the capacitor 93 is defined as C2, a relational expression of Equation 16 is satisfied.

Accordingly, the switches 95 and 96 are exclusively operated, so that the pass band can be changed. Further, the difference in impedance of the series arm circuit before and after the change in the pass band can be reduced, and the capacitance C0 of the series arm resonator 91, the capacitance C1 of the capacitor 94, and the capacitance C2 of the capacitor 93 are set to have a relationship of Equation 16, so that the VSWR of the filters 90 and 90A can be set to 1.7 or less. Therefore, it is possible to provide pass band variable filters 90 and 90A in which the deterioration in the insertion loss before and after the change in the pass band is suppressed.

Further, the filters 90 and 90A are switchable between the second mode in which the switch 95 is in the conductive state and the switch 96 is in the non-conductive state and the first mode in which the switch 95 is in the non-conductive state and the switch 96 is in the conductive state.

Accordingly, the switches 95 and 96 are exclusively operated as described above, so that a difference in impedance of the series arm circuit in the first mode and the second mode can be reduced. Therefore, it is possible to suppress deterioration in the insertion loss within the pass band due to impedance matching when the first mode and the second mode are switched.

Further, for example, the filters 90 and 90A have the first pass band including the first frequency range (band A1) and the second frequency range (band A2) on the high-frequency side of the first frequency range in the second mode, and have the second pass band that is narrower than the first pass band and includes the first frequency range in the first mode.

Accordingly, when the filters 90 and 90A have the first pass band, a transmission signal of a wideband including bands A1 and A2 can be transmitted, and when the filters 90 and 90A have the second pass band, attenuation of bands on the high-frequency side of the second pass band can be secured.

Further, for example, in the filters 90 and 90A, the relational expression of Equation 17 is satisfied.

Accordingly, the capacitance C0 of the series arm resonator 91, the capacitance C1 of the capacitor 94, and the capacitance C2 of the capacitor 93 are set to have a relationship of Equation 17, so that the VSWR of the filters 90 and 90A can be set to 1.6 or less. Therefore, it is possible to provide pass band variable filters 90 and 90A in which the deterioration in the insertion loss before and after the change in the pass band is further suppressed.

Further, for example, in the filters 90 and 90A, the relational expression of Equation 18 is satisfied.

Accordingly, the capacitance C0 of the series arm resonator 91, the capacitance C1 of the capacitor 94, and the capacitance C2 of the capacitor 93 are set to have a relationship of Equation 18, so that the VSWR of the filters 90 and 90A can be set to 1.5 or less. Therefore, it is possible to provide pass band variable filters 90 and 90A in which the deterioration in the insertion loss before and after the change in the pass band is further suppressed.

Further, for example, in the filters 90 and 90A, the series arm resonator 91 is a resonator using a surface acoustic wave or a bulk acoustic wave.

Accordingly, the size of the series arm resonator 91 can be reduced, so that the size and cost of the filters 90 and 90A can be reduced. In addition, the resonator using the surface acoustic wave or the bulk acoustic wave generally exhibits high Q characteristics, so that loss can be reduced.

Further, for example, in the filters 70, 70A, 90, and 90A, the first frequency range includes either an uplink operation band of band 28A for 4G-LTE or an uplink operation band of band n28A for 5G-NR, and the second frequency range includes either an uplink operation band of band 28B for 4G-LTE or an uplink operation band of band n28B for 5G-NR.

Moreover, for example, the filters 70 and 70A further include a third capacitor connected parallel to at least one of the switches 75 and 76.

Accordingly, the withstand voltage performance of the switches 75 and 76 can be alleviated.

Moreover, for example, the filters 90 and 90A further include a third capacitor connected parallel to at least one of the switches 95 and 96.

Accordingly, the withstand voltage performance of the switches 95 and 96 can be alleviated.

OTHER EMBODIMENTS

Although the high frequency filter, the high frequency circuit, and the communication device according to the present disclosure have been described above with reference to the embodiments, examples, and modification example, the present disclosure is not limited to the above embodiments, examples, and modification examples. The modification examples obtained by executing various modifications thought by a person skilled in the art on the above embodiments, examples, and modification examples within the scope that does not deviate from the gist of the present disclosure, or various types of equipment incorporating the high frequency filter, the high frequency circuit, and the communication device of the present disclosure are also included in the present disclosure.

Moreover, for example, in the high frequency filter, the high frequency circuit, and the communication device according to the above-described embodiments, examples, and modification examples, a matching element such as an inductor and a capacitor, a switch circuit, and the like may be connected between the respective components.

Hereinafter, the features of the high frequency filter, the high frequency circuit, and the communication device described based on the above embodiments, examples, and modification examples will be described.

<1>

A high frequency filter including:

a series arm resonator connected between a first terminal and a second terminal;

a first parallel arm circuit connected to a ground and a path for connecting the series arm resonator and the second terminal to each other; and a second parallel arm circuit connected to the path and the ground, in which the first parallel arm circuit has a parallel arm resonator and a frequency variable circuit connected in series to each other between the path and the ground, the frequency variable circuit has a first capacitor and a first switch connected parallel to each other, the second parallel arm circuit has a second capacitor and a second switch connected in series to each other between the path and the ground, and when a capacitance value of the parallel arm resonator is defined as C0, a capacitance value of the first capacitor is defined as C1, and a capacitance value of the second capacitor is defined as C2, a relational expression of Equation 10 is satisfied.

<2>

The high frequency filter according to <1>, in which the high frequency filter is switchable between a first mode in which the first switch is in a conductive state and the second switch is in a non-conductive state and a second mode in which the first switch is in the non-conductive state and the second switch is in the conductive state.

<3>

The high frequency filter according to <2>, in which the high frequency filter has a first pass band including a first frequency range and a second frequency range on a low-frequency side of the first frequency range in the first mode, and has a second pass band that is narrower than the first pass band and includes the first frequency range in the second mode.

<4>

The high frequency filter according to any one of <1> to <3>, in which a relational expression of Equation 11 is satisfied.

<5>

The high frequency filter according to any one of <1> to <4>, in which a relational expression of Equation 12 is satisfied.

<6>

The high frequency filter according to any one of <1> to <5>, in which the parallel arm resonator is a resonator using a surface acoustic wave or a bulk acoustic wave.

<7>

The high frequency filter according to <3>, in which the first frequency range includes either an uplink operation band of band 28B for 4G-LTE or an uplink operation band of band n28B for 5G-NR, and the second frequency range includes either an uplink operation band of band 28A for 4G-LTE or an uplink operation band of band n28A for 5G-NR.

<8>

A high frequency filter including:

a first series arm circuit connected between a first terminal and a second terminal;

a frequency variable circuit connected parallel to the first series arm circuit; and a parallel arm resonator connected to a ground and a path for connecting the first terminal and the second terminal, in which the first series arm circuit has a series arm resonator and a second series arm circuit connected in series to each other between the first terminal and the second terminal, the frequency variable circuit has a first capacitor and a first switch connected in series to each other, the second series arm circuit has a second capacitor and a second switch connected parallel to each other, and when a capacitance value of the series arm resonator is defined as C0, a capacitance value of the first capacitor is defined as C1, and a capacitance value of the second capacitor is defined as C2, a relational expression of Equation 13 is satisfied.

<9>

The high frequency filter according to <8>, in which a relational expression of Equation 14 is satisfied.

<10>

The high frequency filter according to <8> or <9>, in which a relational expression of Equation 15 is satisfied.

<11>

A high frequency filter including:

a first series arm circuit connected between a first terminal and a second terminal;

a frequency variable circuit; and a parallel arm resonator connected to a ground and a path for connecting the first terminal and the second terminal, in which the first series arm circuit has a series arm resonator and a second series arm circuit connected in series to each other between the first terminal and the second terminal, the frequency variable circuit has a first capacitor and a first switch connected parallel to the series arm resonator and connected in series to each other, the second series arm circuit has a second capacitor and a second switch connected parallel to each other, and when a capacitance value of the series arm resonator is defined as C0, a capacitance value of the first capacitor is defined as C1, and a capacitance value of the second capacitor is defined as C2, a relational expression of Equation 16 is satisfied.

<12>

The high frequency filter according to any one of <8> to <11>, in which the high frequency filter is switchable between a first mode in which the first switch is in a conductive state and the second switch is in a non-conductive state and a second mode in which the first switch is in the non-conductive state and the second switch is in the conductive state.

<13>

The high frequency filter according to <12>, in which the high frequency filter has a first pass band including a first frequency range and a second frequency range on a high-frequency side of the first frequency range in the second mode, and has a second pass band that is narrower than the first pass band and includes the first frequency range in the first mode.

<14>

The high frequency filter according to any one of <11> to <13>, in which a relational expression of Equation 17 is satisfied.

<15>

The high frequency filter according to any one of <11> to <14>, in which a relational expression of Equation 18 is satisfied.

<16>

The high frequency filter according to any one of <8> to <15>, in which the series arm resonator is a resonator using a surface acoustic wave or a bulk acoustic wave.

<17>

The high frequency filter according to <13>, in which the first frequency range includes either an uplink operation band of band 28A for 4G-LTE or an uplink operation band of band n28A for 5G-NR, and the second frequency range includes either an uplink operation band of band 28B for 4G-LTE or an uplink operation band of band n28B for 5G-NR.

<18>

The high frequency filter according to any one of <1> to <17>, further comprising:

a third capacitor connected parallel to at least one of the first switch and the second switch.

<19>

A high frequency circuit including:

the high frequency filter according to any one of <1> to <18>;

a first filter; and a switch circuit having a common terminal, a first selection terminal, and a second selection terminal, configured to switch connection and disconnection between the common terminal and the first selection terminal, and configured to switch connection and disconnection between the common terminal and the second selection terminal, in which the high frequency filter and the first filter are connected to the second terminal.

<20>

A communication device including:

a signal processing circuit configured to process a high frequency signal; and the high frequency circuit according to claim 19 configured to transmit the high frequency signal between the signal processing circuit and an antenna.

The present disclosure can be widely used in communication equipment, such as a mobile phone, as a small high frequency filter that can be applied to a multiband system that uses a plurality of adjacent bands simultaneously or exclusively.

What is claimed is:

1. A high frequency filter comprising:

a series arm resonator connected between a first terminal and a second terminal;

a first parallel arm circuit connected between ground and a path that connects the series arm resonator to the second terminal; and a second parallel arm circuit connected between ground and the path, wherein the first parallel arm circuit comprises a parallel arm resonator and a frequency variable circuit connected in series to each other, wherein the frequency variable circuit comprises a first capacitor and a first switch connected in parallel to each other, wherein the second parallel arm circuit comprises a second capacitor and a second switch connected in series to each other, and wherein:

$$3.20\times10^{-1} \le (C1/C0) \le 6.25,\ 0 \le C2/C0,$$

$$F1(C1/C0) \le C2/C0 \le F2(C1/C0),$$

$$F1(C1/C0) = 1.08\times10^{1}\times(C1/C0)^{2} - 3.82\times10^{-1}\times(C1/C0) + 1.98\times10^{-1},$$

$$F2(C1/C0) = 3.77\times10^{-4}\times(C1/C0)^{4} - 6.31\times10^{-3}\times(C1/C0)^{3} + 4.00\times10^{-2}(C1/C0)^{2} - 1.22\times10^{-1}\times(C1/C0) + 2.71\times10^{-1},$$

where a capacitance value of the parallel arm resonator is C0, a capacitance value of the first capacitor is C1, and a capacitance value of the second capacitor is C2.

2. The high frequency filter according to claim 1, wherein in a first mode of the high frequency filter, the first switch is in a conductive state and the second switch is in a non-conductive state, and wherein in a second mode of the high frequency filter, the first switch is in the non-conductive state and the second switch is in the conductive state.

3. The high frequency filter according to claim 2, wherein in the first mode, the high frequency filter has a first pass band comprising a first frequency range and a second frequency range on a low-frequency side of the first frequency range, and wherein in the second mode, the high frequency filter has a second pass band that is narrower than the first pass band and comprises the first frequency range.

4. The high frequency filter according to claim 3, wherein the first frequency range comprises either an uplink operation band of band 28B for 4G-LTE or an uplink operation band of band n28B for 5G-NR, and wherein the second frequency range comprises either an uplink operation band of band 28A for 4G-LTE or an uplink operation band of band n28A for 5G-NR.

5. The high frequency filter according to claim 1, wherein:

$$3.20\times10^{-1} \le (C1/C0) \le 6.25,\ 0 \le C2/C0,$$

$$F1(C1/C0) \le C2/C0 \le F2(C1/C0),$$

$$F1(C1/C0) = 1.73\times10^{1}\times(C1/C0)^{2} - 3.82\times10^{-1}\times(C1/C0) + 2.18\times10^{-1},$$

$$F2(C1/C0) = 6.30\times10^{-4}\times(C1/C0)^{4} - 9.12\times10^{-3}\times(C1/C0)^{3} + 4.66\times10^{-2}(C1/C0)^{2} - 1.12\times10^{-1}\times(C1/C0) + 2.29\times10^{-1}.$$

6. The high frequency filter according to claim 1, wherein:

$$4.30\times10^{-1} \le (C1/C0) \le 6.25,\ 0 \le C2/C0,$$

$$F1(C1/C0) \le C2/C0 \le F2(C1/C0),$$

$$F1(C1/C0) = 1.14\times10^{1}\times(C1/C0)^{2} - 3.12\times10^{-1}\times(C1/C0) + 2.15\times10^{-1},$$

$$F2(C1/C0) = 3.94\times10^{-4}\times(C1/C0)^{3} - 6.13\times10^{-3}\times(C1/C0)^{2} + 3.56\times10^{-2}\times(C1/C0)^{2} - 1.15\times10^{-1}.$$

7. The high frequency filter according to claim 1, wherein the parallel arm resonator is a surface acoustic wave resonator or a bulk acoustic wave resonator.

8. The high frequency filter according to claim 1, further comprising:

a third capacitor connected in parallel to the first switch or the second switch.

9. A high frequency filter comprising:

a first series arm circuit connected between a first terminal and a second terminal;

a frequency variable circuit connected in parallel to the first series arm circuit; and a parallel arm resonator connected between ground and a path that connects the first terminal to the second terminal, wherein the first series arm circuit comprises a series arm resonator and a second series arm circuit connected in series to each other, wherein the frequency variable circuit comprises a first capacitor and a first switch connected in series to each other, wherein the second series arm circuit comprises a second capacitor and a second switch connected in parallel to each other, and wherein:

$$5.00\times10^{-2} \le (C1/C0) \le 1.44,\ 2.62 \le C2/C0,$$

$$F1(C1/C0) \le C2/C0 \le F2(C1/C0),$$

$$F1(C1/C0) = 5.23\times(C1/C0 - 0.15)^{-1.72},$$

$$F2(C1/C0) = -2.98\times(C1/C0)^{3} + 1.19\times10^{1}\times(C1/C0)^{2} - 1.68\times10^{1}\times(C1/C0) + 1.11\times10^{1},$$

where a capacitance value of the series arm resonator is C0, a capacitance value of the first capacitor is C1, and a capacitance value of the second capacitor is C2.

10. The high frequency filter according to claim 9, wherein:

$$5.00\times10^{-2}\le(C1/C0)\le1.31,\ 3.66\le C2/C0,$$
$$F1(C1/C0)\le C2/C0\le F2(C1/C0),$$
$$F1(C1/C0)=5.88\times(C1/C0)^{-1.68},\ F2(C1/C0)=-3.43\times(C1/C0)^{3}+1.52\times10^{1}\times(C1/C0)^{2}-2.16\times10^{1}\times(C1/C0)+1.36\times10^{1}.$$

11. The high frequency filter according to claim 9, wherein:

$$5.00\times10^{-2}\le(C1/C0)\le8.50\times10^{-1},$$
$$5.23\le C2/C0,\ F1(C1/C0)\le C2/C0\le F2(C1/C0),$$
$$F1(C1/C0)=-4.66\times(C1/C0)^{3}+8.86\times10^{1}\times(C1/C0)^{2}-6.26\times10^{1}\times(C1/C0)+2.27\times10^{1},\ F2(C1/C0)=4.68\times(C1/C0)^{-1.47}.$$

12. A high frequency filter comprising:
a first series arm circuit connected between a first terminal and a second terminal;
a frequency variable circuit; and
a parallel arm resonator connected between ground and a path that connects the first terminal to the second terminal,
wherein the first series arm circuit comprises a series arm resonator and a second series arm circuit connected in series to each other,
wherein the frequency variable circuit comprises a first capacitor and a first switch connected in parallel to the series arm resonator and connected in series to each other,
wherein the second series arm circuit comprises a second capacitor and a second switch connected in parallel to each other, and
wherein:

$$5.00\times10^{-2}\le(C1/C0)\le1.83,\ 5.23\le C2/C0$$
$$F1(C1/C0)\le C2/C0\le F2(C1/C0),$$
$$F1(C1/C0)=1.19\times10^{1}\times(C1/C0-0.25)^{-7.71\times10-1},\ F2(C1/C0)=-1.19\times(C1/C0)^{3}+5.39\times10^{1}\times(C1/C0)^{2}-9.19\times(C1/C0)+1.10\times10^{1},$$

where a capacitance value of the series arm resonator is C0, a capacitance value of the first capacitor is C1, and a capacitance value of the second capacitor is C2.

13. The high frequency filter according to claim 12,
wherein in a first mode of the high frequency filter, the first switch is in a conductive state and the second switch is in a non-conductive state, and
wherein in a second mode of the high frequency filter, the first switch is in the non-conductive state and the second switch is in the conductive state.

14. The high frequency filter according to claim 13,
wherein in the second mode, the high frequency filter has a first pass band comprising a first frequency range and a second frequency range on a high-frequency side of the first frequency range, and
wherein in the first mode, the high frequency filter has a second pass band that is narrower than the first pass band and comprises the first frequency range.

15. The high frequency filter according to claim 14,
wherein the first frequency range comprises either an uplink operation band of band 28A for 4G-LTE or an uplink operation band of band n28A for 5G-NR, and
wherein the second frequency range comprises either an uplink operation band of band 28B for 4G-LTE or an uplink operation band of band n28B for 5G-NR.

16. The high frequency filter according to claim 12, wherein:

$$5.00\times10^{-2}\le(C1/C0)\le1.70,\ 5.76\le C2/C0$$
$$F1(C1/C0)\le C2/C0\le F2(C1/C0),$$
$$F1(C1/C0)=1.32\times(C1/C0)^{-1.30},\ F2(C1/C0)=-2.98\times(C1/C0)^{3}+1.09\times10^{1}\times(C1/C0)^{2}-1.51\times(C1/C0)+1.40\times10^{1}.$$

17. The high frequency filter according to claim 12, wherein:

$$5.00\times10^{-2}\le(C1/C0)\le1.37,\ 7.32\le C2/C0$$
$$F1(C1/C0)\le C2/C0\le F2(C1/C0),$$
$$F1(C1/C0)=1.08\times10^{1}\times(C1/C0)^{-9.93\times10-1},$$
$$F2(C1/C0)=-8.37\times(C1/C0)^{3}+2.66\times10^{1}\times(C1/C0)^{2}-3.05\times10^{1}\times(C1/C0)+2.04\times10^{1}.$$

18. The high frequency filter according to claim 12, wherein the series arm resonator is a surface acoustic wave resonator or a bulk acoustic wave resonator.

19. A high frequency circuit comprising:
the high frequency filter according to claim 1;
a first filter; and
a switch circuit comprising a common terminal, a first selection terminal, and a second selection terminal, and configured to switch connection and disconnection of the common terminal between the first selection terminal and the second selection terminal,
wherein the high frequency filter and the first filter are connected to the second terminal.

20. A communication device comprising:
a signal processing circuit configured to process a high frequency signal; and
the high frequency circuit according to claim 19 configured to pass the high frequency signal between the signal processing circuit and an antenna.

* * * * *